(12) United States Patent
Kreikebaum et al.

(10) Patent No.: US 9,753,059 B2
(45) Date of Patent: *Sep. 5, 2017

(54) DETECTION OF GEOMAGNETICALLY-INDUCED CURRENTS WITH POWER LINE-MOUNTED DEVICES

(71) Applicant: Smart Wires Inc., San Francisco, CA (US)

(72) Inventors: Frank Kreikebaum, Oakland, CA (US); Paul Phillipsen, Shingle Springs, CA (US); Stuart E. Ross, Wilmington, NC (US); Yuli Starodubtsev, Hampstead, NC (US)

(73) Assignee: SMART WIRES, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,910

(22) Filed: Nov. 13, 2015

(65) Prior Publication Data

US 2016/0069935 A1 Mar. 10, 2016

Related U.S. Application Data

(63) Continuation of application No. 14/597,377, filed on Jan. 15, 2015, now Pat. No. 9,217,762.

(Continued)

(51) Int. Cl.
*G01R 15/18* (2006.01)
*G01R 15/20* (2006.01)
(Continued)

(52) U.S. Cl.
CPC ......... *G01R 15/202* (2013.01); *G01R 15/207* (2013.01); *G01R 19/0092* (2013.01); *G01R 21/08* (2013.01)

(58) Field of Classification Search
CPC .................. G01R 5/186; G01R 21/08
(Continued)

(56) References Cited

U.S. PATENT DOCUMENTS

| 1,778,796 A | 10/1930 | Craig |
| 2,446,624 A | 8/1948 | Allison |

(Continued)

OTHER PUBLICATIONS

Transformer Monitoring Platform, Mar. 7, 2015, http://www.advpowertech.com/Eclipse-Transformer-Monitoring-Main.php.

(Continued)

*Primary Examiner* — Patrick Assouad
*Assistant Examiner* — Demetrius Pretlow
(74) *Attorney, Agent, or Firm* — Marsh Fischmann & Breyfogle LLP; James L. Johnson; Robert G. Crouch

(57) ABSTRACT

A device for use in a power transmission system to sense GICs. The device may be a part of a reactance-injecting device on a power line, it may be a standalone device, or it may be a part of another type of device. The device may include a sensor to sense magnetic fields (e.g., a Hall effect sensor). The sensor may be positioned in the air gap of a magnetic core formed concentrically around the power line. The signal from the sensor may be converted to a digital signal and separately processed to determine the magnitude of the AC current and the magnitude of the DC (or quasi-DC) current. If the output signal of another A/C current sensor is available, that output signal may be used to adjust/calibrate the determined magnitude of the DC current. The sensor may communicate with other devices in a network to provide GIC information.

34 Claims, 48 Drawing Sheets

Related U.S. Application Data

(60) Provisional application No. 61/937,220, filed on Feb. 7, 2014.

(51) Int. Cl.
*G01R 19/00* (2006.01)
*G01R 21/08* (2006.01)

(58) Field of Classification Search
USPC ......... 324/126–127, 252, 117 H, 117 R, 244
See application file for complete search history.

(56) References Cited

U.S. PATENT DOCUMENTS

| | | | |
|---|---|---|---|
| 3,339,129 A | 8/1967 | Bulman et al. | |
| 4,280,093 A | 7/1981 | Houston | |
| 4,350,980 A | 9/1982 | Ward | |
| 4,689,752 A | 8/1987 | Fernandes | |
| 4,847,554 A | 7/1989 | Goodwin | |
| 5,179,489 A | 1/1993 | Oliver | |
| 5,416,407 A | 5/1995 | Drafts | |
| 6,114,847 A | 9/2000 | Johnson | |
| 6,232,775 B1 * | 5/2001 | Naitoh | C22C 38/10 148/305 |
| 7,105,952 B2 | 9/2006 | Divan et al. | |
| 7,489,485 B2 | 2/2009 | A F Klercker Alakula et al. | |
| 7,835,128 B2 | 11/2010 | Divan et al. | |
| 8,342,494 B2 | 1/2013 | Ricci et al. | |
| 2004/0178875 A1 | 9/2004 | Saito | |
| 2009/0009280 A1 * | 1/2009 | Ishihara | G01R 15/207 336/234 |
| 2009/0243876 A1 | 10/2009 | Lilien et al. | |
| 2010/0235490 A1 | 9/2010 | Nasnas | |
| 2011/0221437 A1 * | 9/2011 | Stockum | G01R 33/072 324/252 |
| 2012/0268106 A1 | 10/2012 | Blake et al. | |
| 2013/0063140 A1 | 3/2013 | Nagai et al. | |
| 2014/0173891 A1 * | 6/2014 | Davis | A46B 9/028 29/825 |
| 2015/0069993 A1 * | 3/2015 | Kim | G01R 15/146 324/76.11 |

OTHER PUBLICATIONS

Solar Magnetic Disturbances, Aug. 13, 2013.
International Search Report for International Application No. PCT/US15/12630, dated Apr. 15, 2015.
Monitoring GMD Events in the Consolidated Edison System, 2012.

* cited by examiner

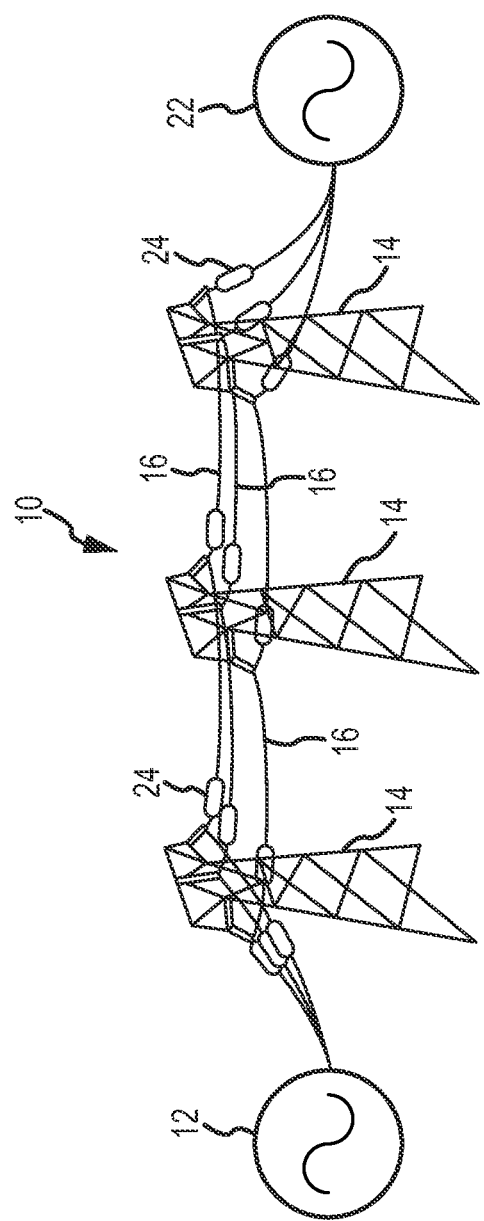

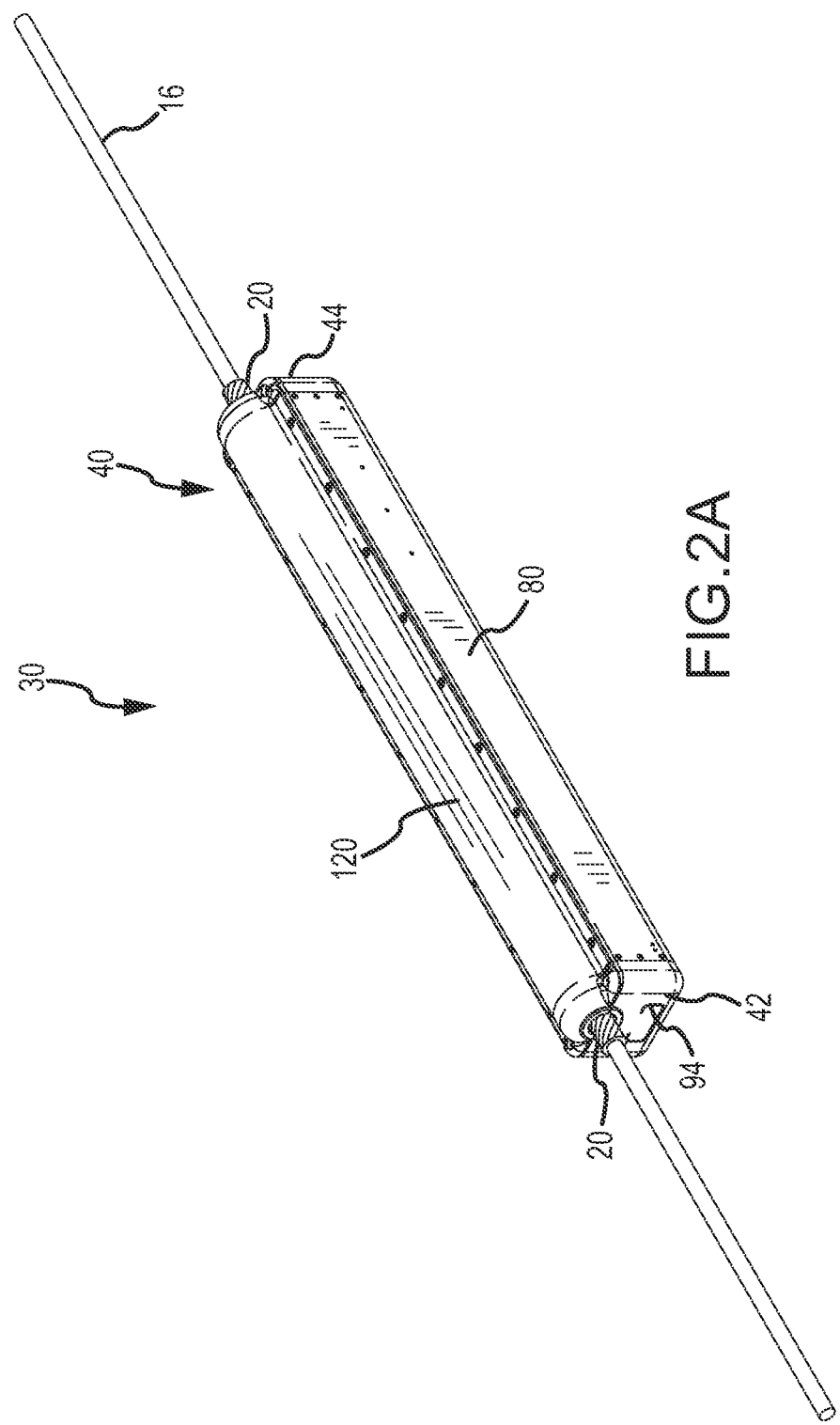

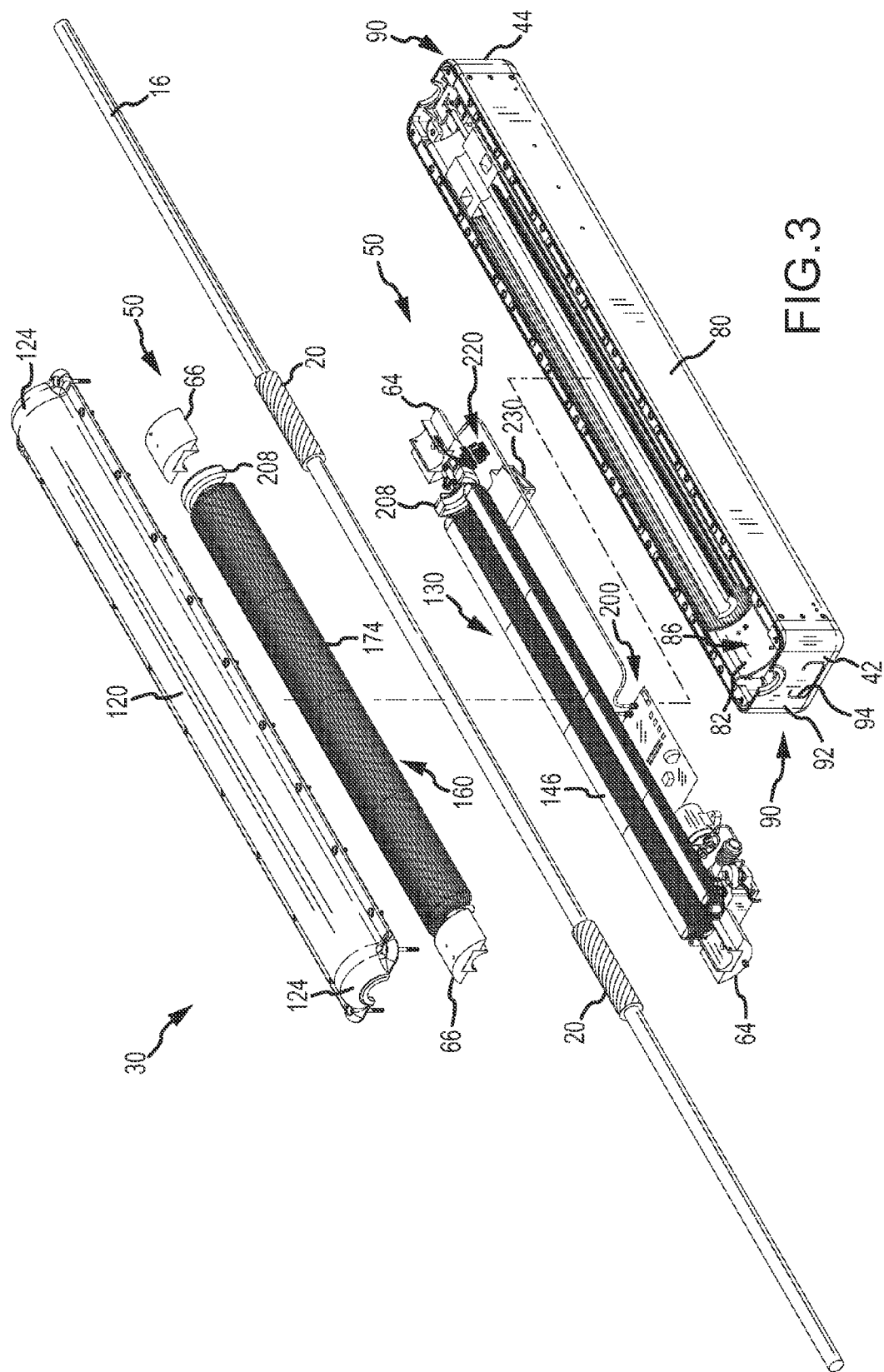

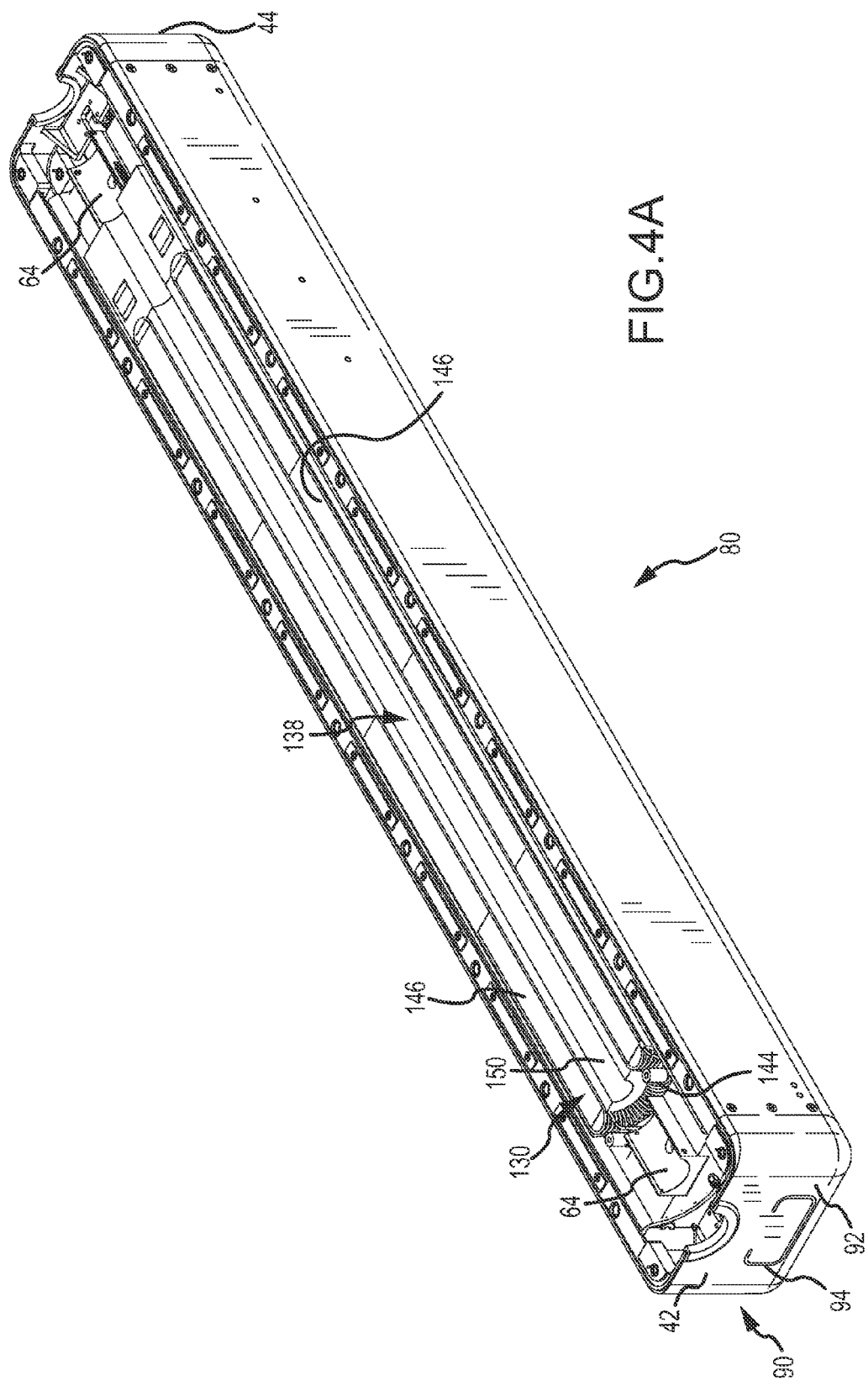

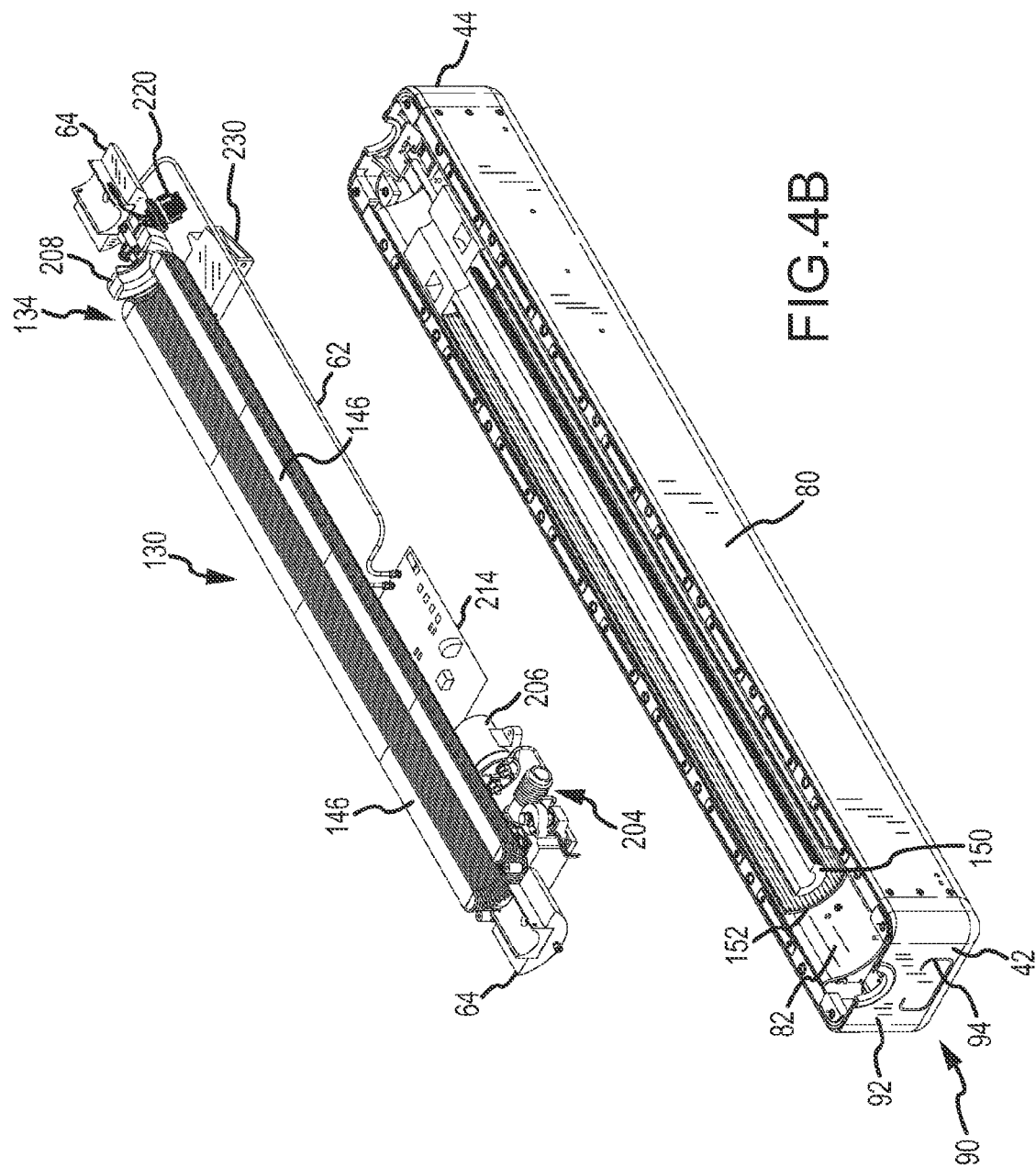

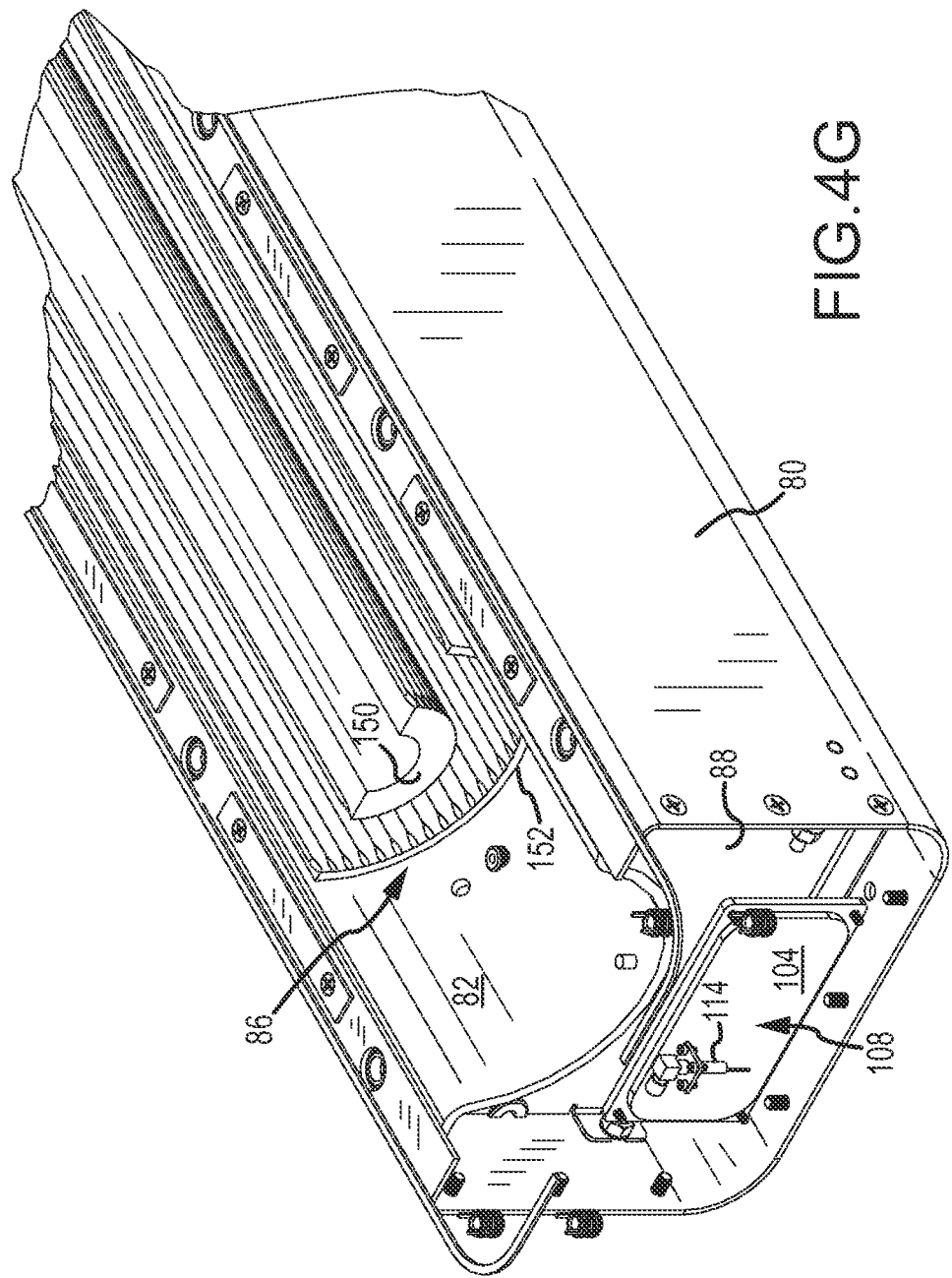

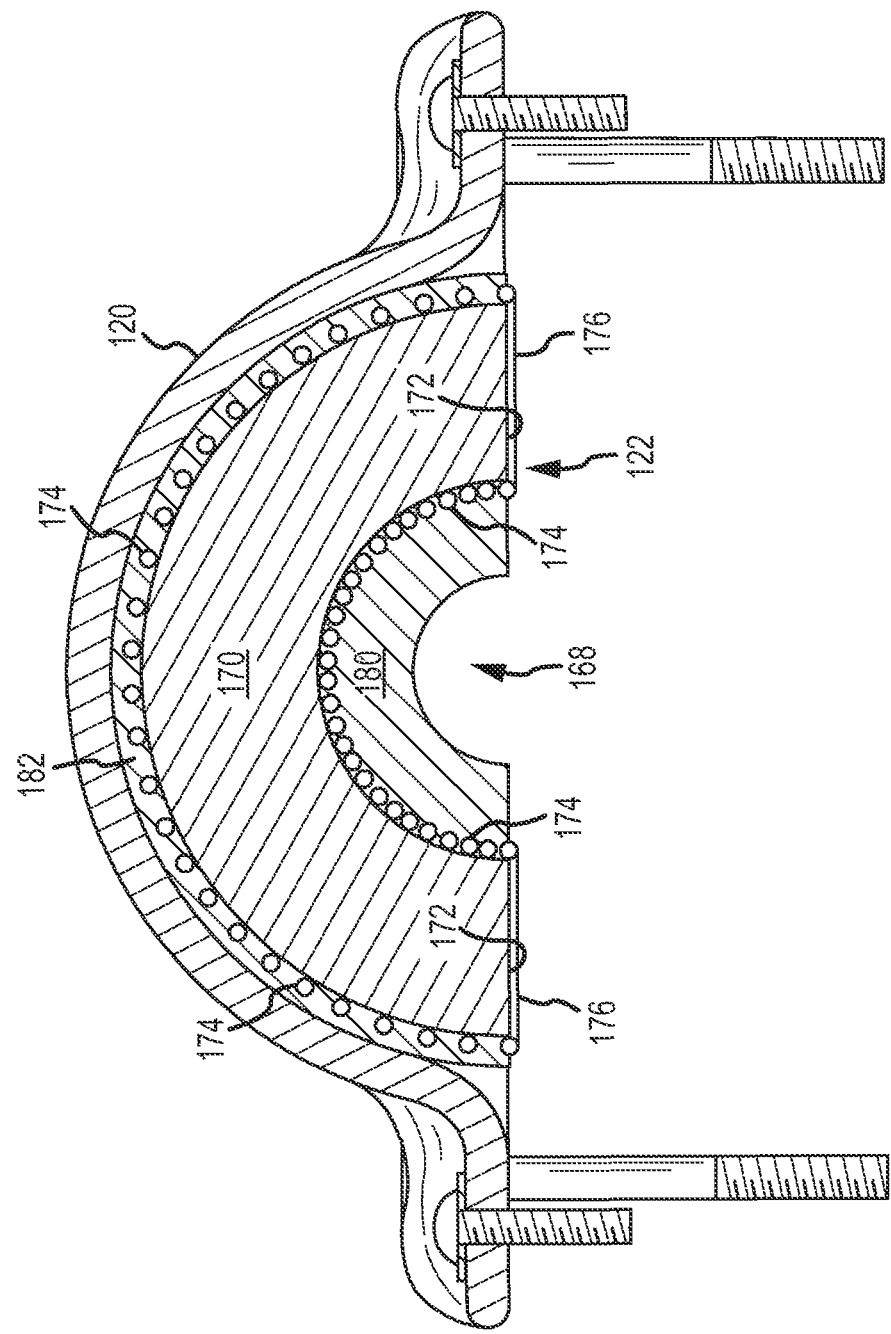

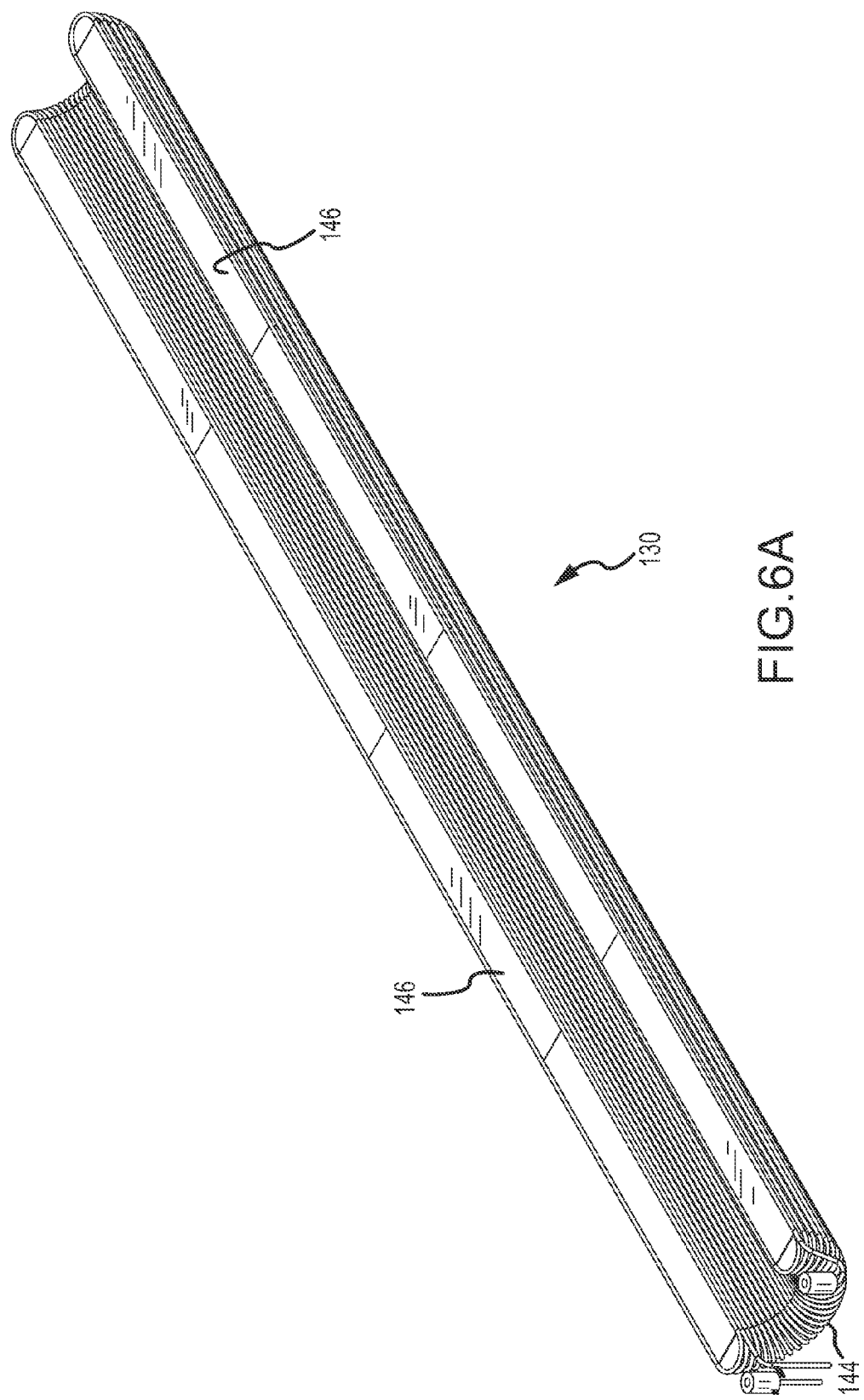

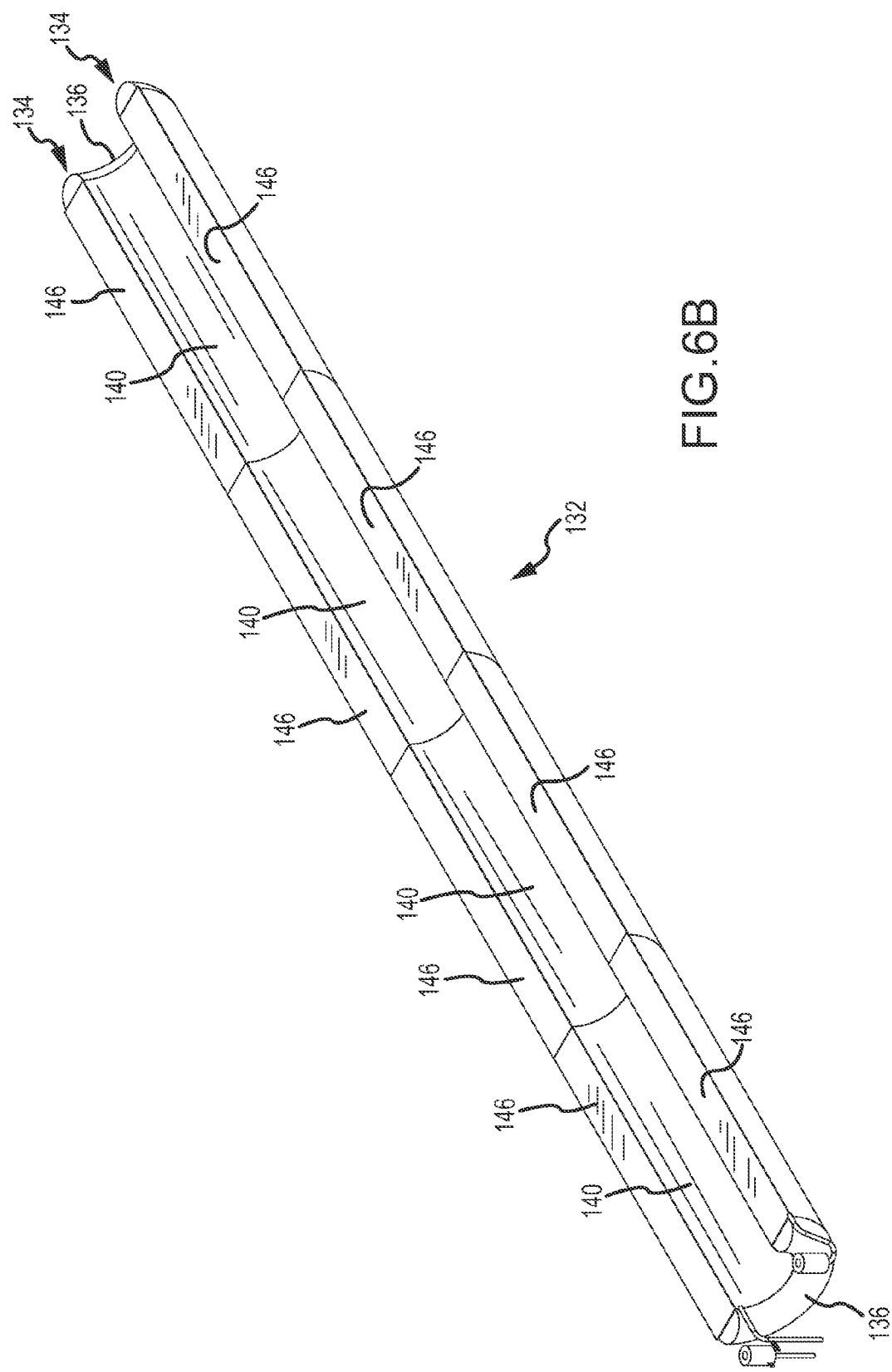

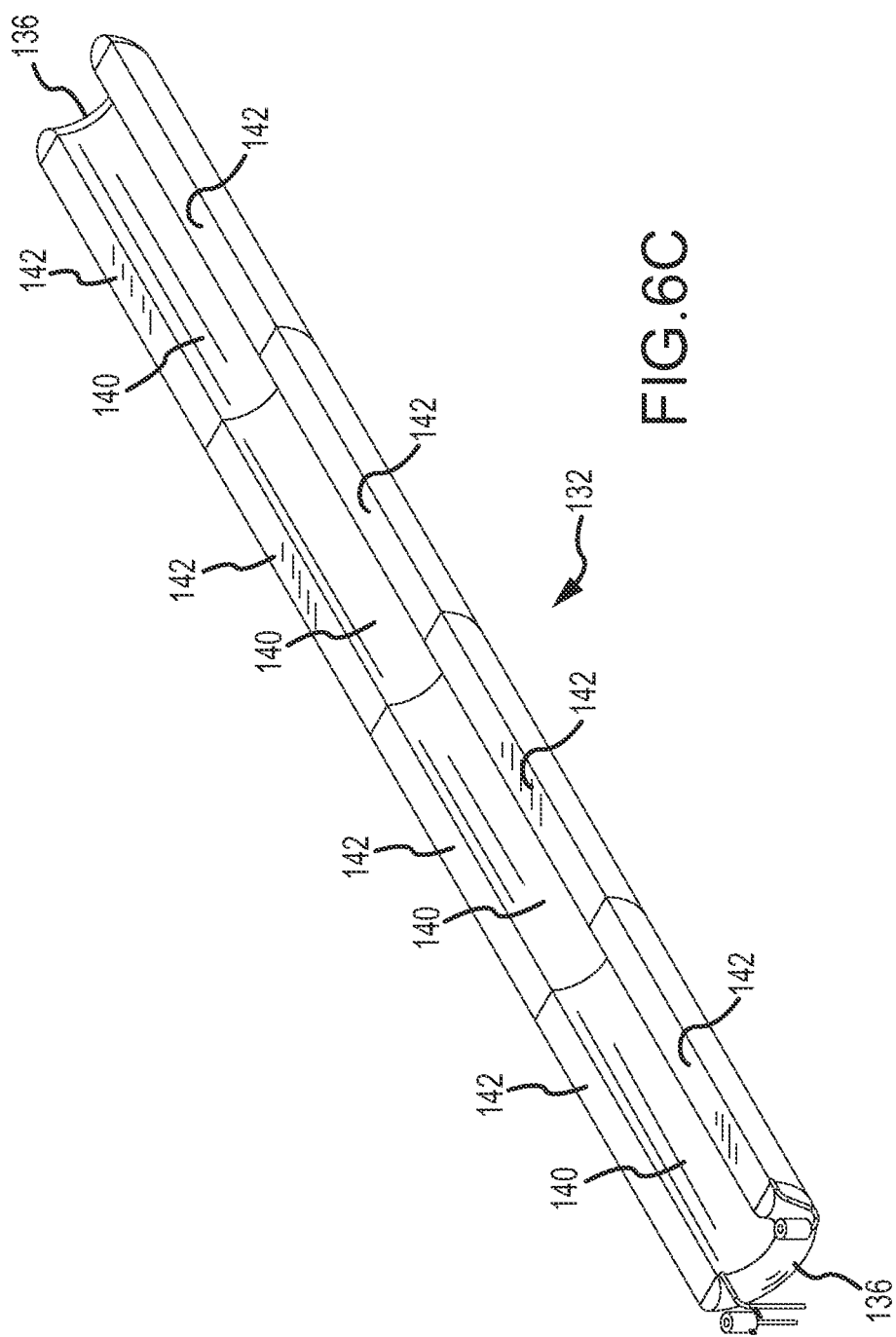

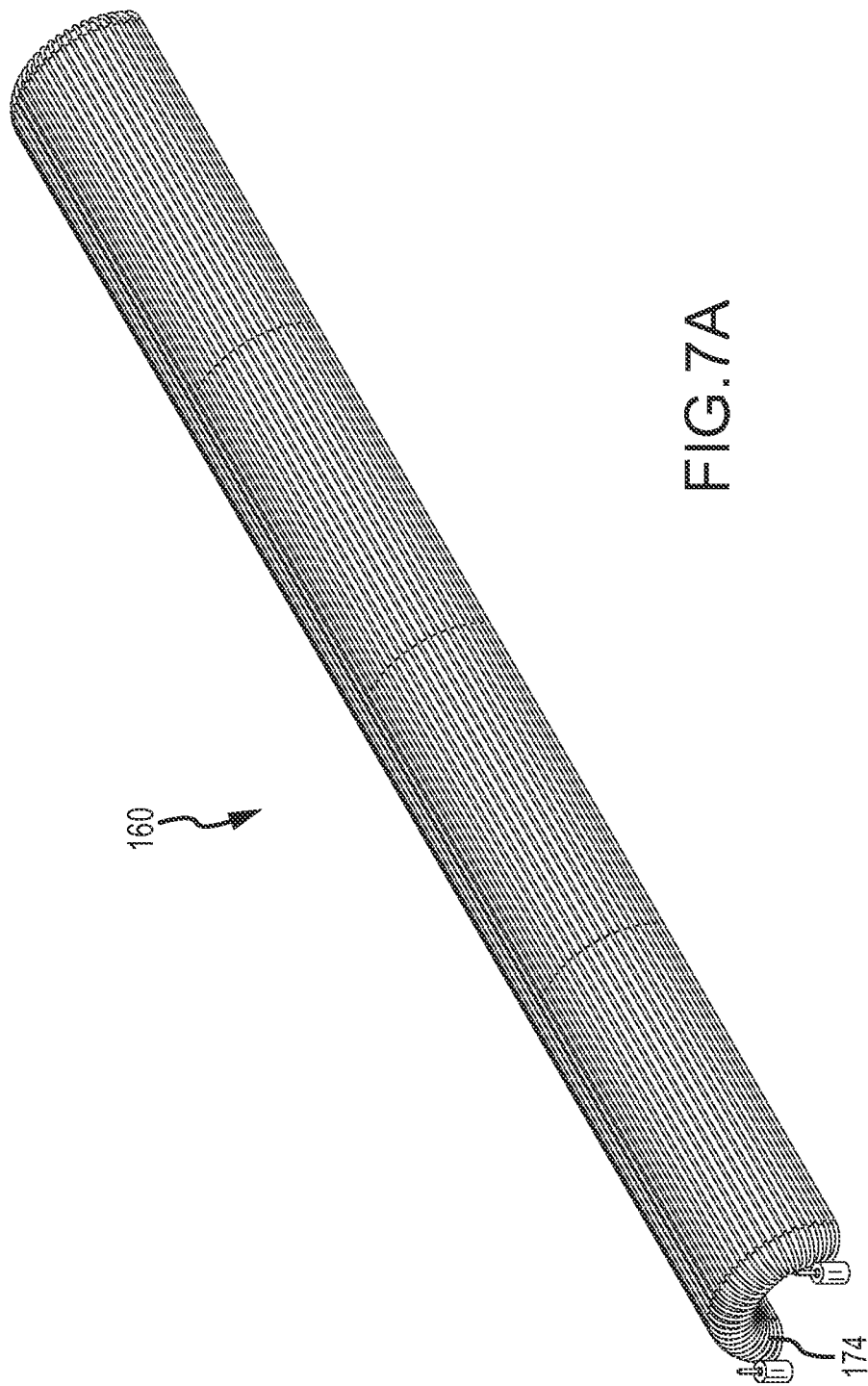

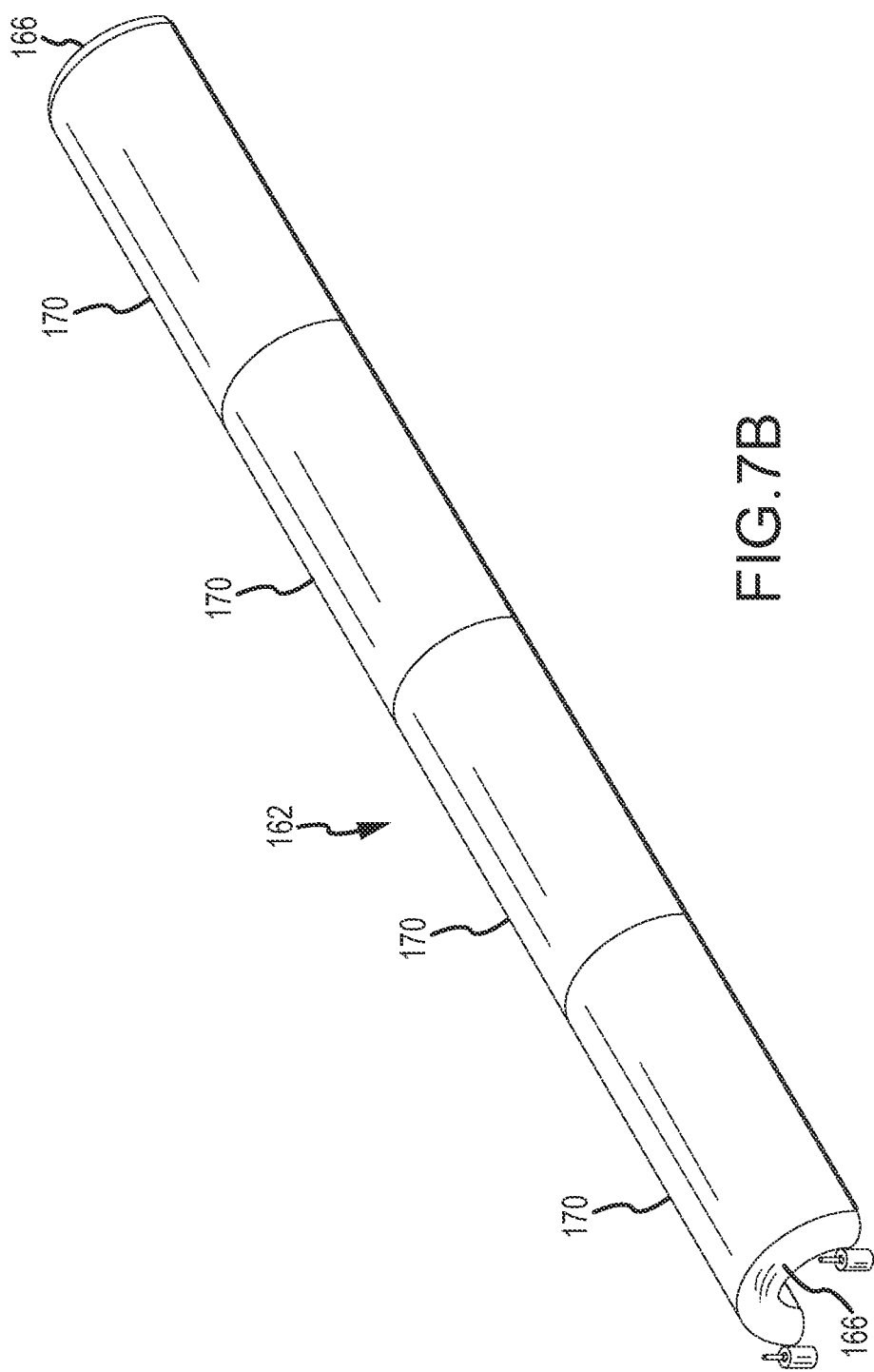

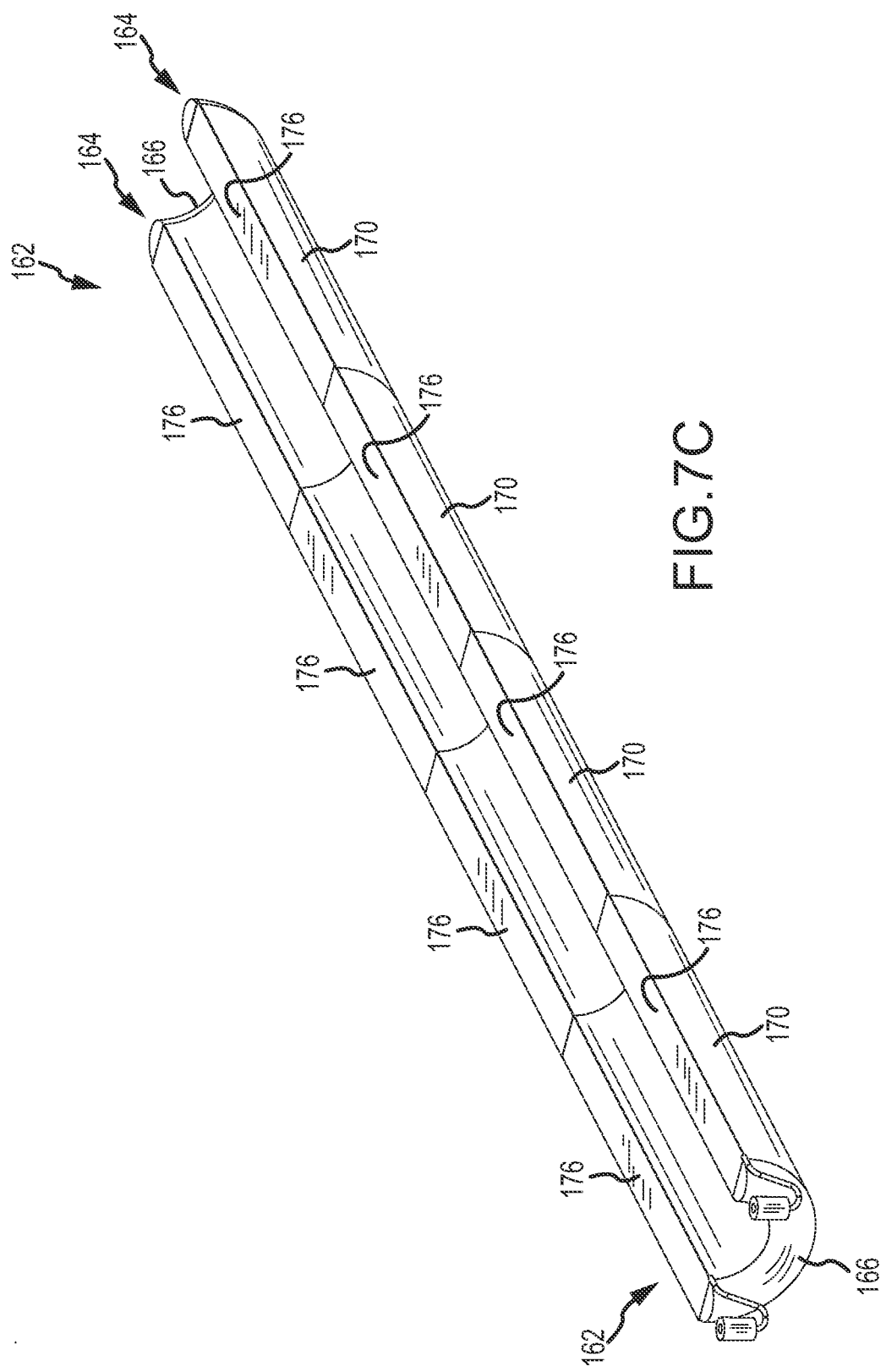

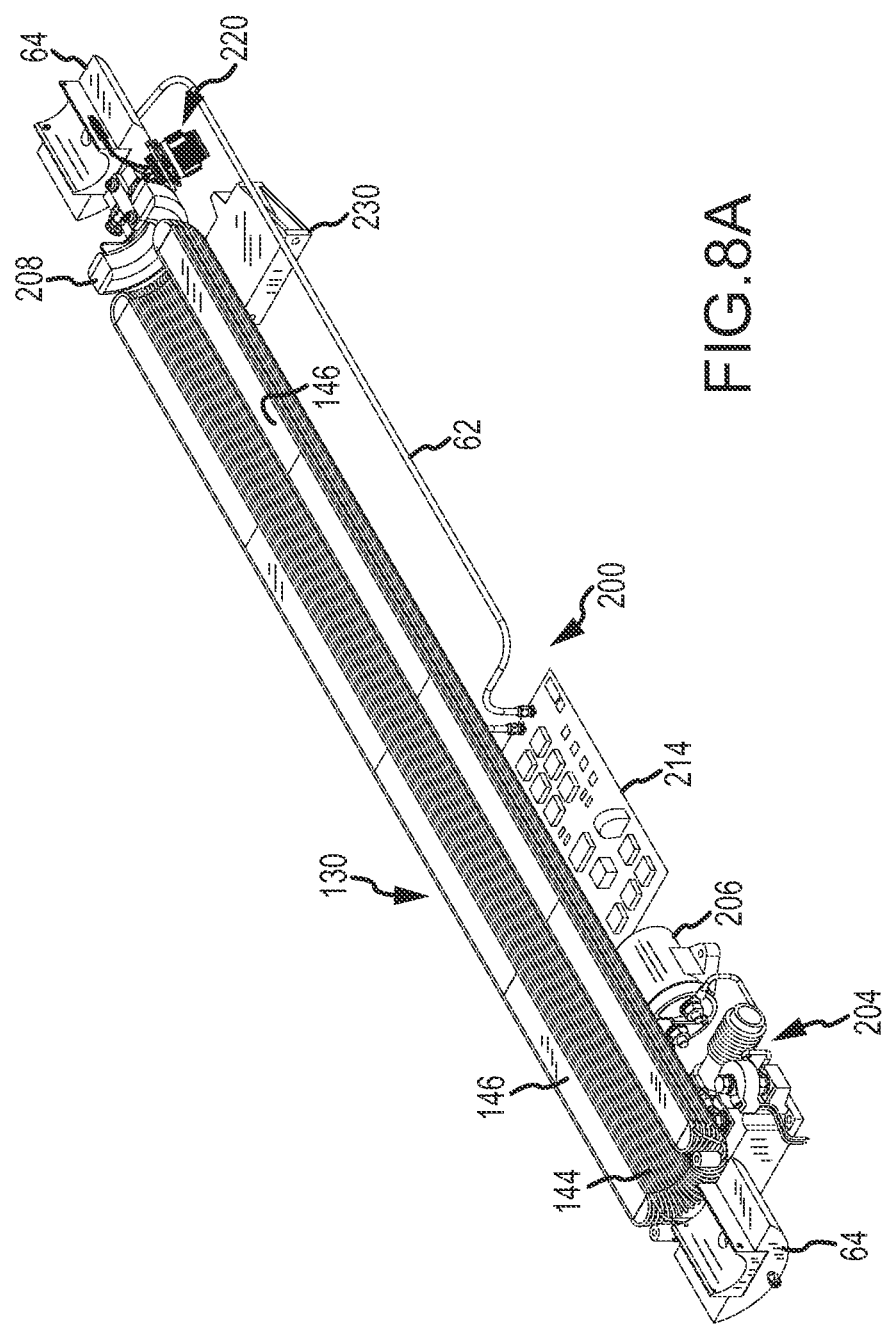

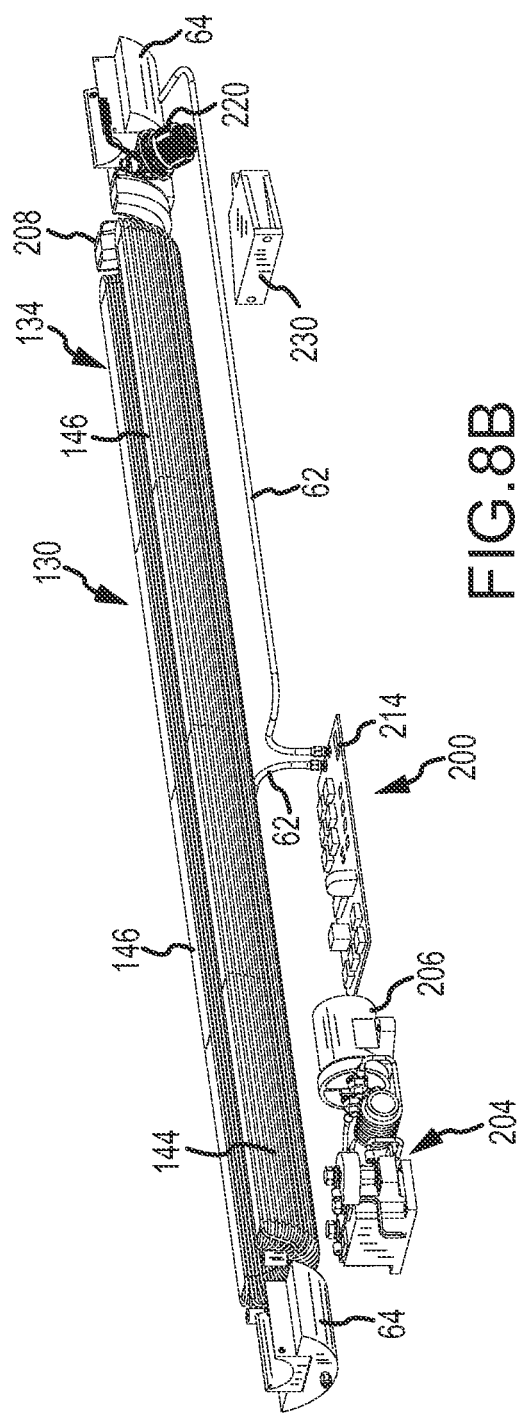

| SYSTEM CONDITION | DSR 30 | | DSR 30 | | DSR 30 | |
|---|---|---|---|---|---|---|
| | PFC MC | LFOC MC | PFC MC | LFOC MC | PFC MC | LFOC MC |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | 484 | 486 | 484 | 486 |
| 482 | 484 | 486 | | | | |

DETECTION OF GEOMAGNETICALLY-INDUCED CURRENTS WITH POWER LINE-MOUNTED DEVICES

CROSS-REFERENCE TO RELATED APPLICATIONS

This patent application is a Continuation patent application which claims priority to non-provisional U.S. patent application Ser. No. 14/597,377 entitled "DETECTION OF GEOMAGNETICALLY-INDUCED CURRENTS WITH POWER LINE-MOUNTED DEVICES," filed on Jan. 15, 2015, which claims priority to U.S. Provisional Patent Application No. 61/937,220 that is entitled "DETECTION OF GEOMAGNETICALLY-INDUCED CURRENTS WITH POWER LINE-MOUNTED DEVICES," that was filed on Feb. 7, 2014, the contents of each of which are incorporated herein by reference in their entireties.

FIELD

The present invention generally relates to geomagnetically-induced currents on power lines of a power transmission system.

BACKGROUND

Power transmission systems are formed of a complex interconnected system of generating plants, substations, and transmission and distribution lines. A significant issue currently plaguing power transmission systems may be characterized as geomagnetically-induced currents (GICs), which are currents induced in a power line due to time-varying magnetic fields external to the Earth and resulting time-varying magnetic fields along the Earth's surface. The time-varying magnetic fields external to the Earth often result from solar activity and the activity of other extra-terrestrial objects.

These GICs have been measured as high as 100 amps for a 20 minute duration. They are typically in a much lower frequency range than the 50-60 Hz AC power that is conducted on power lines in modern power transmission systems. These GICs typically have such low frequency as to be quasi-DC currents. Unfortunately, modern transmission systems do not handle DC currents well. For example, high DC currents may cause undesirable resistive heating of components such as transformer windings which can cause such components to fail and result in a partial failure of the power transmission system. Prior art systems for measuring GICs can be bulky, expensive, and require major efforts to be installed. In many cases, this is because the GIC sensor requires a break in the power line in order to install same.

It is against this background that the techniques disclosed herein have been developed.

SUMMARY

A first aspect of the present invention is embodied by a device that monitors for a geomagnetically-induced current (or GIC) on a power line (e.g., the first aspect also encompasses a method or methods for monitoring for/identifying the existence of a GIC on a power line). The described device is mounted on the power line and will hereafter be referred to as a GIC monitor. The GIC monitor includes a magnetic core, which in turn incorporates an air gap. The magnetic core extends about at least part of a power line when the GIC monitor is installed or mounted on the power line. A magnetic sensor is positioned in the air gap of the magnetic core. This magnetic sensor is configured to sense a magnetic field(s) and produce an output signal that is representative of the magnetic field(s) (e.g., representative of the strength of the magnetic field). A signal processing unit is configured to identify or determine the existence of a geomagnetically-induced current (or GIC) using the output signal from the magnetic sensor.

A number of feature refinements and additional features are applicable to the first aspect of the present invention. These feature refinements and additional features may be used individually or in any combination. The following discussion is applicable to the first aspect, up to the start of the discussion of a second aspect of the present invention.

The GIC monitor may include an upper housing and a lower housing. The upper housing and lower housing may be at least partially separable from one another, and in the installed position or configuration may capture a power line between the upper and lower housings. In one embodiment the upper and lower housings are completely separable from one another, and when positioned to capture a power line therebetween may be detachably connected in any appropriate manner (e.g., using one or more threaded fasteners; such that the upper and lower housings are then maintained in a fixed position relative to one another).

The magnetic core of the GIC monitor may be of any appropriate configuration, including where the magnetic core is a multi-piece structure. One embodiment has the magnetic core including at least two separate core portions or sections in relation to proceeding about a power line (e.g., each core portion or section may correspond with a different angular segment relative to an axis along which the power line extends). Another embodiment has the magnetic core including at least three separate core portions or sections in relation to proceeding about a power line (e.g., each core portion or section may correspond with a different angular segment relative to an axis along which the power line extends). In the case of a three-piece core configuration and when the GIC monitor is mounted on a power line: 1) one of the core portions may be configured to extend at least generally 180° about the power line; 2) another of the core portions may be configured to extend slightly less than 90° about the power line; and 3) another of the core portions may be configured to extend slightly less than 90° about the power line. The air gap for the magnetic core may be located between the pair of slightly less than 90° core portions.

The magnetic core may be characterized as including an upper core section. The upper core section may extend at least generally 180° about a power line in the installed configuration. A one-piece configuration may be used for the upper core section. A plurality of core segments disposed in end-to-end relation could collectively define the upper core section.

The magnetic core may be characterized as including a lower core assembly, which in one embodiment includes two lower core sections that are spaced from one another to define the air gap in which the magnetic sensor is disposed. A one-piece configuration may be used for each such lower core section. A plurality of core segments disposed in end-to-end relation could collectively and separately define each lower core section. In any case, a first face of a first of the lower core sections may abut a first face of the noted upper core section, while a second face of this first lower core section may interface with/define a boundary of the air gap. A first face of a second of the lower core sections may abut a second face of the noted upper core section, while a second face of this second lower core section may interface with/define a boundary of the air gap. The second faces of the first and second lower core sections may be separated by the air gap and may at least generally project toward one another.

The magnetic sensor used by the GIC monitor may be of any appropriate type, including a Hall effect sensor. The Hall effect sensor may output an analog signal. The GIC sensor may utilize an analog-to-digital (ND) converter to convert the analog output signal from the Hall effect sensor to a digital signal. For instance, the analog output signal from the Hall effect sensor may be provided to the ND converter (e.g., via a twisted pair of wires).

The output signal from the magnetic sensor may be in the form of a differential output signal. The output signal from the magnetic sensor may be provided directly to the signal processing unit. However, one or more devices may be disposed between the magnetic sensor and the signal processing unit, for instance to condition the output signal in any appropriate manner (e.g., to improve upon the signal-to-noise ratio). One or more of such devices could also be incorporated by the signal processing unit.

The signal processing unit may be of any appropriate configuration that is able to determine a GIC using an output signal from the magnetic sensor. The signal processing unit may include a DC processing portion or section to identify the existence of a GIC on the power line using the output signal from the magnetic sensor. Such a DC processing portion may utilize at least one low pass filter of any appropriate type (e.g., to filter out higher frequency signals, such as signals that are representative of the AC current on the power line). The DC processing portion may further utilize a unit for determining the mean of the signal(s) that is representative of the DC or quasi-DC current on the power line. Any such DC or quasi-DC current may be equated with a GIC by the GIC monitor.

The signal processing unit of the GIC monitor may be configured to calibrate the value of the GIC that was determined by its DC processing portion. An AC processing portion or section may be utilized by the signal processing unit for this calibration. Generally, the AC processing portion obtains signals that are representative of the AC current on the power line from two separate sources, and uses a ratio of these signals to calibrate the value of the GIC that was determined by the DC processing portion.

The AC processing portion of the signal processing unit may utilize at least one high pass filter of any appropriate type (e.g., to reduce or filter out lower frequency signals, such as signals that are representative of a DC or quasi-DC current on the power line). The AC processing portion may further utilize a root-mean-square or RMS detector for determining the magnitude of the signal(s) that is representative of the AC current on the power line. A signal that is representative of the AC current on the power line may be input to the signal processing unit from another source (e.g., from a current monitor of a reactance module that also may incorporate the GIC monitor). The ratio of these two AC signals may then be used to adjust the GIC that has been determined by the DC processing portion.

The GIC monitor may include a transmitter and an antenna for communicating GIC information to one or more external devices (i.e., external to the GIC monitor). Any appropriate type of transmitter and antenna may be utilized. Multiple transmitters, multiple antennas, or both may be used by the GIC monitor. The GIC monitor may be "self-powered" when mounted on the power line (e.g., using power from the power line on which the GIC monitor is installed). In one embodiment the GIC monitor includes a current transformer to provide operating power for the GIC monitor.

The GIC monitor may be in the form of a stand-alone unit (i.e., separately mounted on a power line). Alternatively, the GIC monitor may be incorporated by another line-mounted device, for instance a reactance module. A transformer may be defined when such a reactance module is mounted on a power line (e.g., a single turn transformer). The primary or the secondary of this transformer may be the power line itself. The other of the primary or the secondary for this transformer may be one or more windings of a core for the reactance module (e.g., a first winding wrapped around a first core section of the reactance module, a second winding wrapped around a second core section of the reactance module, or both for the case when the first winding and second winding are electrically connected). Such a reactance module may be configured to selectively inject reactance into the corresponding power line (the power line on which the reactance module is mounted). Such a reactance module could be configured to selectively inject inductance into the corresponding power line (e.g., to reduce the current or power flow through the power line, or a current-decreasing modal configuration for the reactance module). Such a reactance module could be configured to inject capacitance into the corresponding power line (e.g., to increase the current or power flow through the power line, or a current-increasing modal configuration for the reactance module).

A reactance module may include any appropriate switch architecture for switching between two different modes of operation. A reactance module may include one or more processors disposed in any appropriate processing architecture to control operation of any such switch architecture. In a first mode, a reactance module may be configured to inject little or no reactance into the corresponding power line (e.g., a bypass or monitoring mode). In a second mode, a reactance module may be configured to inject substantially more reactance into the corresponding power line compared to the first mode (e.g., an injection mode).

A second aspect of the present invention is embodied by a method of operating a power transmission system (e.g., the second aspect also encompasses a power transmission system that is configured to execute the method(s) described herein). A current on a power line of the power transmission system is monitored by a geomagnetically-induced current device or monitor (GIC monitor) that is installed on the power line. An existence of a geomagnetically-induced current or GIC on the power line is identified by the GIC monitor (from the monitored current on the power line). The GIC monitor sends a communication to another component of the power transmission system in response to an identification of a GIC by the GIC monitor.

A number of feature refinements and additional features are applicable to the second aspect of the present invention. These feature refinements and additional features may be used individually or in any combination. The GIC monitor used by the second aspect may be in accordance with the above-described first aspect. A GIC communication in accordance with the second aspect could embody information such as the magnitude of the identified GIC, a time at which the GIC was identified (e.g., a time stamp), the power line on which the GIC was identified, at least the general location of the GIC, and the like. The GIC monitor may send a GIC communication to any appropriate component of the power transmission system, such as a utility-side control system (e.g., an energy management system; a supervisory control and data acquisition system; a market management system).

Any feature of any other various aspects of the present invention that is intended to be limited to a "singular" context or the like will be clearly set forth herein by terms such as "only," "single," "limited to," or the like. Merely introducing a feature in accordance with commonly accepted antecedent basis practice does not limit the corresponding feature to the singular (e.g., indicating that the GIC monitor includes "an antenna" alone does not mean that the GIC monitor includes only a single antenna). Moreover, any failure to use phrases such as "at least one" also does not limit the corresponding feature to the singular (e.g., indicating that the GIC monitor includes "an antenna" alone does not mean that the GIC monitor includes only a single antenna). Use of the phrase "at least generally" or the like in relation to a particular feature encompasses the corresponding characteristic and insubstantial variations thereof (e.g., indicating that a structure is at least generally cylindrical encompasses this structure being cylindrical). Finally, a reference of a feature in conjunction with the phrase "in one embodiment" does not limit the use of the feature to a single embodiment.

BRIEF DESCRIPTION OF THE FIGURES

FIG. 1 is a schematic of one embodiment of a power transmission system having line-mounted reactance modules.

FIG. 2A is a perspective view of one end of an embodiment of a line-mountable reactance module.

FIG. 3 is an exploded, perspective view of the reactance module of FIGS. 2A/2B.

FIG. 4A is a perspective view of a lower core assembly positioned within a lower housing section from the reactance module of FIGS. 2A/2B.

FIG. 4B is an exploded, perspective view of the lower core assembly and lower housing section from the reactance module of FIGS. 2A/2B.

FIG. 4G is an enlarged, perspective view of an internal cavity for an antenna disposed at one of the ends of the reactance module of FIGS. 2A/2B, illustrating an exciter or probe of the antenna.

FIG. 5C is a cutaway view showing the upper core assembly seated within the upper housing section, and taken perpendicularly to the length dimension of the reactance module of FIGS. 2A/2B.

FIG. 6A is a perspective view of the lower core assembly from the reactance module of FIGS. 2A/2B.

FIG. 6B is a perspective view of the lower core section for the lower core assembly from the reactance module of FIGS. 2A/2B, illustrating spacers installed on faces of the individual lower core segments that collectively define the lower core section.

FIG. 6C is a perspective view of the lower core section for the lower core assembly from the reactance module of FIGS. 2A/2B, illustrating the faces of the lower core segments that collectively define the lower core section (before installing the noted spacers).

FIG. 7A is a perspective view of the upper core assembly from the reactance module of FIGS. 2A/2B.

FIG. 7B is a top perspective view of the upper core section for the upper core assembly from the reactance module of FIGS. 2A/2B.

FIG. 7C is a bottom perspective view of the upper core section for the upper core assembly from the reactance module of FIGS. 2A/2B, illustrating spacers installed on faces of the individual lower core segments that collectively define the lower core section.

FIG. 8A is one perspective view of the lower core assembly and electronics from the reactance module of FIGS. 2A/2B.

FIG. 8B is another perspective view of the lower core assembly and electronics from the reactance module of FIGS. 2A/2B.

FIG. 13D is a diagram of a system condition/contingency data structure that may be incorporated by DSR array controllers from the power transmission system of FIG. 13A.

DETAILED DESCRIPTION

Figure 2B:
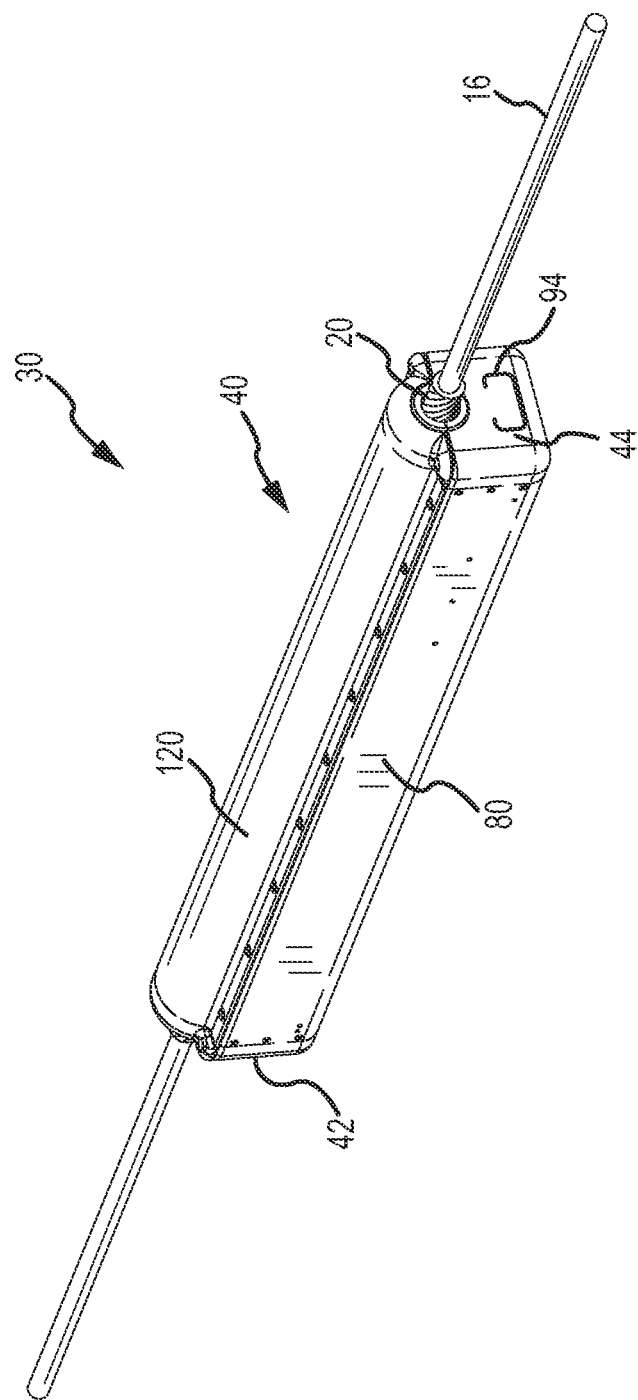
FIG. 2B is a perspective view of an opposite end of the reactance module of FIG. 2A.

While the disclosure is susceptible to various modifications and alternative forms, specific embodiments thereof have been shown by way of example in the drawings and are herein described in detail. It should be understood, however, that it is not intended to limit the disclosure to the particular form disclosed, but rather, the disclosure is to cover all modifications, equivalents, and alternatives falling within the scope as defined by the claims.

One embodiment of a power transmission system is illustrated in FIG. 1 as identified by reference numeral 10. The power transmission system 10 includes a plurality of power lines 16 (three in the illustrated embodiment, for providing three-phase power) that extend between an electric power source 12 and a load 22. Any appropriate number of electrical power sources 12 and loads 22 may be associated with the power transmission system 10. A plurality of towers 14 of any appropriate size, shape, and/or configuration may support the various power lines 16 at appropriately spaced locations. The power lines 16 may be of any appropriate type, for instance power transmission lines (larger capacity) or distribution lines (lower capacity).

A plurality of distributed series reactors (DSRs) or "reactance modules" are installed on each of the power lines 16 of the power transmission system 10, and are identified by reference numeral 24. Although hereafter these devices may be referred to as "DSRs", it should be appreciated such a reference is actually to a "reactance module." Any appropriate number of DSRs 24 may be installed on a given power line 16 and using any appropriate spacing. Each DSR 24 may be installed on a power line 16 at any appropriate location, including in proximity to an insulator. Generally, each DSR 24 (more generally each reactance module) may be configured/operated to inject reactance (e.g., inductance, capacitance) into the corresponding power line 16. That is, a given DSR 24 (more generally a given reactance module) may be of a configuration so as to be able to inject inductance into the power line 16 on which it is mounted (e.g., the injected reactance may be an inductive reactance or inductance, which may reduce the flow of current through the power line 16 on which the DSR 24 is mounted). A given DSR 24 (more generally a given reactance module) may also be of a configuration so as to be able to inject capacitance into the power line 16 on which it is mounted (e.g., the injected reactance may be a capacitive reactance or capacitance, which may increase the flow of current through the power line 16 on which the DSR 24 is mounted).

FIGS. 2A, 2B, and 3 illustrate a representative configuration for the DSRs 24 presented in FIG. 1, and which is identified by reference numeral 30. Generally, the configuration of the DSR or reactance module 30 presented herein is of the type that provides for the injection of inductance into a power line 16 on which it is mounted. However and as in the case of the DSR 24 discussed above, the DSR 30 could be configured so as to inject capacitance into the power line 16 on which it is mounted (not shown).

The DSR 30 of FIGS. 2A, 2B, and 3 is configured for installation on a power line 16 without requiring a break in the same. In this regard, a housing 40 of the DSR 30 includes a first or lower housing section 80 and a second or upper housing section 120 that are detachably connected in any appropriate fashion. A first or lower end cap 90 and a second or upper end cap 124 of the housing 40 are positioned on one end 42 (e.g., a power end) of the DSR 30, and another lower end cap 90 and upper end cap 124 are positioned at the opposite end 44 (e.g., a control end) of the housing 40. As will be discussed in more detail below, the DSR 30 uses a pair of cavity-backed slot antennas 100 (e.g., FIGS. 4E, 4F, and 4G), one being positioned at least generally at each end 42, 44 of the DSR 30. As such, a slot 94 for the antenna 100 extends through the wall thickness of the housing 40 at each of its ends 42, 44.

The housing 40 of the DSR 30 at least substantially encloses a core assembly 50 (e.g., in the form of a single turn transformer). Although the core assembly 50 (e.g., collectively defined by core assemblies 130, 160) is illustrated as having a round or circular outer perimeter, other shapes may be appropriate. A first or lower core assembly 130 is disposed within the lower housing section 80 (e.g., within a compartment 86), while a second or upper core assembly 160 is disposed within the upper housing section 120. The lower core assembly 130 includes a first or lower winding 144, while the upper core assembly 160 includes a second or upper winding 174. The windings 144, 174 may be electrically interconnected in any appropriate manner. The lower core assembly 130 and the upper core assembly 160 are collectively disposed about the power line 16 on which the DSR 30 is installed. When the core assembly 50 is installed on a power line 16, it collectively defines a single turn transformer, where the primary of this single turn transformer is the power line 16, and where the secondary of this single turn transformer is defined by the windings 144, 174 for the illustrated embodiment. However, the secondary of this single turn transformer could be comprised of only the lower winding 144 or only the upper winding 174. For example, the lower core assembly 130 may include the lower winding 144, and the upper core assembly 160 may not include the upper winding 174. Similarly, the lower core assembly 130 may not include the lower winding 144, and the upper core assembly 160 may include the upper winding 174. As such, the primary of the noted single turn transformer is the power line 16, and the secondary of this single turn transformer may be the lower winding 144 by itself, may be the upper winding 174 by itself, or collectively may be the lower winding 144 and the upper winding 174. Furthermore, while the power line 16 is described herein as the primary winding and some combination of the lower and upper windings 144, 174 are described herein as the secondary winding, as that may be conventional when describing the power line 16 when it is part of a single-turn transformer, for the purposes of the device 202 to be described herein, one could refer to the combination of the lower and upper windings 144, 174 as the primary winding and the power line 16 as the secondary winding. In each case, the function is the same.

The housing 40 of the DSR 30 also at least substantially encloses electronics 200 for undertaking various operations of the DSR 30. The electronics 200 are disposed within the lower housing section 80, and are separated from the lower core assembly 130 by a partition or barrier 82. This partition 82 may provide shielding for the electronics 200, such as shielding against electromagnetic interference. Any appropriate shielding material may be utilized for the partition 82.

A pair of first or lower clamps 64 are associated with the lower core assembly 130, and may be anchored relative to the lower housing section 80 in any appropriate manner. A pair of second or upper clamps 66 are associated with the upper core assembly 160, and may be anchored relative to the upper housing section 120 in any appropriate manner. Although the clamps 64, 66 could directly engage the power line 16, in the illustrated embodiment a pair of line guards 20 are mounted on the power line 16 at locations that correspond with the position of each pair of clamps 64/66.

Figure 4C:
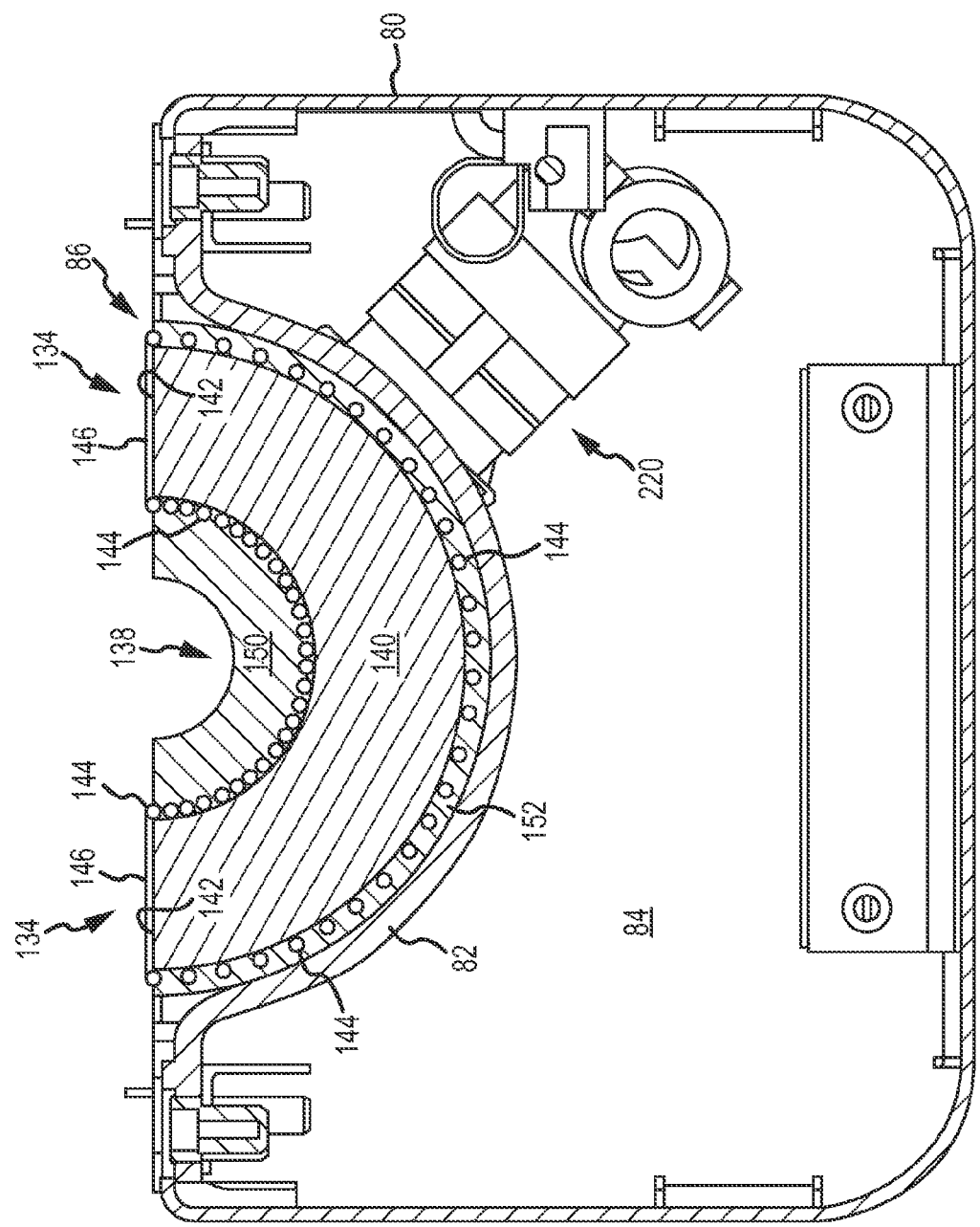
FIG. 4C is a cutaway view showing the lower core assembly seated within the lower housing section, and taken perpendicularly to the length dimension of the reactance module of FIGS. 2A/2B.

Additional views of the lower housing section 80 and lower core assembly 130 are presented in FIGS. 4A-4G. FIG. 4A shows the lower core assembly 130 being positioned within the lower housing section 80, while FIG. 4B shows the lower core assembly 130 being exploded away from the lower housing section 80. A barrier or partition 82 is associated with the lower housing section 80, and defines a lower or electronics compartment 84 and an upper or core compartment 86 (e.g., FIG. 4C). In one embodiment, the electronics compartment 84 is at least substantially waterproof. Moreover and as noted, the electronics compartment 84 may be shielded from the core assembly 50, for instance by the above-noted barrier or partition 82. In any case, the electronics 200 are disposed within the electronics compartment 84, while the lower core assembly 130 is disposed within the core compartment 86.

Figure 4D:
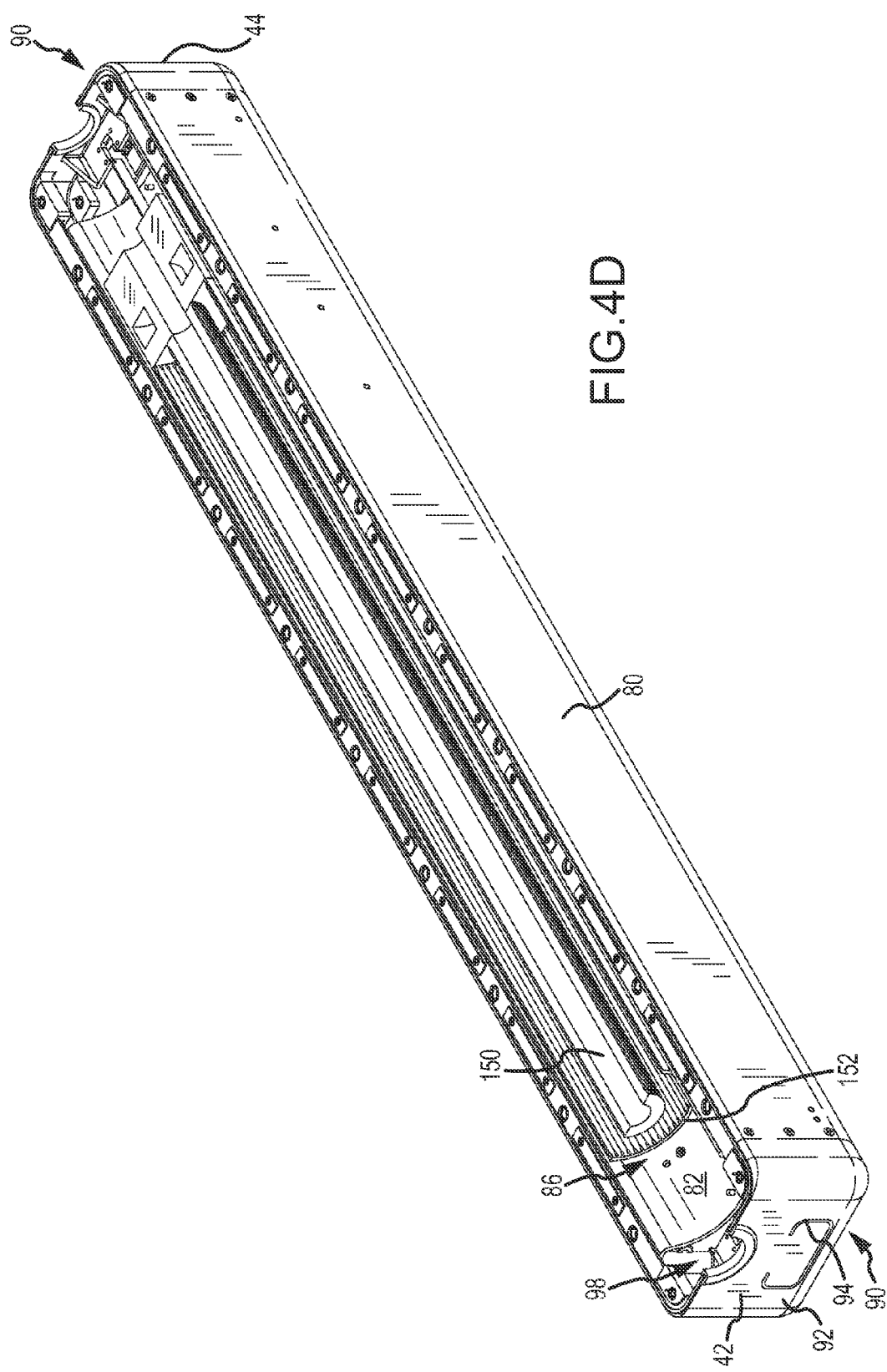
FIG. 4D is an enlarged, perspective view of the lower housing section from the reactance module of FIGS. 2A/2B, and illustrating the encapsulating sections for the lower core assembly.

The lower core assembly 130 is retained by encapsulating sections 150, 152 within the lower housing section 80 (e.g., FIGS. 4B, 4C, and 4D). In one embodiment, the encapsulating sections 150, 152 are each in the form of a silicone elastomer encapsulant such as Sylgard® available from Dow Corning (the Sylgard® for the encapsulating sections 150, 152 may be matched to the dielectric and operational performance rating of the DSR 30). The encapsulating section 152 is disposed between the lower core assembly 130 and the partition 82 of the lower housing section 80. The encapsulating section 150 is disposed between the lower core assembly 130 and the power line 16. A first or lower power line cavity 138 extends along the length of the lower core assembly 130 (within the encapsulating section 150) for receiving a lower portion of the corresponding power line 16. FIG. 4D shows the relative position of the encapsulating sections 150, 152, with the lower core assembly 130 being removed to show this relative position.

A pair of first or lower end caps 90 are disposed at each of the two ends 42, 44 of the DSR 30, and are each detachably connected in any appropriate manner to the lower housing section 80. Each lower end cap 90 includes an end wall 92. A slot 94 extends through the entire thickness of the end wall 92, may be of any appropriate shape, and is part of the associated antenna 100. The slot 94 may be characterized as having a "folded configuration" to provide for a desired length. An antenna compartment 98 is disposed within each lower end cap 90. An end plate 88 (FIG. 4F) separates this antenna compartment 98 from the electronics compartment 84. Generally, each antenna 100 utilizes an aperture that extends through the housing 40 of the DSR 30, and this aperture may be of any appropriate shape/size, and may be incorporated in any appropriate manner (e.g., such an aperture could actually project downwardly when the DSR 30 is installed on a power line 16).

Figure 4E:
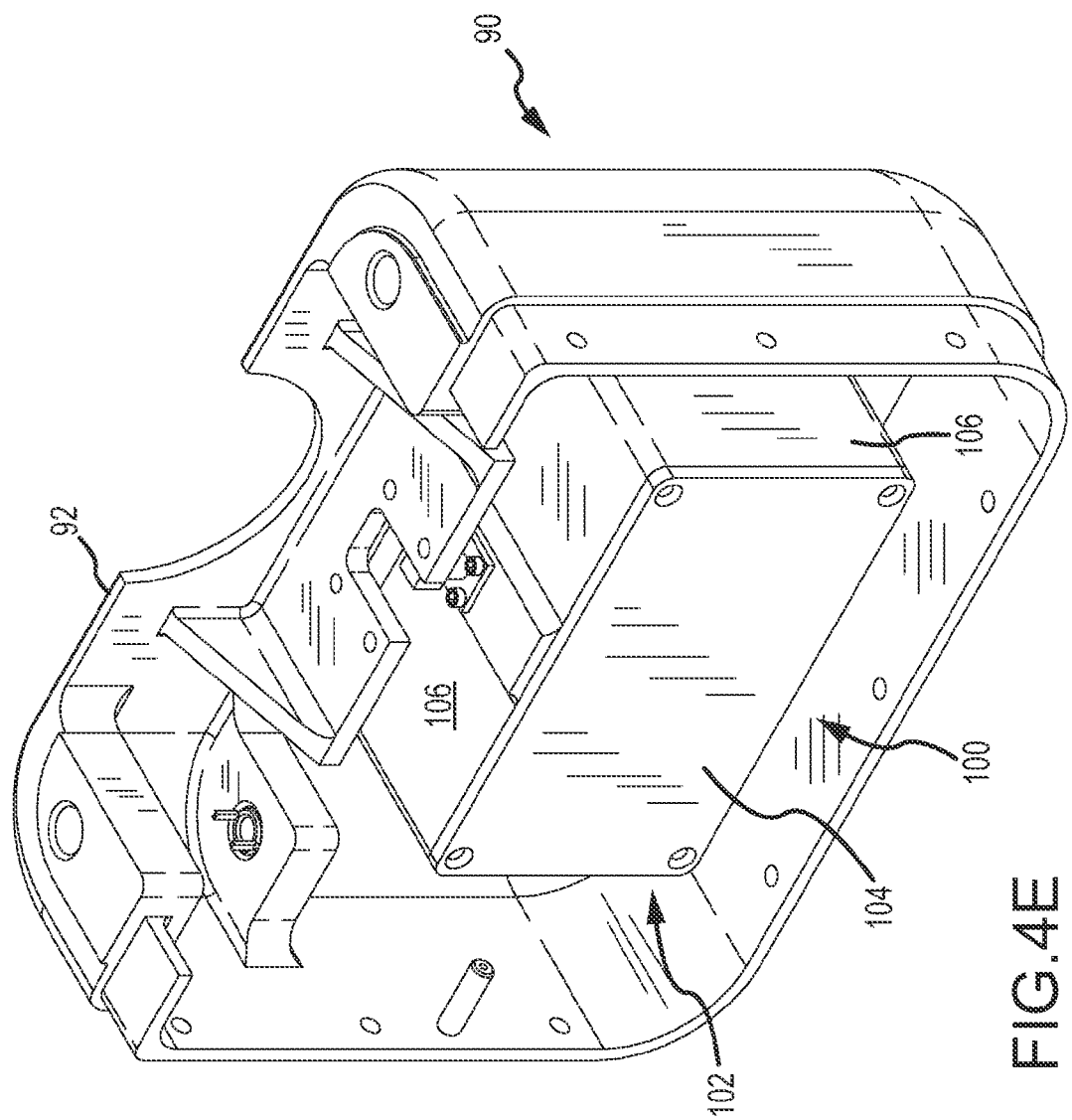
FIG. 4E is a perspective view of the interior of one of the lower end caps that is attached to the lower housing section, illustrating an antenna housing disposed therein.
Figure 4F:
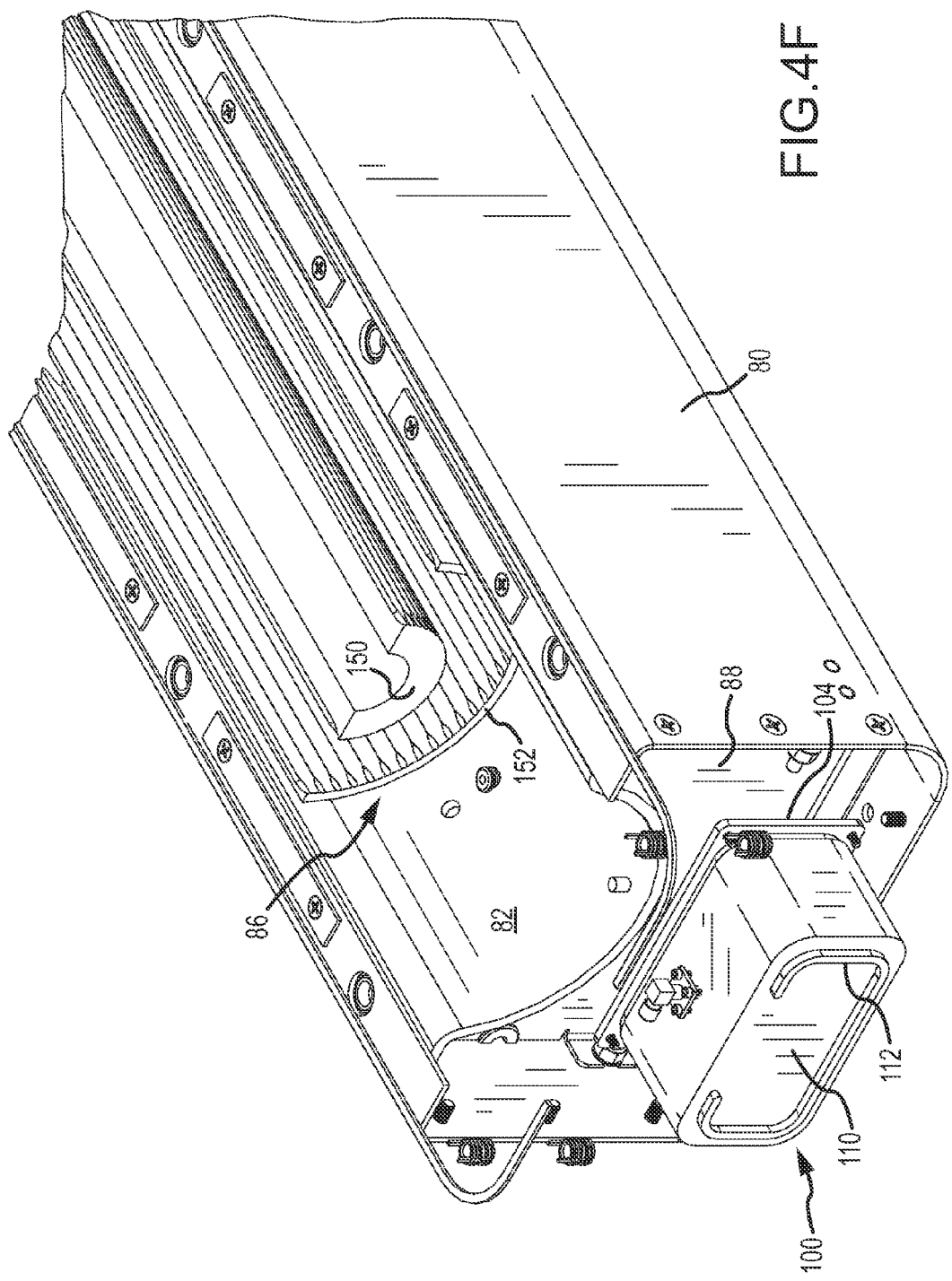
FIG. 4F is an enlarged, perspective view of an insert for an antenna disposed at one of the ends of the reactance module of FIGS. 2A/2B.

Other components of the antenna 100 are illustrated in FIGS. 4E, 4F, and 4G. Again, an antenna 100 is located at least generally at the two ends 42, 44 of the DSR 30 in the illustrated embodiment, with each antenna 100 being located within its corresponding antenna compartment 98. Each antenna 100 includes an antenna housing 102 of any appropriate size/shape and which may be formed from any appropriate material or combination of materials. The antenna housing 102 includes a back section 104, along with a plurality of side sections 106 (four in the illustrated embodiment) that extend to the back side of the end wall 92 of the corresponding lower end cap 90. As such, the end wall 92 of the corresponding lower end cap 90 may be characterized as defining an end of the antenna housing 102 that is disposed opposite of the back section 104.

An insert 110 (FIG. 4F) may be disposed within the antenna housing 102. This insert 110 may be formed from any appropriate material, for instance Teflon®. An insert 110 may not be required in all instances. In any case, a projection 112 may be formed on an end of the insert 110, and extends into the slot 94 on the end wall 92 of its corresponding lower end cap 90. The antenna housing 102 defines an internal cavity 108 having an exciter or probe 114. The antenna 100 may be characterized as a slotted antenna or as a cavity-backed slot antenna. Notably, neither antenna 100 protrudes beyond an outer perimeter of the housing 40 for the DSR 30.

Figure 4H:
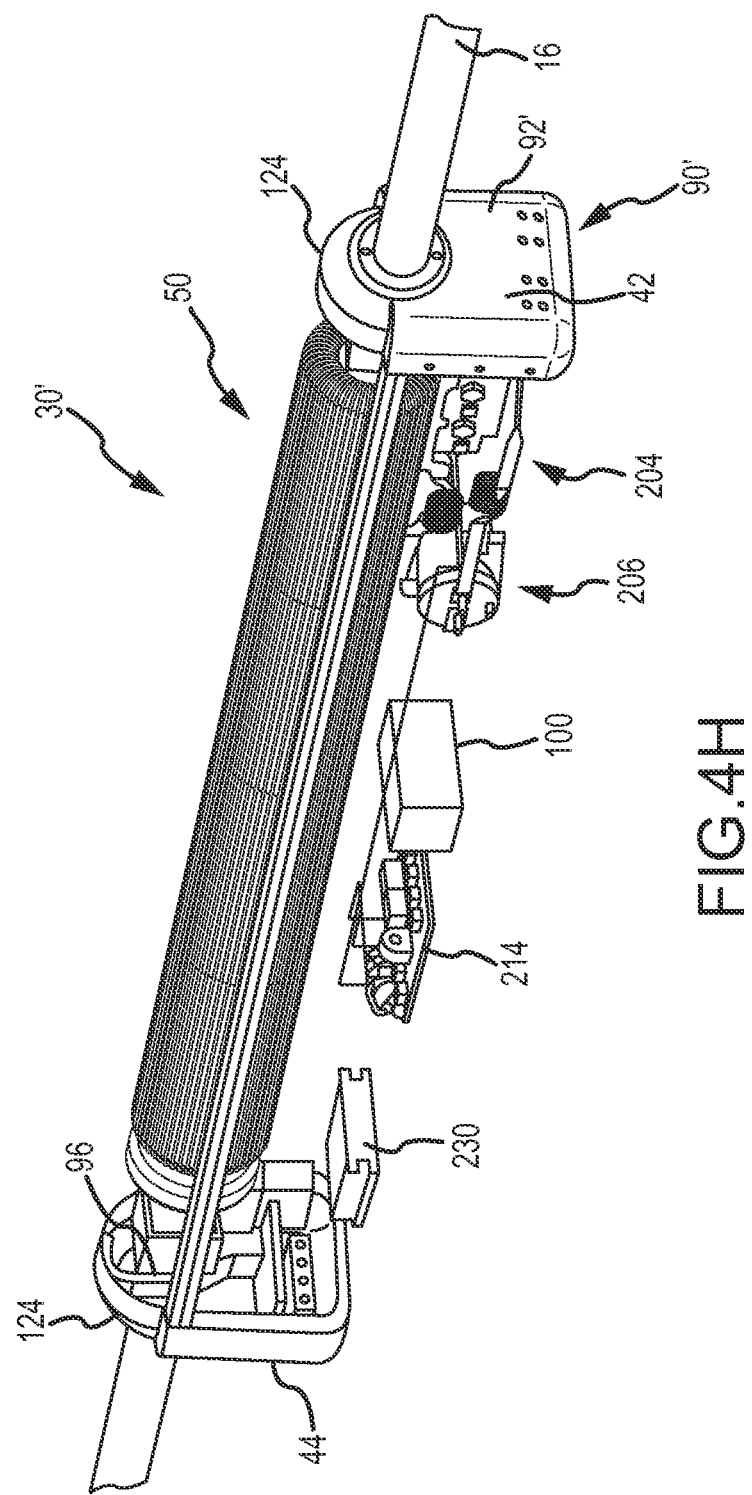
FIG. 4H is a perspective view of a variation of the lower housing section from the reactance module of FIGS. 2A/2B, and which incorporates installation hooks.

A variation of the DSR 30 is presented in FIG. 4H in the form of a DSR 30'. Corresponding components of these two embodiments are identified by the same reference numerals. Those corresponding components that differ are further identified by a "single prime" designation in FIG. 4H. Unless otherwise noted, the DSR 30' includes the same features as the DSR 30.

One difference between the DSR 30 and the DSR 30' is that there is a single antenna 100 in the case of the DSR 30' of FIG. 4H. This single antenna 100 may be disposed at an appropriate location between the ends 42, 44 of the DSR 30

(e.g., within the housing 40). In the illustrated embodiment, the antenna 100 is disposed at least generally midway between the ends 42, 44 of the DSR 30'. Relatedly, the end wall 92' of the two lower end caps 90' need not include a slot 94. Instead, a similar slot would be included on the bottom of the housing 40 to accommodate the antenna 100 for the DSR 30' (i.e., on the surface of the first housing section 80 that projects in a downward direction when the DSR 30' is installed on a power line 16).

Another difference between the DSR 30 and the DSR 30' of FIG. 4H is that the DSR 30' includes a pair of installation hooks 96. One installation hook 96 may be disposed within the lower end cap 90' at each of the ends 42, 44 of the DSR 30'. Each installation hook 96 may be anchored in any appropriate manner relative to the first housing section 80 of the DSR 30'. That is, the installation hooks 96 will move collectively with the lower housing section 80 during installation of the DSR 30' on a power line 16. It should be appreciated that the installation hooks 96 could also be integrated into the structure of the DSR 30 in any appropriate manner.

The installation hooks 96 facilitate installation of the DSR 30' on a power line 16. Generally, the first housing section 80 of the DSR 30' may be suspended from a power line 16 by disposing each of the installation hooks 96 on the power line 16 (the installation hooks 96 engaging the power line 16 at locations that are spaced along the length of the power line 16; the installation hooks 96 could be positioned directly on the power line 16, or on a corresponding line guard 20). The second housing section 120 may then be positioned over each of the power line 16 and the first housing section 80. At this time, the second housing section 120 may be supported by the power line 16 and/or the first housing section 80.

With the second housing section 120 being properly aligned with the first housing section 80, a plurality of fasteners may be used to secure the second housing section 120 to the first housing section 80. As the second housing section 120 is being connected to the first housing section 80, (e.g., as the various fasteners are rotated), the first housing section 80 may be lifted upwardly in the direction of the second housing section 120, which in turn will lift the installation hooks 96 (again, fixed relative to the first housing section 80) off of the power line 16. Ultimately, the installation hooks 96 are received within the hollow interior of the second or upper end caps 124 of the second housing section 120. Once the second housing section 120 and the first housing section 80 are appropriately secured together, both installation hooks 96 will be maintained in spaced relation to the power line 16.

Figure 5A:
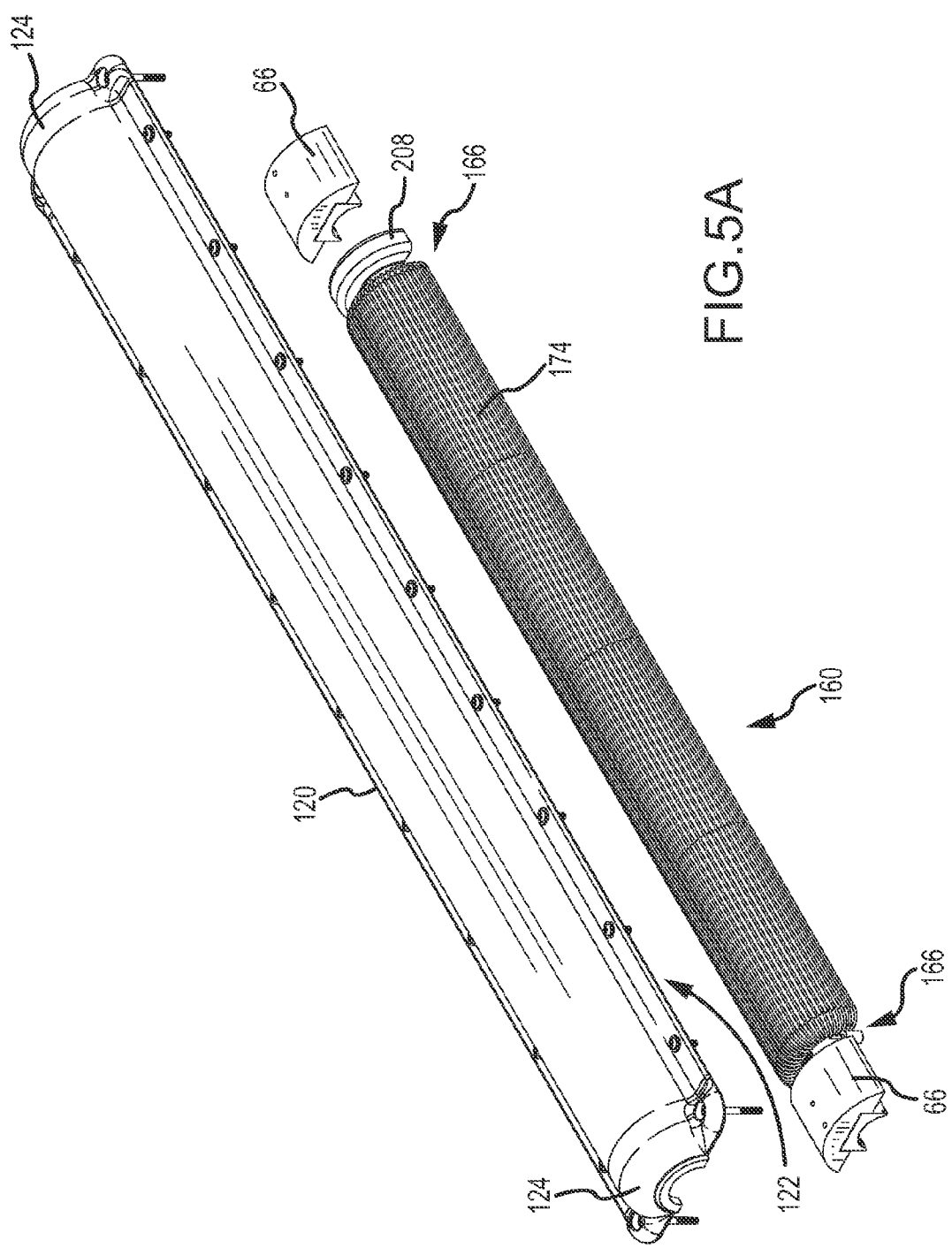
FIG. 5A is an exploded, perspective view of an upper core assembly and upper housing section from the reactance module of FIGS. 2A/2B.
Figure 5B:
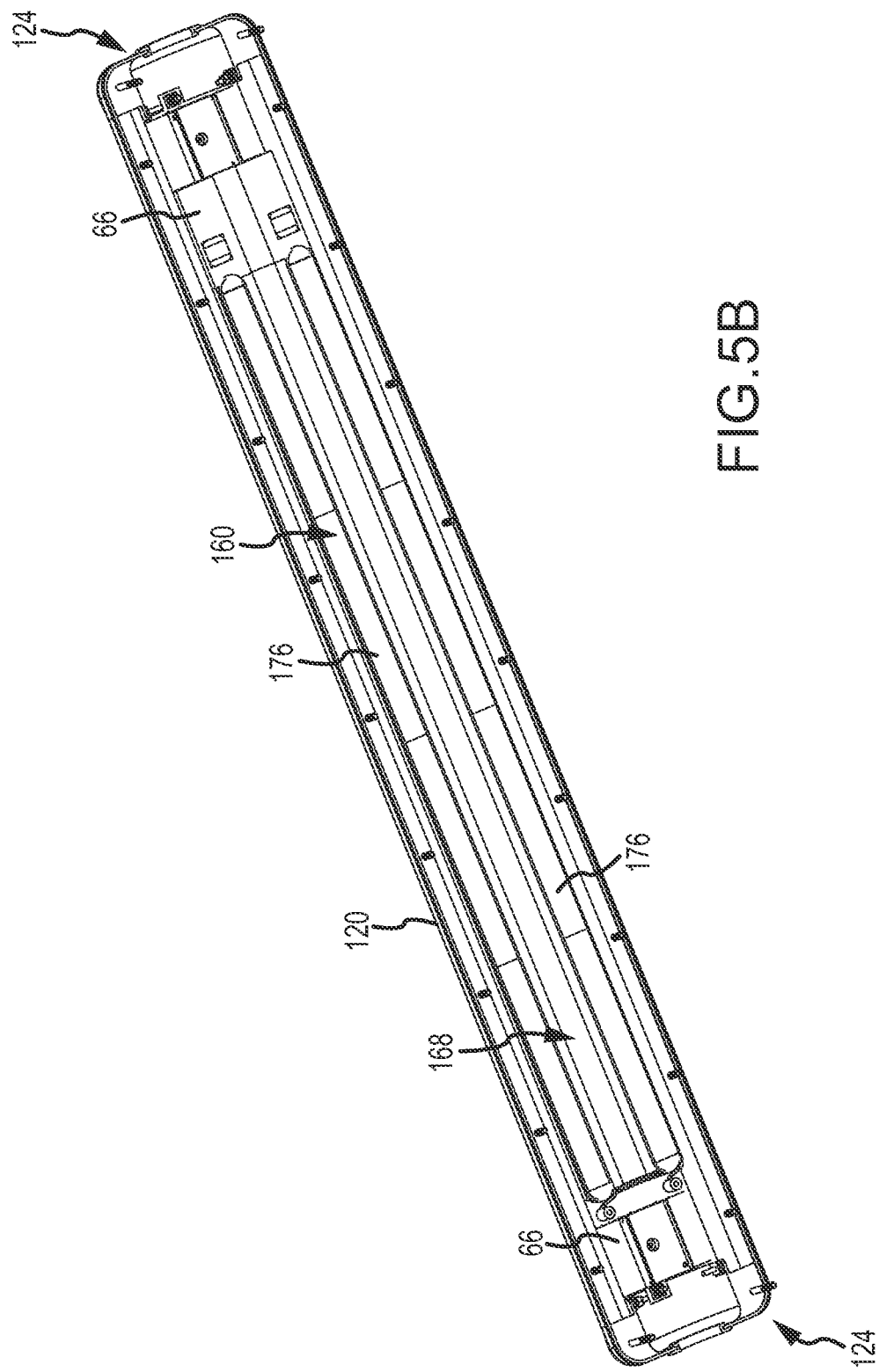
FIG. 5B is a bottom view of the upper core assembly seated within the upper housing section from the reactance module of FIGS. 2A/2B.

Additional views of the upper housing section 120 and upper core assembly 160 are presented in FIGS. 5A-5D. FIG. 5A shows the upper core assembly 160 being exploded away from the upper housing section 120 (the upper core assembly 160 being received within a core compartment 122 of the upper housing section 120), while FIG. 5B shows the upper core assembly 160 being positioned within the upper housing section 120 (more specifically within the core compartment 122). A pair of second or upper end caps 124 are detachably connected to opposite ends of the upper housing section 120 and define corresponding portions of the two ends 42, 44 of the DSR 30.

Figure 5D:
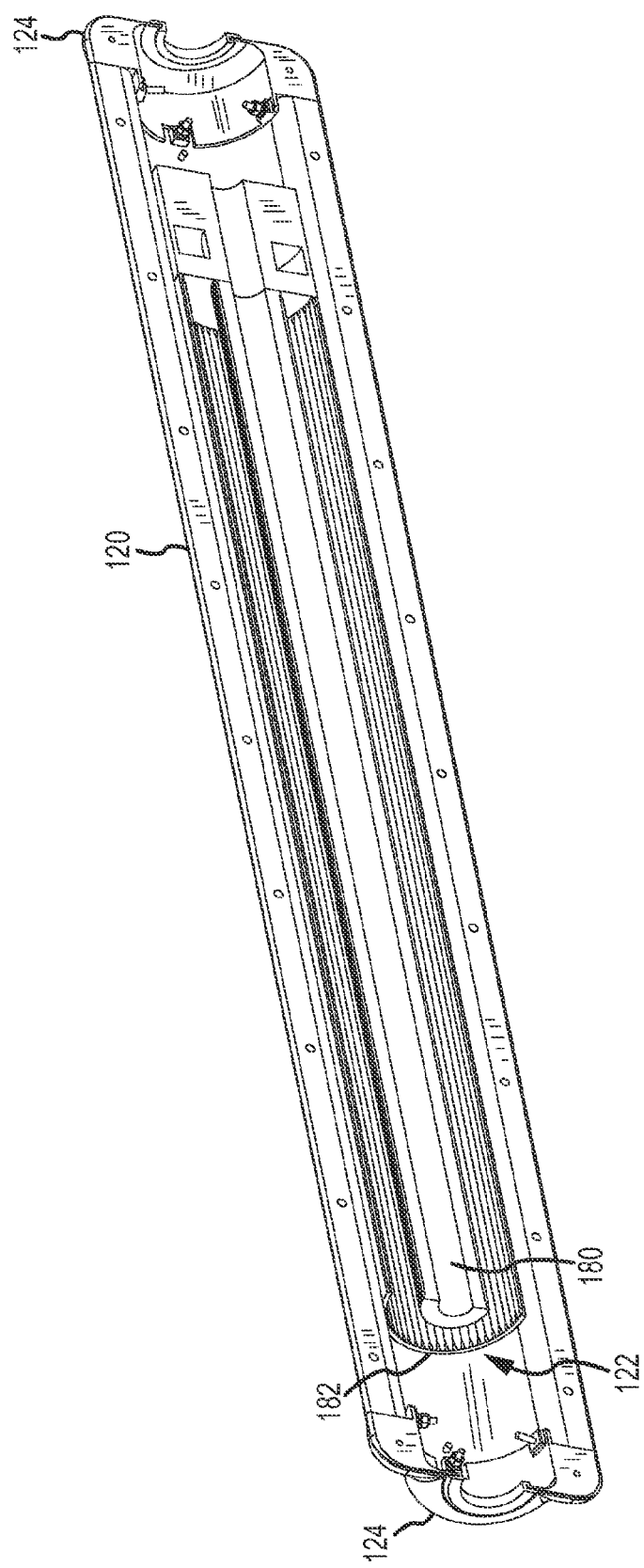
FIG. 5D is a perspective view of the interior of the upper housing section from the reactance module of FIGS. 2A/2B, and illustrating the encapsulating sections for the upper core assembly.
Figure 7D:
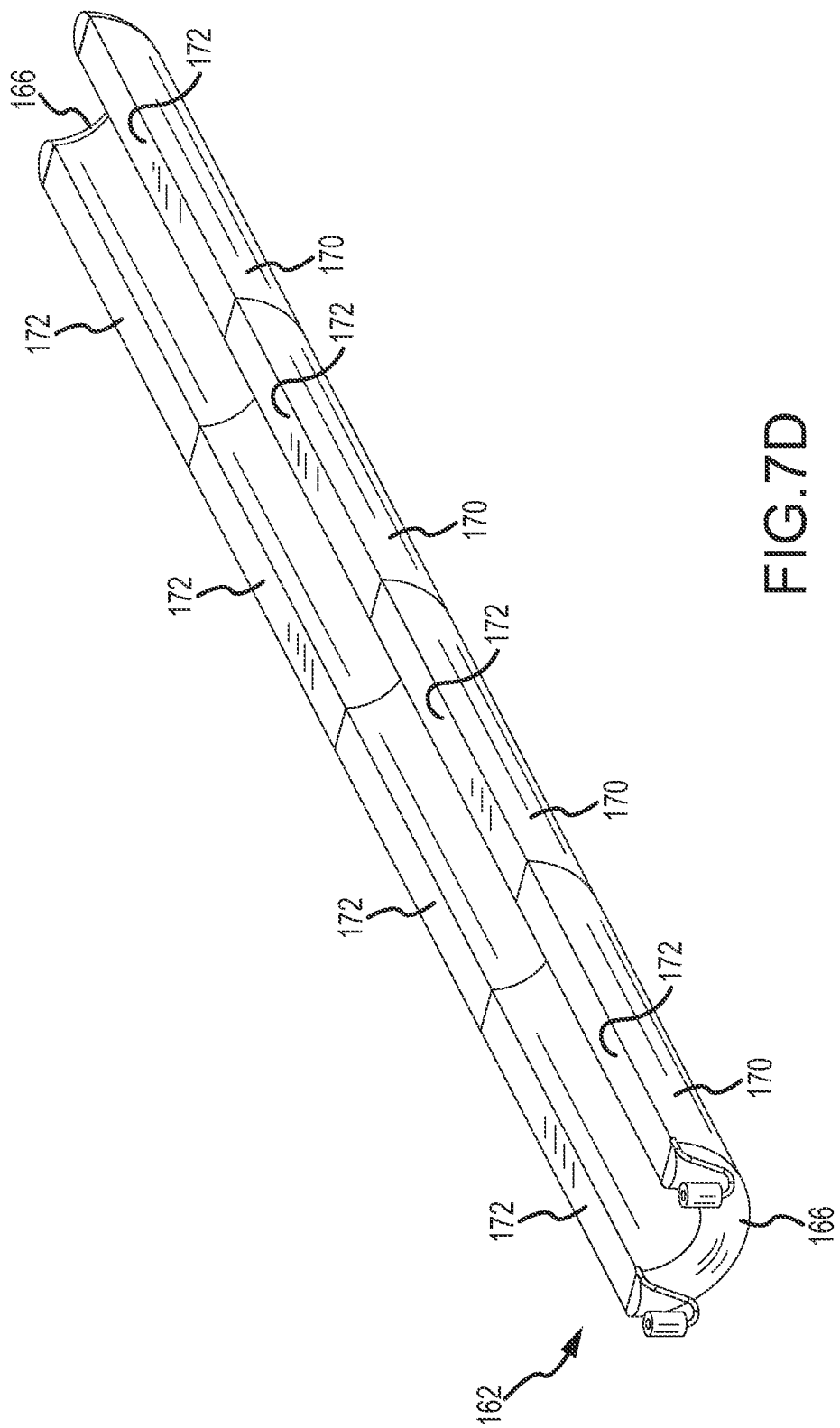
FIG. 7D is a bottom perspective view of the upper core section for the upper core assembly from the reactance module of FIGS. 2A/2B, illustrating the faces of the individual upper core segments that collectively define the upper core section (before installing the noted spacers).

Referring now to FIG. 5C, the upper core assembly 160 is retained by encapsulating sections 180, 182 within the upper housing section 120. In one embodiment, the encapsulating sections 180, 182 are a silicone elastomer encapsulant such as the above-noted Sylgard®. The encapsulating section 182 is disposed between the upper core assembly 160 and the upper housing section 120. The encapsulating section 180 is disposed between the upper core assembly 160 and the power line 16. A second or upper power line cavity 168 extends along the length of the upper core assembly 160 (within the encapsulating section 180) for receiving an upper portion of the corresponding power line 16. FIG. 5D shows the relative position of the encapsulating sections 180, 182, with the upper core assembly 160 being removed to show this relative position.

FIGS. 6A-6C present various enlarged views pertaining to the lower core assembly 130. The lower core assembly 130 includes a first or lower core section 132 (FIG. 6B) having a pair of oppositely disposed ends 136. A first or lower winding 144 (FIG. 6A) wraps around the lower core section 132 between its two ends 136.

The lower core section 132 of the lower core assembly 130 is collectively defined by a plurality of first or lower core segments 140 that are disposed in end-to-end relation. Any appropriate number of individual lower core segments 140 may be utilized (four in the illustrated embodiment). Adjacent lower core segments 140 may be disposed in abutting relation, or adjacent lower core segments 140 may be separated from one another by an appropriate space (typically a small space, such as a space of no more than about ⅛ inches).

Each lower core segment 140 includes a pair of faces 142 (FIGS. 6C and 4C) that extend along opposite sides of the corresponding lower core segment 140 in its length dimension. The faces 142 on each of the two sides of the lower core section 132 may be characterized as collectively defining a core section face (i.e., the lower core section 132 may be characterized as having two core section faces, with each of the core section faces being defined by the faces 142 of the lower core segments 140 on a common side of the lower core section 132). Each face 142 is in the form of an at least substantially planar or flat surface. The faces 142 of the various lower core segments 140 are disposed in at least substantially coplanar relation (e.g., the various faces 142 are at least substantially disposed within a common reference plane). A separate spacer 146 (e.g., FIGS. 6A, 6B, 4C) is appropriately secured (e.g., bonded; adhesively attached) to each face 142 of each lower core segment 140. A single spacer could collectively extend over those faces 142 of the various lower core segments 142 that are on a common side of the lower core segments 142 (not shown). In any case and in one embodiment, each spacer 146 is in the form of tape or a dielectric film, for instance a polyamide film (e.g., Kapton® tape available from DuPont Company). Kapton® tape dimensions for each spacer 146 (as well as spacers 176 addressed below) may be specific to the magnetization and loss performance ratings of the DSR 30.

The spacers 146 on a common side of the lower core section 132 may be characterized as collectively defining an interface 134. Therefore, the lower core section 132 includes a pair of laterally spaced interfaces 134 that each extend along the entire length of the lower core section 132 (e.g., between its opposing ends 136). One embodiment has each spacer 146 having a thickness within a range of about 0.07 inches to about 0.13 inches, although other thicknesses may be appropriate (e.g., to realize a desired amount of reactance to be injected into the power line 16 by the core assembly 50). Generally, the spacers 146 associated with the lower core section 132 contribute to providing and maintaining a desired and controlled physical and electric/magnetic spacing between the lower core assembly 130 and the upper core assembly 160.

FIGS. 7A-7D present various enlarged views pertaining to the upper core assembly 160. The upper core assembly 160 includes a second or upper core section 162 (FIG. 7B) having a pair of oppositely disposed ends 166. A second or upper winding 174 (FIG. 7A) wraps around the upper core section 162 between its two ends 166.

The upper core section 162 of the upper core assembly 160 is collectively defined by a plurality of second or upper core segments 170 that are disposed in end-to-end relation. Any appropriate number of individual upper core segments 170 may be utilized (four in the illustrated embodiment). Adjacent upper core segments 170 may be disposed in abutting relation, or adjacent upper core segments 170 may be separated from one another by an appropriate space (e.g., in accordance with the discussion presented above on the lower core section 132).

Each upper core segment 170 includes a pair of faces 172 (FIGS. 7D and 5C) that extend along opposite sides of the corresponding upper core segment 170 in its length dimension. The faces 172 on each of the two sides of the upper core section 162 may be characterized as collectively defining a core section face (i.e., the upper core section 162 may be characterized as having two core section faces, with each of the core section faces being defined by the faces 172 of the upper core segments 170 on a common side of the upper core section 162). Each face 172 is in the form of an at least substantially planar or flat surface. The faces 172 of the various upper core segments 170 are disposed in at least substantially coplanar relation (e.g., the various faces 172 are at least substantially disposed within a common reference plane). A separate spacer 176 (e.g., FIGS. 7A, 7B, 5C) is appropriately secured (e.g., bonded; adhesively attached) to each face 172 of each upper core segment 170. A single spacer could collectively extend over those faces 172 of the various upper core segments 170 that are on a common side of the upper core segments 170. In any case and in one embodiment, each spacer 176 is in the form of tape or a dielectric film, for instance a polyamide film (e.g., Kapton® tape, noted above).

The spacers 176 on a common side of the upper core section 162 may be characterized as collectively defining an interface 164. Therefore, the upper core section 162 includes a pair of laterally spaced interfaces 164 that each extend along the entire length of the upper core section 162 (e.g., between its opposing ends 166). One embodiment has each spacer 176 having a thickness within a range of about 0.07 inches to about 0.13 inches, although other thicknesses may be appropriate (e.g., to realize a desired amount of reactance to be injected into the power line 16 by the core assembly 50). Generally, the spacers 176 associated with the upper core section 162 contribute to providing and maintaining a desired and controlled physical and electric/magnetic spacing between the lower core assembly 130 and the upper core assembly 160.

When the upper core assembly 160 is properly aligned with the lower core assembly 130, the interface 164 on one side of upper core assembly 160 will engage the interface 134 on the corresponding side of the lower core assembly 130. Similarly, the interface 164 on the opposite side of upper core assembly 160 will engage the interface 134 on the corresponding side of the lower core assembly 130. Having each spacer 176 on the upper core assembly 160 engage a corresponding spacer 146 on the lower core assembly 130 maintains a desired physical and electric/magnetic spacing between the upper core assembly 160 and the lower core assembly 130 (e.g., a spacing within a range of about 0.14 inches to about 0.26 inches at the corresponding interfaces 134/164, although other spacings may be appropriate).

FIGS. 8A and 8B present additional views of the lower core assembly 130 and the electronics 200. The electronics 200 includes a printed circuit, control board, or controller 214, a second electrical switch 206 (e.g., a contactor, bypass switch, or contact relay), a first electrical switch 204 (e.g., an SCR), an MOV (metal oxide varistor) 230, and a fault protection system 220 (again, these components are located within the electronics compartment 84 of the lower housing section 80, and are isolated from the core assembly 50 by the barrier or partition 82). A separate antenna cable 62 is also located within the electronics compartment 84 and extends from the controller 214 to each of the two antennas 100 for the DSR 30. The first electrical switch 204 (e.g., SCR) and the fault protection system 220 are utilized by the DSR 30 in fault current or surge conditions encountered in the power line 16 on which the DSR 30 is mounted. The MOV 230 is used by the DSR 30 for lightning protection. The controller 214 controls operation of the second electrical switch 206 (e.g., contactor), which in turn establishes the mode of the core assembly 50. The core assembly 50 may be disposed in either of first or second modes. In the second or injection mode, the core assembly 50 injects reactance into the power line 16 on which the DSR 30 is mounted (inductance for the illustrated configuration of the DSR 30, although the DSR 30 may be configured to instead inject capacitance as noted above). In the first or non-injection mode, the core assembly 50 injects little or no reactance into the power line 16 on which the DSR 30 is mounted.

Figure 9:
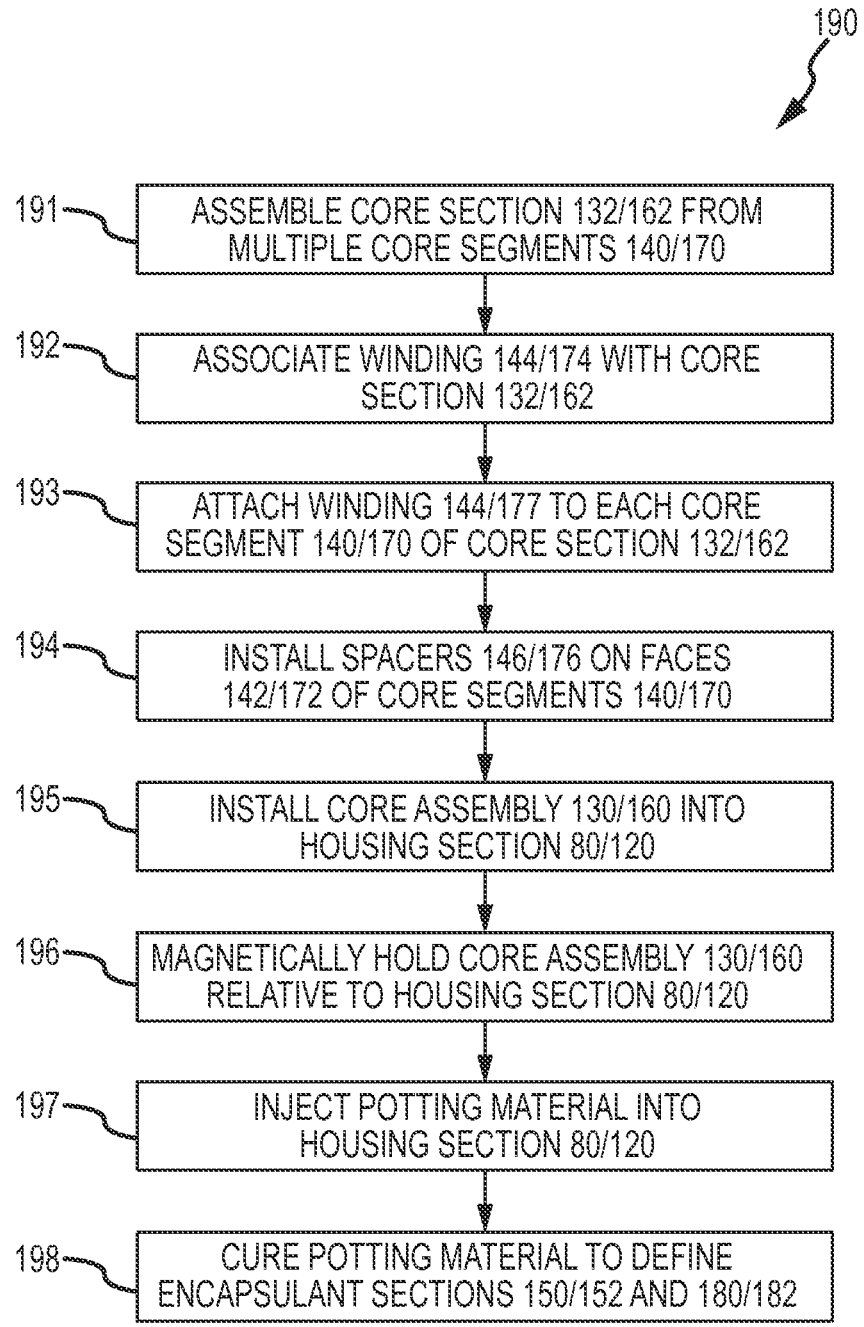
FIG. 9 is one embodiment of a protocol for assembling the reactance module of FIGS. 2A/2B.

One embodiment of a protocol for assembling the above-described DSR 30 is presented in FIG. 9 and is identified by reference 190. The protocol 190 is applicable to assembling the lower core assembly 130 within the lower housing section 80, as well as to assembling the upper core assembly 160 within the upper housing section 120 (including simultaneously (e.g., using different machine sets) or sequentially (e.g., using a common machine set). Hereafter, the protocol 190 will be described with regard to assembling the lower core assembly 130 within the lower housing section 80.

The lower core section 132 may be assembled by disposing the first core segments 140 in alignment (step 191). The ends of adjacent first core segments 140 may be disposed in abutting relation, or a small space may exist between each adjacent pair of first core segments 140. In one embodiment, the various first core segments 140 are positioned within an appropriate jig for purposes of step 191 of the protocol 190.

The first winding 144 may be associated with the assembled first core section 132 pursuant to step 192 of the protocol 190. The first winding 144 may be created/defined "off the first core section 132", and then separately positioned on the first core section 132 (so as to extend between its ends 136) for purposes of step 192. Another option would be to wind wire on the assembled first core section 132 (around its ends 136) to create/define the first winding 144 for purposes of step 192 of the protocol 190. In any case, the first winding 144 may be attached to the first core section 132 in any appropriate manner, for instance using an epoxy (step 193). In one embodiment, the first winding 144 is separately attached to each of the individual first core segments 140 that collectively define the first core section 132.

Spacers 146 may be installed on the various faces 142 of the first core segments 140 that collectively define the first core section 132 (step 194). Steps 192-194 may be executed in any appropriate order (e.g., step 194 could be executed prior to or after step 192). In one embodiment, a separate spacer 146 is provided for each face 142 of each first core segment 140. Any appropriate adhesive and/or bonding technique may be used to attach the spacers 146 to the corresponding first core segment 140 (more specifically, to one of its faces 142).

The first core assembly 130 is positioned within the first housing section 80 (step 195). The lower core assembly 130 is magnetically held relative to the lower housing section 80 (step 196). An appropriate jig may be used for purposes of step 196. Step 196 may entail using one or more magnets to maintain the various faces 142 (of the lower core segments 140 that collectively define the lower core section 132) in at least substantially coplanar relation (e.g., to dispose the faces 142 in a common reference plane), to maintain a desired spacing between the lower core assembly 130 and the interior of the lower housing section 80 in a desired spaced relation (e.g., the partition 82), or both. In one embodiment, each face 142 of each lower core segment 140 is positioned against a flat or planar surface of a corresponding magnet (e.g., a separate magnet may be provided for each lower core segment 140). Thereafter, a potting material (e.g., Sylgard®) is injected to encapsulate all but the upper surfaces of the spacers 146 of the lower core assembly 130 within the lower housing section 80 (step 197), and this potting material is allowed to cure in any appropriate manner to define the encapsulating sections 150, 152 discussed above (step 198).

Figure 10:
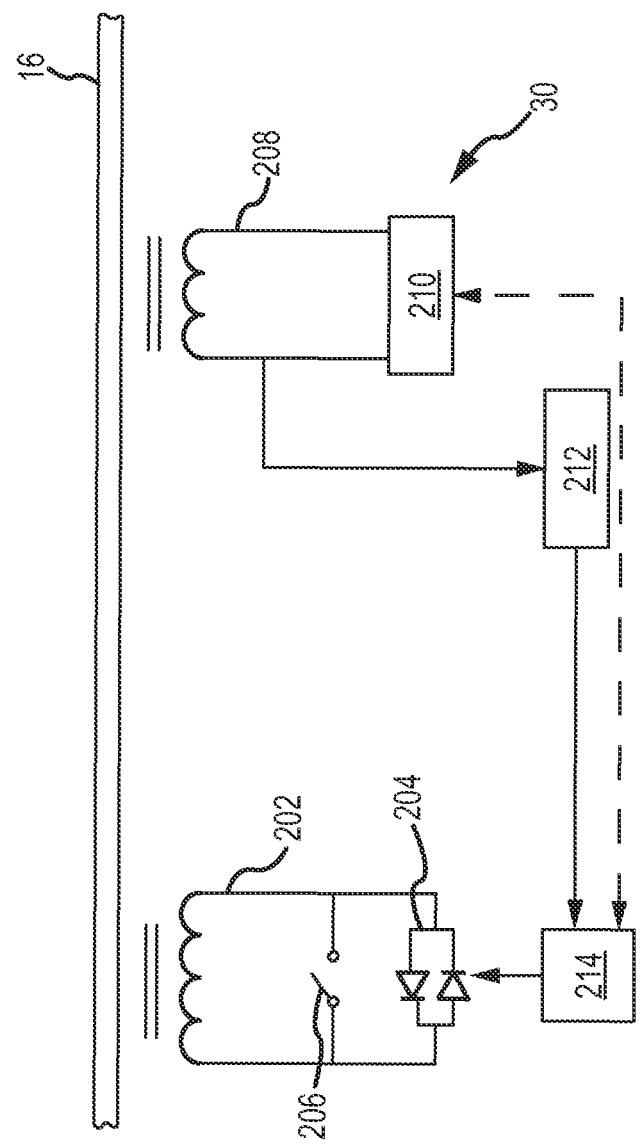
FIG. 10 is an electrical block diagram for an embodiment of the reactance module of FIGS. 2A/2B.

A representative electrical block diagram of the DSR 30 is presented in FIG. 10. The DSR 30 may be characterized as including a first device 202 (e.g., a transformer that includes the core assembly 50 of the DSR 30), the above-noted first electrical switch 204 (e.g., an SCR), the above-noted second electrical switch 206 (e.g., a contact relay), a current transformer 208, a power supply 210, a current monitor 212, and the above-noted controller 214. Again, the DSR 30 may be mounted on a power line 16 such that reactance may be injected into the power line 16. The first device 202 may be in the form of (or part of) a reactance injecting circuit, for instance a single turn transformer. The first device 202 may be disposable in each of first and second modes. For example, switching the first device 202 from the first mode to the second mode may increase the injected reactance being input to the power line 16 when the DSR 30 is mounted on the power line 16. The first device 202 may be operably connected to the controller 214 via the first electrical switch 204 (e.g., SCR) and/or the second electrical switch 206 (e.g., a contact relay). In other words, the first device 202 may be operably connected with the first electrical switch 204, the second electrical switch 206, and/or the controller 214.

In one embodiment, the first electrical switch 204 (e.g., an SCR) may be a solid-state semiconductor device, for instance a thyristor pair. The first electrical switch 204 may be operably connected to the first device 202 and/or the controller 214. In this regard, the first electrical switch 204 may be operable to control the injection of reactance into the power line 16. For example and when the first electrical switch 204 is closed, a minimum level of reactance, corresponding to the first device 202 leakage reactance, is injected into power line 16. In another example and when the first electrical switch 204 is open and the second electrical switch 206 (e.g., a contact relay) is open, reactance is injected into power line 16. As will be discussed in more detail below, the first electrical switch 204 also may be operable to pass an overcurrent.

The controller 214 may be any computerized device (e.g., a microcontroller) that is operable to manage the operation of multiple devices and/or communicate with multiple devices in order to implement one or more control objectives. For example, the controller 214 may be operable to switch the first device 202 from the first mode to the second mode and/or communicate with any device of the DSR 30. In this regard, the controller 214 may be operably connected to the first electrical switch 204 (e.g., an SCR), the second electrical switch 206 (e.g., a contact relay), the first device 202, the current monitor 212, and/or the power supply 210. The controller 214 may switch the first device 202 from the first mode to the second mode via the second electrical switch 206. The first mode for the DSR 30 may be characterized as a bypass mode and the second mode for the DSR 30 may be characterized as an injection mode. When the second electrical switch 206 is closed (i.e., is conducting), the first device 202 is in bypass mode (e.g., the first device 202 is shorted) and little or no reactance is injected into the power line 16 via the DSR 30. When the second electrical switch 206 is open (such that the first device 202 is not shorted) the first device 202 is in injection mode where reactance is injected into the power line 16. At this time and if the DSR 30 incorporates the first electrical switch 204, the first electrical switch 204 should also be open (along with the second electrical switch 206, and again such that the first device 202 is not shorted) such that the first device 202 is in injection mode where reactance is injected into the power line 16.

The controller 214 may switch the first device 202 from bypass mode to injection mode when the current monitor 212 determines that a current of the power line 16 satisfies a predetermined threshold. For example, the current monitor 212 may be operable to measure the current on the power line 16 (at the DSR 30) and communicate the measured current to the controller 214. If the measured current satisfies the predetermined threshold (e.g., if the current is greater than the threshold, or is equal to or greater than the threshold, as the case may be), the controller 214 may switch the first device 202 from bypass mode to injection mode by opening the second electrical switch 206 (e.g., contact relay) such that reactance is injected into the power line 16. Similarly, if the measured current thereafter no longer satisfies the predetermined threshold (e.g., if the measured current drops below the predetermined threshold), the controller 214 may switch the first device 202 from injection mode back to bypass mode by closing the second electrical switch 206 such that the first device 202 is shorted and such that no substantial reactance is injected into the power line 16. As such, the controller 214 may be operable to switch the first device 202 between the bypass and injection modes.

The current monitor 212 may measure the current on the power line 16 via the current transformer 208. In this regard, the current transformer 208 may be mounted on the power line 16 and may be a separate component from the first device 202. In one embodiment, the current transformer 208 may be operable to produce a reduced current that is proportional to the current of the power line 16 such that the current may be processed and/or measured by a measuring device (e.g., the current monitor 212) and/or the current may provide power to electronic components (e.g., the power supply 210). The power supply 210 may be operably connected with the current transformer 208 and/or the controller 214. In this regard, the power supply 210 may receive power from the current transformer 208 and provide power to the controller 214.

The DSR 30 may be mounted on the power line 16 such that an injected reactance may be input to the power line 16. In one embodiment, the injected reactance may be an inductive reactance (e.g., inductance). For example, when inductance is injected into the power line 16, the flow of current in the power line 16 may be reduced and diverted to underutilized power lines in interconnected and/or meshed power networks. In another embodiment, the injected reactance may be a capacitive reactance (e.g., capacitance). For example, when capacitance is injected into the power line 16, the flow of current in the power line 16 may be increased and diverted from power lines in interconnected and/or meshed power networks.

Figure 11A:
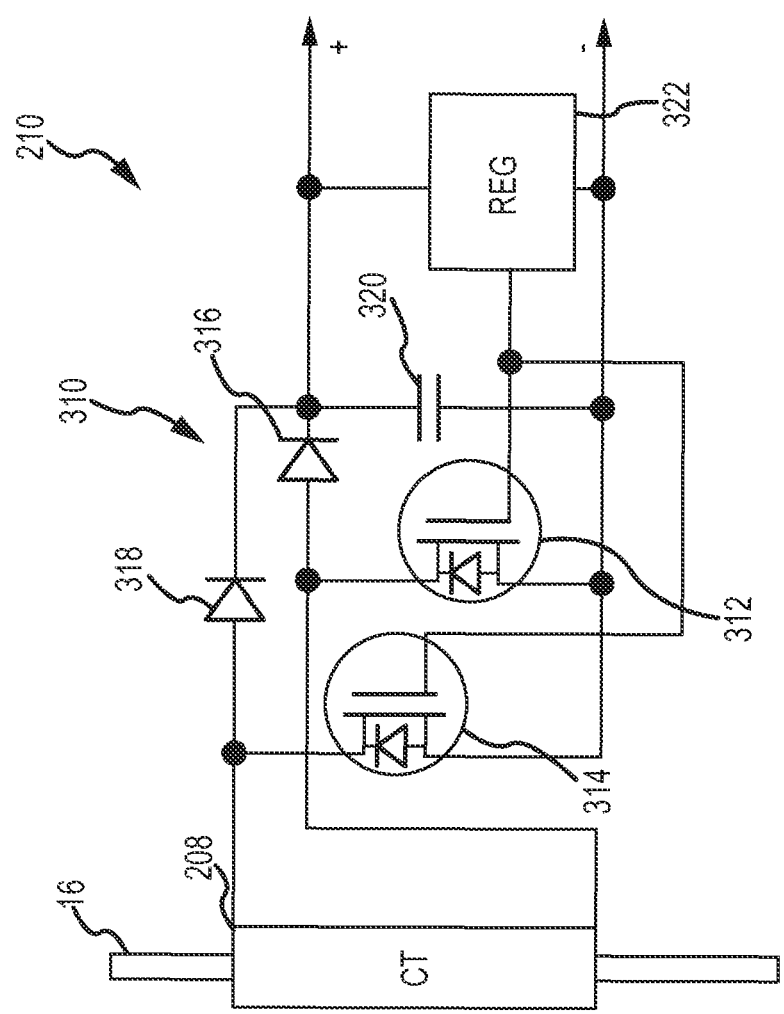
FIG. 11A is a schematic of an embodiment of a power supply from the electrical block diagram of FIG. 10.

FIG. 11A illustrates one embodiment that may be used as the power supply 210 for the DSR 30 addressed above in relation to FIG. 10. The power supply 210 of FIG. 11A includes a bridgeless power factor correction circuit or a bridgeless PFC 310 and a regulator 322. As discussed above, the power supply 210 may receive power from the current transformer 208 (where the power line 16 is the primary of the current transformer 208), and the current transformer 208 may be operable to produce a reduced current that is proportional to the current on the power line 16 such that the current transformer 208 may provide power to the power supply 210. In one embodiment, the current of the power line 16 may be characterized as a first current and the reduced current provided by the current transformer 208 may be characterized as a second current. In this regard, the current transformer 208 receives the first current and outputs the second current, the second current is different than the first current, and the second current is proportional to the first current.

The second current may be based at least on the number of turns of a secondary winding (not illustrated) of the current transformer 208. For example, the secondary winding of the current transformer 208 may comprise 100 turns. In this example, the second current would be 1/100 of the first current (i.e., the first current is 100 times the second current). The current transformer 208 may be configured to provide any desired reduction of the current on the power line 16.

The bridgeless PFC 310 includes the current transformer 208, a first controllable switch 312, a second controllable switch 314, a first rectifier 316, a second rectifier 318, and a capacitor 320. The first rectifier 316 may be operably connected to the first controllable switch 312 and the second rectifier 318 may be operably connected to the second controllable switch 314. In this regard, the operation of the first and second rectifiers 316, 318 may be dependent on the operation of the first and second controllable switches 312, 314, respectively. For example, the first and second rectifiers 316, 318 may output a current to the capacitor 320 based on the state of the first and second controllable switches 312, 314, respectively. The first and second rectifiers 316, 318 may be any silicon-based semiconductor switch (e.g., diodes). The first and second controllable switches 312, 314 may be any semiconductor transistors (e.g., MOSFETs). The first and second controllable switches 312, 314 also may be operably connected to the regulator 322. In this regard, the regulator 322 may be configured to switch each of the first and second controllable switches 312, 314 between a conducting state and a non-conducting state.

As discussed above in relation to FIG. 10, the power supply 210 may provide power to the controller 214 of the DSR 30. The power supply 210 may be operable to output a regulated voltage (e.g., a 24 VDC output) to the controller 214. When the regulated voltage satisfies a predetermined threshold (e.g., if the regulated voltage is greater than the threshold, or is equal to or greater than the threshold), the regulator 322 may switch the first and second controllable switches 312, 314 to the conducting state. In one embodiment, the predetermined threshold may be within a range from about 23.9V to about 24.1V. This predetermined threshold may be a standard design power supply voltage for the system. When the first and second controllable switches 312, 314 are in the conducting state, the output current from the first and second rectifiers 316, 318 may be shunted. For example, the second current received from the current transformer 208 may flow through the first and second controllable switches 312, 314 such that the power supply 210 is shorted and no or very little current flows through the first and second rectifiers 316, 318. As discussed above, the capacitor 320 may receive current from the first and second rectifiers 316, 318. As such, when the output current from the first and second rectifiers 316, 318 is shunted, the capacitor 320 may begin to discharge.

When the regulated voltage no longer satisfies the predetermined threshold (e.g., if the regulated voltage drops below the predetermined threshold), the regulator 322 switches the first and second controllable switches 312, 314 to the non-conducting state. When the first and second controllable switches 312, 314 are in the non-conducting state, the second current from the current transformer 208 may flow through the first and second rectifiers 316, 318. As such, the capacitor 320 may receive the output current from the first and second rectifiers 316, 318 and may begin to charge. In turn, the output voltage of the power supply 210 is regulated. In one embodiment, the regulator 322 may have an operating frequency substantially higher than the current frequency on the power line 16.

Figure 11B:
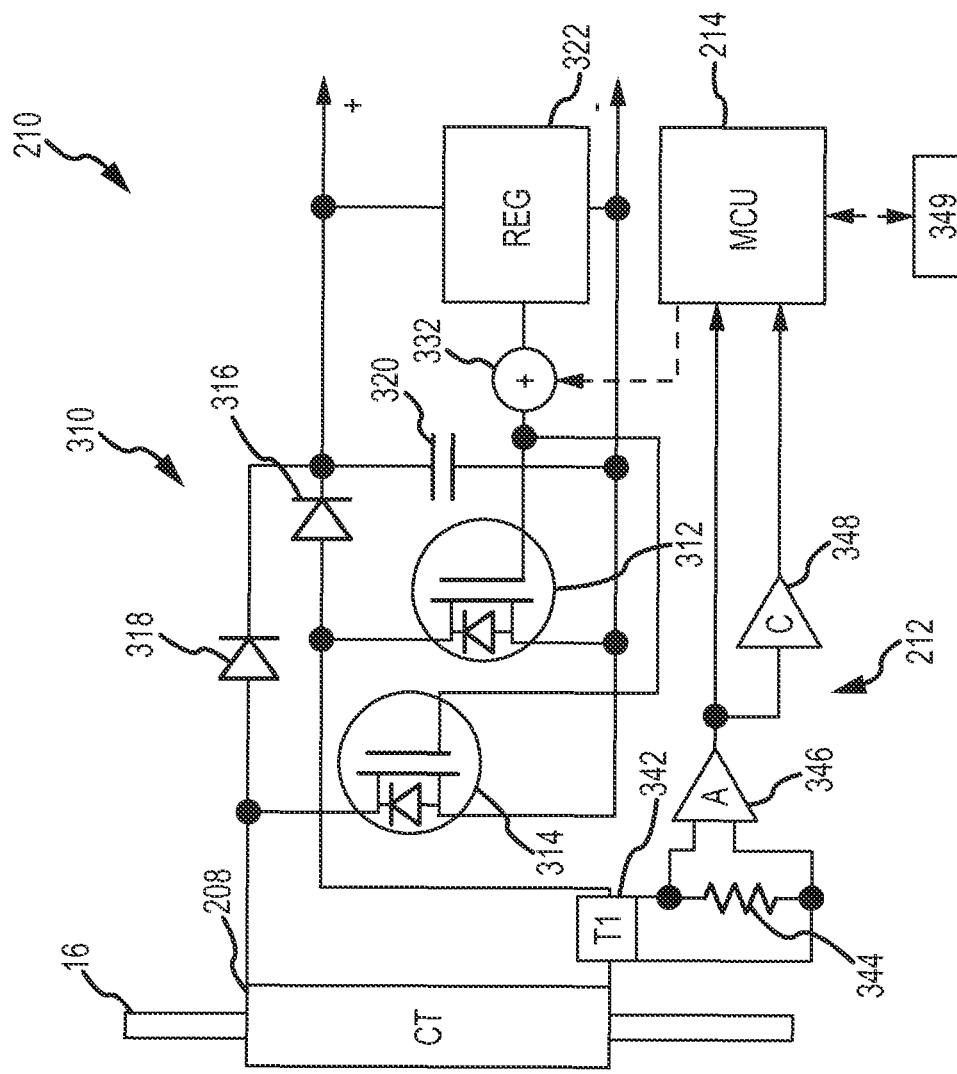
FIG. 11B is a schematic of an embodiment of a power supply and a current monitor from the electrical block diagram of FIG. 10.

As discussed above in relation to FIG. 10, the current monitor 212 may be operable to measure the current on the power line 16 (at the DSR 30) and communicate the measured current to the controller 214. One embodiment that may be used as the current monitor 212 is illustrated in FIG. 11B. The current monitor 212 of FIG. 11B may be operably connected to the current transformer 208, and furthermore may be configured to measure the second current from the current transformer 208. The current transformer 208 may be operable to output the second current to the power supply 210 through the current monitor 212. In this regard, the controller 214 may be configured to switch the current transformer 208 from a first state to a second state. The first state may include the current transformer 208 outputting the second current to the power supply 210. When the current transformer 208 is in the first state, the power supply 210 outputs the regulated voltage. The second state may include a measurement of the second current via the current monitor 212. When the current transformer 208 is in the second state, the first and second controllable switches 312, 314 are in the conducting state and the power supply 210 is shorted such that the second current flows through the first and second controllable switches 312, 314. Shunting the power supply 210 operation while the current transformer 208 is in the second state may remove any contribution of high-frequency switching noise, or other non-linearity associated with the power supply 210 operation from the measurement of the second current. As a result, the quality and signal-to-noise ratio of the current monitor 212 may be increased.

As illustrated in FIG. 11B, the controller 214 may include a logical summing device 332. The logical summing device 332 may be any simple logic element or programmable logic device such as a programmable logic array and a field-programmable gate array, to name a few. The logical summing device 332 may be configured to output a control signal. When the control signal is active, the current transformer 208 is in the second state and the first and second controllable switches 312, 314 are in the conducting state. This is true even if the regulated voltage no longer satisfies the predetermined threshold. In other words, when the power supply 210 is in normal operation, and the regulated voltage no longer satisfies the predetermined threshold, the first and second controllable switches 312, 314 are switched to the non-conducting state. However, if the control signal from the logical summing device 332 is active, the first and second controllable switches 312, 314 remain in the conducting state, resulting in the absence of influence of control pulses from the regulator 322 on the measurement of the second current. In this regard, the control signal from the logical summing device 332 may facilitate the measurement of the second current via the current monitor 212. When the current monitor 212 measures the second current, the second current may have a signal-to-noise ratio of at least about 48 dB.

The current monitor 212 may include an instrumental current transformer 342, a burden resistor 344, a differential amplifier 346, a comparator 348, and/or an analog-to-digital converter 349. The instrumental current transformer 342 may be operably connected to the current transformer 208 and configured to reduce the second current from the current transformer 208 to a third current. This third current may be less than the second current and proportional to the second current. This third current may be less than the first current (i.e., the current of the power line 16), and is proportional to the first current. The burden resistor 344 may be operably connected to the output of the instrumental current transformer 342 such that a voltage develops on the burden resistor 344. The voltage on the burden resistor 344 is proportional to the third current, and thus to the first and second currents. The differential amplifier 346 may be operably connected to the burden resistor 344 and may be configured to convert and/or amplify the voltage on the burden resistor 344. The analog-to-digital converter 349 may be operably connected to the differential amplifier 346 and the controller 214. As such, the differential amplifier 346 may send the analog-to-digital converter 349 an analog signal representative of the voltage on the burden resistor 344. In turn, the analog-to-digital converter 349 may be configured to convert the analog signal from the differential amplifier 346 into a digital signal from which the controller 214 can determine the current on the power line 16. As will be discussed in more detail below, the comparator 348 may be operably connected to the differential amplifier 346 and the controller 214, and may be configured to send an interrupt signal to the controller 214.

Figure 12A:
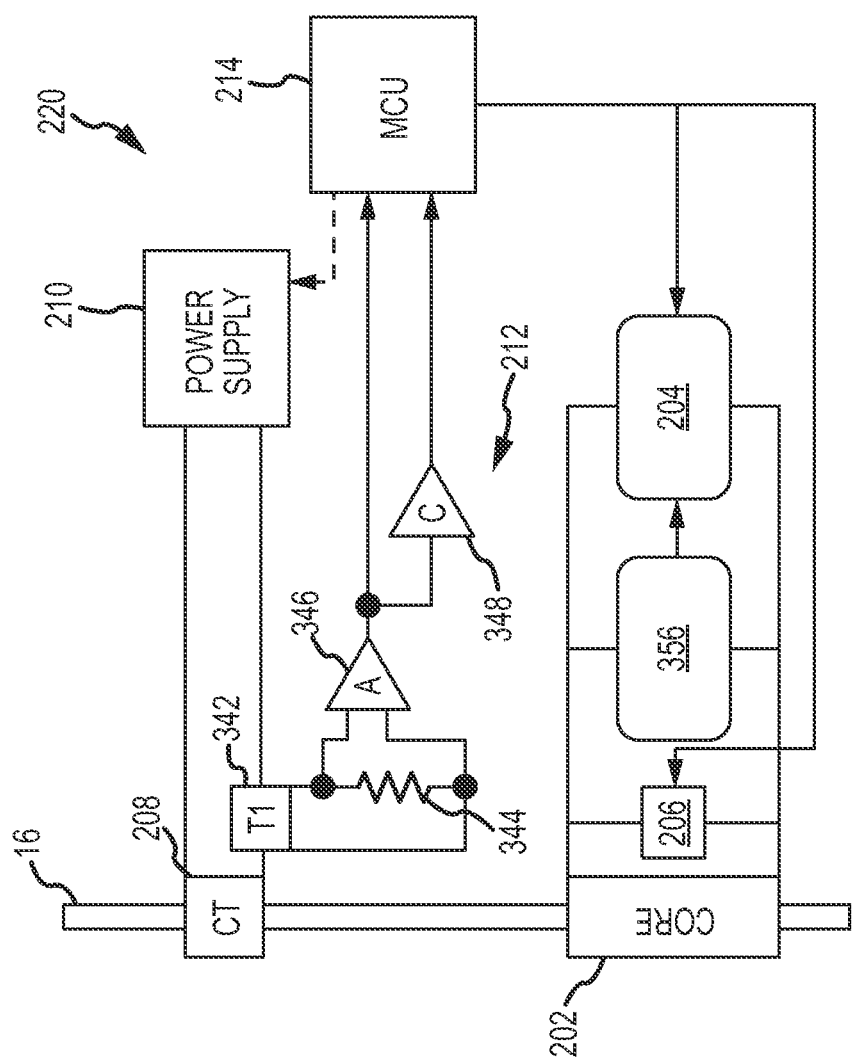
FIG. 12A is a schematic of an embodiment of a fault protection system for the reactance module of FIGS. 2A/2B.

FIG. 12A illustrates one embodiment for the above-noted fault protection system 220 of the DSR 30. The fault protection system 220 includes the power supply 210 (FIGS. 10 and 11A), the current monitor 212 (FIGS. 10 and 11B), a voltage detection circuit 356, the first device 202 (e.g., a transformer that uses the core assembly 50) addressed above (FIG. 10), and the first electrical switch 204 (e.g., an SCR; FIG. 10). The fault protection system 220 may include a plurality of different bypass sequences that are separately executable. The plurality of different bypass sequences may be executed to activate the first electrical switch 204 to short the first device 202. As discussed above, the first electrical switch 204 may be operable to pass an overcurrent. When the first electrical switch 204 is activated, the first electrical switch 204 may pass the overcurrent. In this regard, the plurality of different bypass sequences may be separately executed to protect the DSR 30 from overcurrent and/or fault conditions. The plurality of different bypass sequences may include first, second, and third bypass sequences.

The first bypass sequence may include the controller 214 activating the first electrical switch 204 (e.g., an SCR) to short the first device 202 (e.g., a transformer that uses the core assembly 50) based upon the controller 214 determining that an output from the current monitor 212 satisfies a first predetermined threshold (e.g., if the output is greater than the threshold, or is equal to or greater than the threshold). For example and as discussed above, the current monitor 212 may include/utilize one or more of the differential amplifier 346, the analog-to-digital converter 349, and the controller 214. As such, the output from the differential amplifier 346 may be an analog signal (e.g., a voltage signal) that gets sent to the analog-to-digital converter 349, where it is converted and sent to the controller 214 which determines if the analog signal satisfies the first predetermined threshold. In this case, if the first predetermined threshold is satisfied, the controller 214 may activate the first electrical switch 204 to short the first device 202.

The second bypass sequence may include the comparator 348 sending a communication (e.g., an interrupt signal) to the controller 214, indicating that the output from the current monitor 212 satisfies a second predetermined threshold. For example and as discussed above, the comparator 348 may be operably connected with the differential amplifier 346 and the controller 214. As such, the output from the current monitor 212 may be the analog signal from the differential amplifier 346. The comparator 348 may receive the analog signal (e.g., a voltage signal) at its input, and determine if the voltage signal satisfies the second predetermined threshold. If the voltage signal satisfies the second predetermined threshold, the comparator 348 may send the interrupt signal to the controller 214. In this case, the controller 214 may activate the first electrical switch 204 (e.g., an SCR) to short the first device 202 (e.g., a transformer that uses the core assembly 50), in response to receiving the interrupt signal from the comparator 348. In other words, the interrupt signal may prompt the controller 214 to activate the first electrical switch 204. In order to activate the first electrical switch 204, the controller 214 may send a series of electrical pulses to the first electrical switch 204 such that the first electrical switch 204 begins conducting.

The output of the differential amplifier 346, i.e., the analog signal, may be representative of the current on the power line 16. For example, when the analog signal satisfies the first predetermined threshold, this may indicate that the current on the power line 16 is at least about 1100 Amps. In another example, when the analog signal satisfies the second-predetermined threshold, this may indicate that the current on the power line 16 is at least about 1800 Amps. In other examples, the first and second predetermined thresholds may be selected based on specific applications of the fault protection system 220 of the DSR 30 relative to a given installation. The first and second predetermined thresholds may be selected to be above expected normal operating current limits on the power line 16. In other words, the first and second predetermined thresholds may be any value suitable to enable execution of the first and second bypass sequences to protect the DSR 30 from overcurrent and/or fault conditions.

The third bypass sequence may include the voltage detection circuit 356 (e.g., a crowbar circuit) activating the first electrical switch 204 (e.g., an SCR) to short the first device 202 when a detected voltage satisfies a third predetermined threshold. The detected voltage may be a voltage of the first device 202. For example and as discussed above, the first device 202 may be a single turn transformer including windings 144, 174 on the core assembly 50 (e.g., the secondary of a single turn transformer). As such, the detected voltage may be a voltage present on the secondary windings 144, 174 of the core assembly 50. In one embodiment, the third predetermined threshold may be at least about 1800 volts. The third predetermined threshold may be selected based on specific applications of the fault protection system 220 of the DSR 30 relative to a given installation. The third predetermined threshold may be selected based on the operational limits of the electronic components within the fault protection system 220 of the DSR 30 and/or the number of secondary windings 144, 174 of the core assembly 50. In other words, the third predetermined threshold may be any value suitable to enable execution of the third bypass sequence to protect the DSR 30 from overcurrent and/or fault conditions.

A secondary function of the fault protection system 220 may include protection of the second electrical switch 206 addressed above (e.g., a contact relay; FIG. 10). The second electrical switch 206 may be operably connected to the controller 214 and the first device 202. The controller 214 may be configured to switch the second electrical switch 206 between an open position and a closed position in order to switch the DSR 30 between bypass and injection modes of operation as discussed above. During such a change of position, the second electric switch 206 may be vulnerable to damage from electric arc and/or excessive currents through its contact surfaces. This damage may be minimized by externally shunting the contacts of the second electrical switch 206 during any such change of position, where the duration of the change of position may be within a range from about one millisecond to about one second. The secondary function of the fault protection system 220 may be activated by the controller 214 issuing a series of electrical pulses to the first electric switch 204 during the period when the second electric switch 206 is changing positions. In turn, the first electrical switch 204 may enter a conducting state, thereby shunting the contacts of the second electric switch 206.

For the same purpose, when the first electrical switch 204 is activated (e.g., when any of the first, second, or third bypass sequences is executed), the second electrical switch 206 remains in either the open position or the closed position. For example, if the second electrical switch 206 is in the open position (e.g., the DSR 30 is in injection mode) when the first electrical switch 204 (e.g., an SCR) is activated, the second electrical switch 206 remains in the open position during the execution of any of the first, second, or third bypass sequences. In another example, if the second electrical switch 206 is in the closed position (e.g., the DSR 30 is in bypass mode) when the first electrical switch 204 is activated, the second electrical switch 206 remains in the closed position during the execution of any of the first, second, or third bypass sequences.

The first bypass sequence may have a first response time, the second bypass sequence may have a second response time, and the third bypass sequence may have a third response time. The first response time may be the amount of time it takes for the controller 214 to determine that the output from the current monitor 212 satisfies the first predetermined threshold. For example, the analog-to-digital converter 349 may receive the output from the current monitor 212 while the controller 214 is performing another function, which may result in a first response time. In another example, the controller 214 may process the output from the current monitor 212 immediately upon receiving it, which may result in a first response time that is different than the first response time in the first example. The second response time may be the amount of time it takes for the comparator 348 to determine that the output from the differential amplifier 346 satisfies the second predetermined threshold. The third response time may be the amount of time it takes for the voltage detection circuit 356 to determine that the detected voltage satisfies the third predetermined threshold.

The first response time may be faster than the second response time and the third response time, and the second response time may be faster than the third response time. For example, the controller 214 may determine that the output from the current monitor 212 satisfies the first predetermined threshold before the comparator 348 determines that the output from the differential amplifier 346 satisfies the second predetermined threshold and before the voltage detection circuit 356 determines that the detected voltage satisfies the third predetermined threshold. As another example, the comparator 348 may determine that the output from the differential amplifier 346 satisfies the second predetermined threshold before the voltage detection circuit 356 determines that the detected voltage satisfies the third predetermined threshold. The second response time may be faster than the first response time and the third response time. For example, the comparator 348 may determine that the output from the differential amplifier 346 satisfies the second predetermined threshold before the controller 214 determines that the output from the current monitor 212 satisfies the first predetermined threshold and before the voltage detection circuit 356 determines that the detected voltage satisfies the third predetermined threshold. The third response time may be faster than the first response time and the second response time. For example, the voltage detection circuit 356 may determine that the detected voltage satisfies the third predetermined threshold before either the controller 214 or the comparator 348 determine that the output from the current monitor 212 satisfies the first or the second predetermined thresholds.

If the first bypass sequence is executed, the second and third bypass sequences may not be executed. Similarly, the second bypass sequence may be executed if the first bypass sequence is not executed. The first bypass sequence may not be executed when the output from the current monitor 212 is not processed by the controller 214 and/or if the second response time is faster than the first response time. The third bypass sequence may be executed if the first and second bypass sequences are not executed and/or if the third response time is faster than the first and second response times.

Figure 12B:
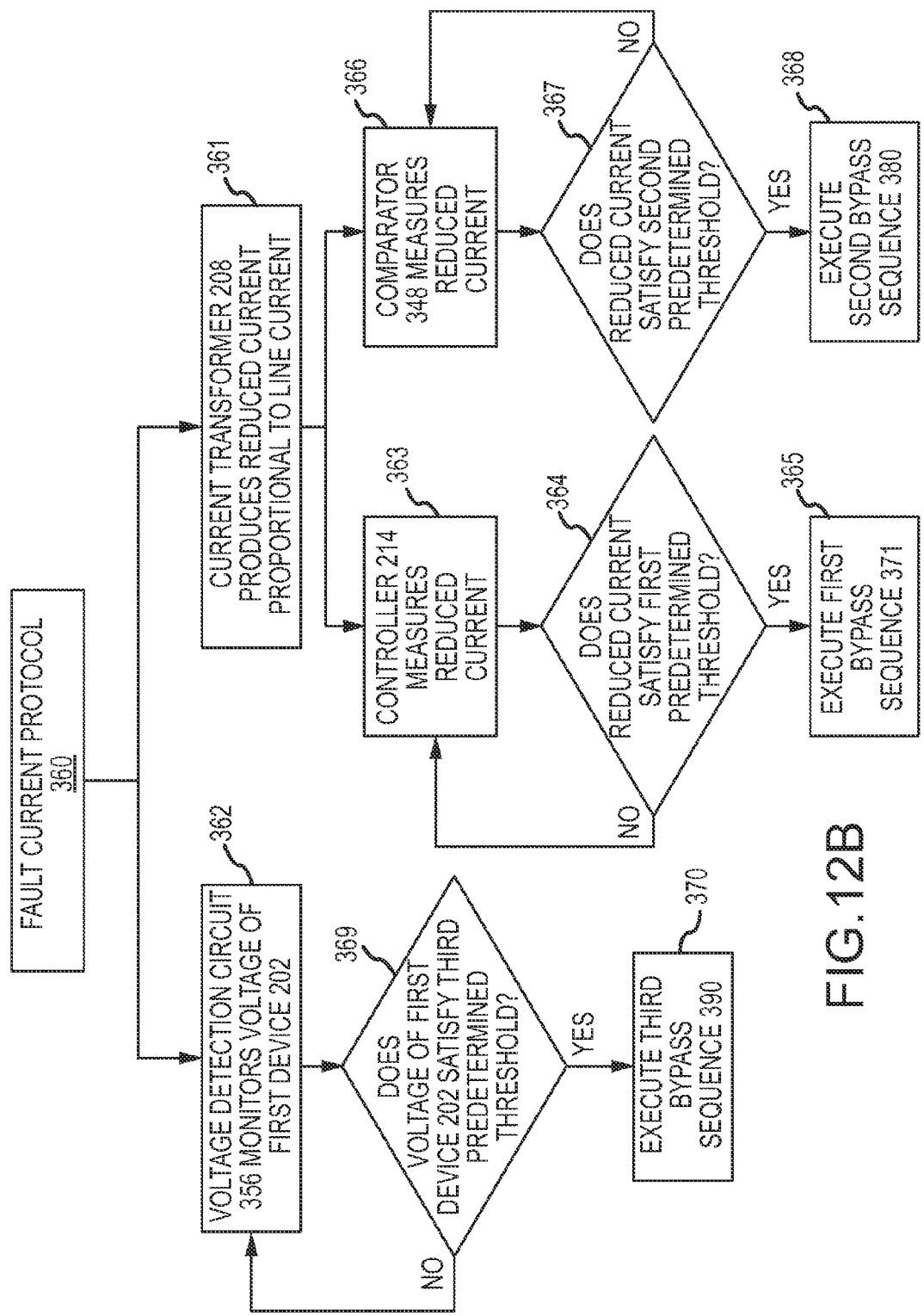
FIG. 12B is an embodiment of a fault current protocol that may be used by the fault protection system of FIG. 12A to execute a plurality of bypass sequences.

One embodiment of a protocol for protecting the DSR 30 is presented in FIG. 12B and is identified by reference numeral 360. The protocol 360 generally includes the steps for detecting a fault current and executing a plurality of different bypass sequences to protect the DSR 30 from damage. As current flows through the power line 16, the current transformer 208 produces a reduced current that is proportional to the current of the power line 16 (step 361) and the voltage detection circuit 356 monitors the voltage of the first device 202 (step 362). The reduced current produced by the current transformer 208 may be measured by the controller 214 (step 363) or the comparator 348 (step 366). Step 363 includes the controller 214 determining if the reduced current satisfies the first predetermined threshold (step 364). If the reduced current does not satisfy the first predetermined threshold, step 363 is repeated, i.e., the controller 214 continues measuring the reduced current produced by the current transformer 208. If the reduced current does satisfy the first predetermined threshold, the first bypass sequence 371 (FIG. 12C) is executed (step 365).

In step 366 of the protocol 360 of FIG. 12B, the comparator 348 measures the reduced current produced by the current transformer 208. Step 366 includes the comparator 348 determining if the reduced current satisfies the second predetermined threshold (step 367). If the reduced current does not satisfy the second predetermined threshold, step 366 is repeated, i.e., the comparator 348 continues measuring the reduced current produced by the current transformer 208. If the reduced current does satisfy the second predetermined threshold, the second bypass sequence 380 (FIG. 12D) is executed (step 368).

In step 362 of the protocol 360 of FIG. 12B, the voltage detection circuit 356 monitors the voltage of the first device 202. Step 362 includes the voltage detection circuit 356 determining if the voltage of the first device 202 satisfies the third predetermined threshold (step 369). If the voltage does not satisfy the third predetermined threshold, step 362 is repeated, i.e., the voltage detection circuit 356 continues to monitor the voltage of the first device 202. If the voltage does satisfy the third predetermined threshold, the third bypass sequence 390 (FIG. 12E) is executed (step 370).

Figure 12C:
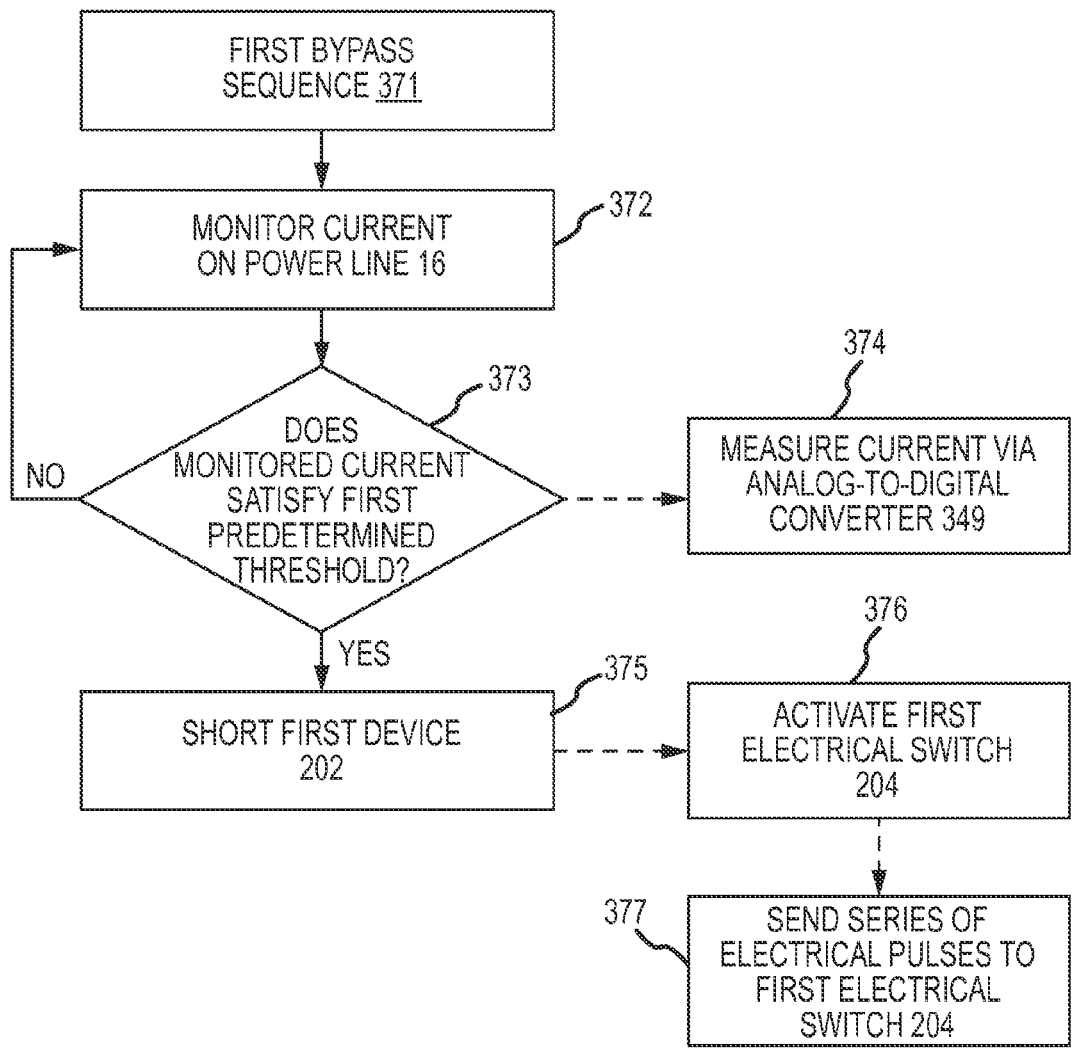
FIG. 12C is a flow chart illustrating one embodiment of a first bypass sequence that may be executed by the fault protection system of FIG. 12A.

With reference now to FIG. 12C, one embodiment of the first bypass sequence 371 is presented. The first bypass sequence 371 may include the steps of monitoring the current of the power line 16 (step 372), assessing whether the line current on the power line 16 satisfies the first predetermined threshold (step 373), and shorting the first device 202 in response to identification of satisfaction of the first predetermined threshold (step 375). Step 373 may include the step of measuring the current via the analog-to-digital converter 349 (step 374). Step 375 may include the step of activating the first electrical switch 204 (step 376). Step 376 may include the step of sending a series of electrical pulses to the first electrical switch 204 such that the first electrical switch 204 begins conducting (step 377).

Figure 12D:
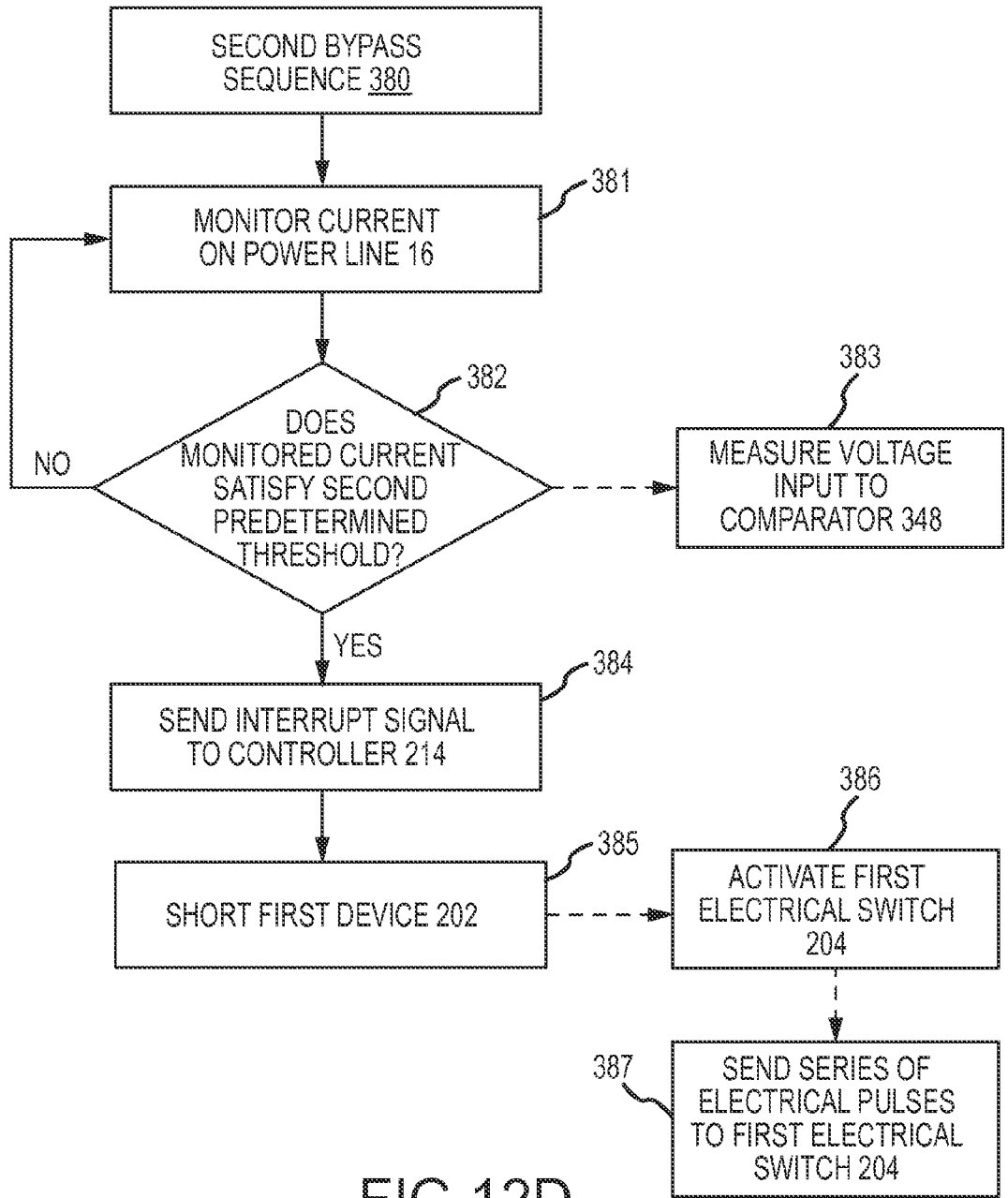
FIG. 12D is a flow chart illustrating one embodiment of a second bypass sequence that may be executed by the fault protection system of FIG. 12A.

FIG. 12D illustrates one embodiment of the second bypass sequence 380. The second bypass sequence 380 may include the steps of monitoring the current of the power line 16 (step 381), assessing whether the line current on the power line 16 satisfies the second predetermined threshold (step 382), sending an interrupt signal to the controller 214 in response to identification of satisfaction of the second predetermined threshold (step 384), and shorting the first device in response to identification of satisfaction of the second predetermined threshold (step 385). Step 382 may include the step of measuring the voltage input to the comparator 348 (step 383). Step 385 may include the step of activating the first electrical switch 204 (step 386). Step 376 may include the step of sending a series of electrical pulses to the first electrical switch 204 such that the first electrical switch 204 begins conducting (step 387).

Figure 12E:
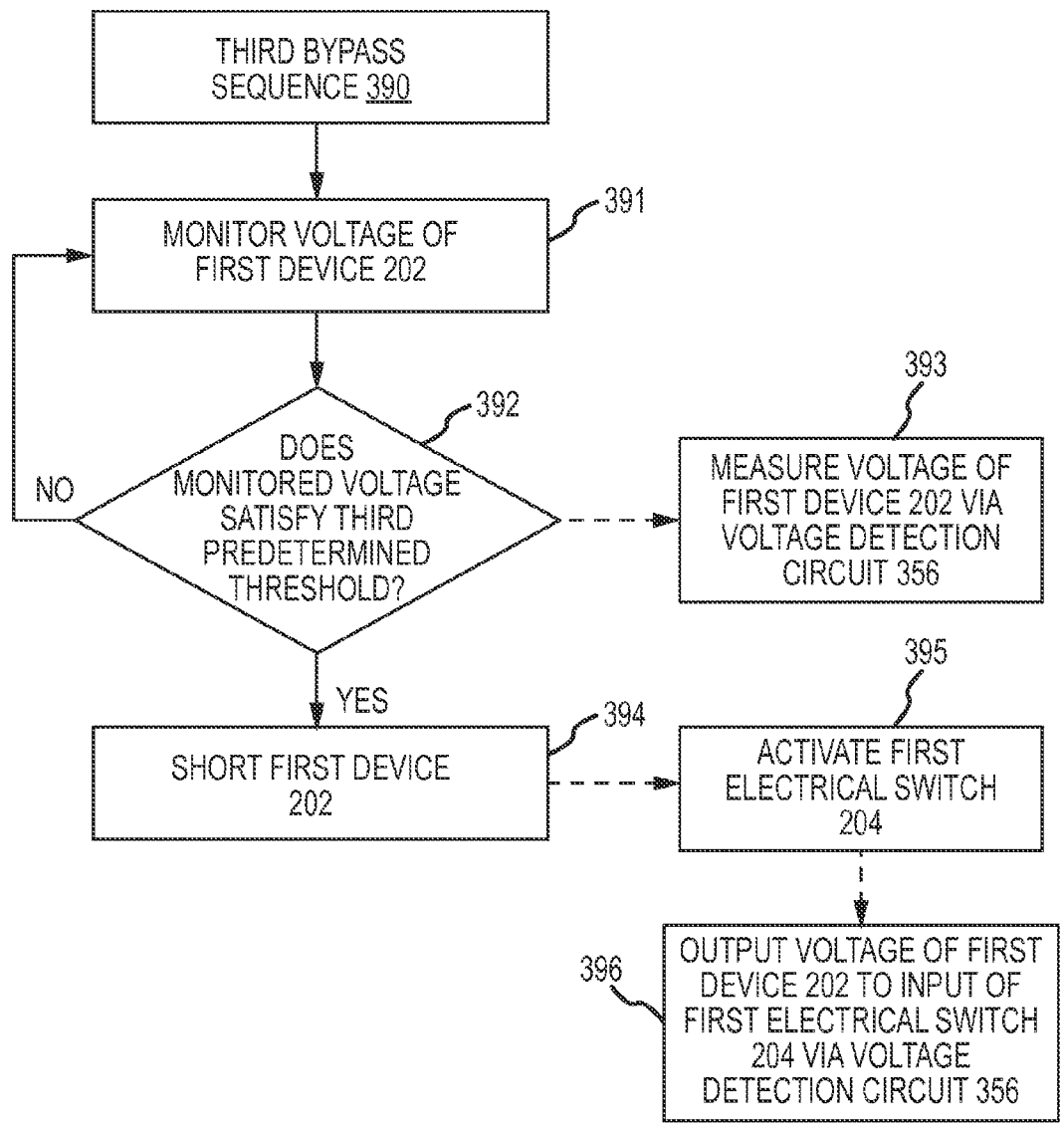
FIG. 12E is a flow chart illustrating one embodiment of a third bypass sequence that may be executed by the fault protection system of FIG. 12A.

With reference now to FIG. 12E, one embodiment of the third bypass sequence 390 is presented. The third bypass sequence 390 may include the steps of monitoring the voltage of the first device 202 (step 391), assessing whether the voltage satisfies the third predetermined threshold (step 392), and shorting the first device 202 in response to identification of satisfaction of the third predetermined threshold (step 394). Step 392 may include the step of measuring the voltage of the first device 202 via the voltage detection circuit 356 (step 393). Step 394 may include the step of activating the first electrical switch 204 (step 395). Step 395 may include the step of outputting the voltage of the first device 202 to the input of the first electrical switch 204 via the voltage detection circuit 356 (step 396). In one embodiment, the second bypass sequence 380 (FIG. 12D) is executed when the first bypass sequence 371 (FIG. 12C) is not executed. The first bypass sequence 371 (FIG. 12C) may not be executed when the current from the power line 16 is not measured by the analog-to-digital converter 349. In one embodiment, the third bypass sequence 390 is executed if neither the first bypass sequence 371 (FIG. 12C) nor the second bypass sequence 380 (FIG. 12D) are executed.

Figure 13A:
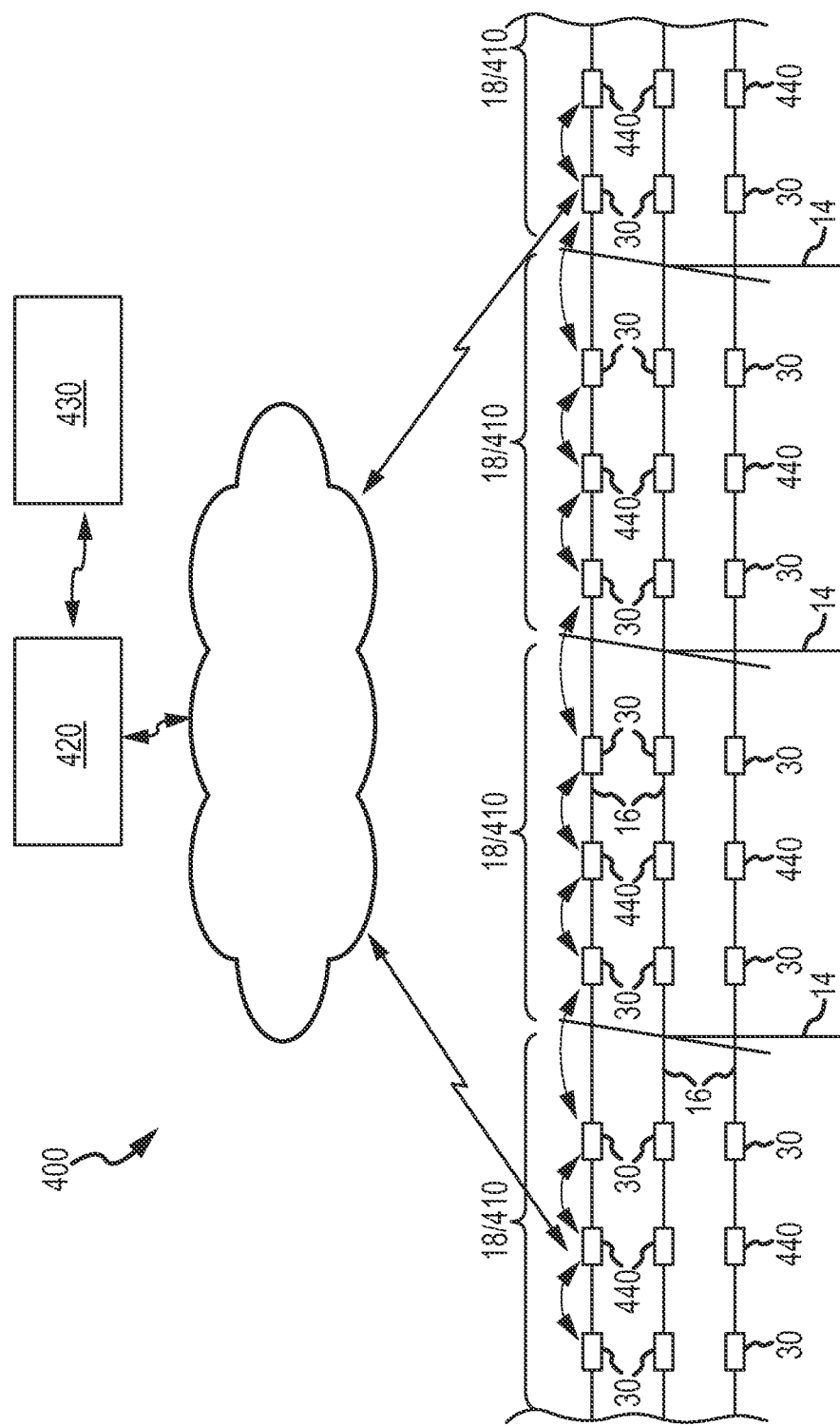
FIG. 13A is a schematic of an embodiment of a power transmission system with distributed control for multiple arrays of reactance modules of the type presented in FIGS. 2A/2B.

FIG. 13A illustrates one embodiment of a power transmission system 400, or more generally a distributed control architecture for use by such a power transmission system. The power transmission system 400 includes at least one power line 16 (three shown in the illustrated embodiment). One or more power lines 16 may be supported by a plurality of towers 14 that are spaced along the length of the power line(s) 16. As in the case of FIG. 1, the power transmission system 400 of FIG. 13A may include one or more electrical power sources 12 (not shown) and one or more electrical loads 22 (not shown).

A plurality of DSRs 30 are installed on a given power line 16—multiple power lines 16 each may have multiple DSRs 30 installed thereon. One or more DSR array controllers 440 may be mounted on each power line 16 that incorporates DSRs 30. Alternatively, a given DSR array controller 440 could be mounted on a tower 14. In any case, each DSR array controller 440 may be associated with a dedicated power line section 18 of the power line 16. A given power line section 18 could have a single DSR array controller 440, or a given power line section 18 could have a primary DSR array controller 400, along with one or more backup DSR array controllers 440.

Any number of DSR array controllers 440 may be associated with a given power line 16. A given power line 16 may be defined by one or more power line sections 18 of the same length, by one or more power line sections 18 of different lengths, or both (e.g., a power line section 18 is not limited to a portion of a given power line 16 that spans between adjacent towers 14 as shown in FIG. 13A; a given power line 16 may be divided up in any appropriate manner into multiple power line sections 18, each of which may have one or more DSR array controllers 440 that are dedicated to such a power line section 18).

One or more DSRs 30 are mounted on each power line section 18 of a given power line 16. Any appropriate number of DSRs 30 may be mounted on each power line section 18. The various DSRs 30 that are mounted on a given power line section 18 define what may be referred to as a DSR array 410. Each DSR array 410 may have one or more DSR array controllers 440 that are dedicated to such a DSR array 410 (e.g., multiple controllers 440 may be used for any given DSR array 410 to provide redundancy). In one embodiment, a given DSR array controller 440 is only associated with one DSR array 410. As such, one or more DSR array controllers 440 and each DSR 30 of their dedicated DSR array 410 may be associated with the same power line section 18. It should be appreciated that DSRs 30 need not be placed along the entire length of a given power line 16 (although such could be the case), and as such there may be a gap between one or more adjacent pairs of power line sections 18 that each have an associated DSR array 410.

Each DSR 30 in a given DSR array 410 only communicates (directly or indirectly) with one or more DSR array controllers 440 that are assigned to the DSR array 410 (e.g., the primary DSR array controller 440 for the DSR array 410 and any redundant or backup DSR array controllers). A given DSR array controller 440 could communicate directly with each DSR 30 in its associated DSR array 410. Another option would be to utilize a relay-type communication architecture, where a DSR array controller 440 could communicate with the adjacent-most DSR 30 on each side of the DSR array controller 440, and where the DSRs 30 could then relay this communication throughout the remainder of the DSR array 410 on the same side of the DSR array controller 440 (e.g., DSRs 30 in a given DSR array 410 could relay a communication, from DSR 30- to -DSR 30, toward and/or away from the associated DSR array controller 440).

DSR array controllers 440 associated with multiple DSR arrays 410 communicate with a common DSR server 420 of the power transmission system 400. Each of these DSR array controllers 440 could communicate directly with this DSR server 420. Alternatively, the DSR server 420 could directly communicate with one or more DSR array controllers 440, and these DSR array controllers 440 could then relay the communication to one or more other DSR array controllers 440 in the power transmission system 400. It should also be appreciated that the power transmission system 400 could incorporate one or more backup DSR servers (not shown), for instance to accommodate a given DSR server 420 going "off-line" for any reason. In any case, the DSR server 420 in turn communicates with what may be characterized a utility-side control system 430. Representative forms of the utility-side control system 430 include without limitation an energy management system (EMS), a supervisory control and data acquisition system (SCADA system), or market management system (MMS).

The power transmission system 400 could utilize any appropriate number of DSR servers 420. A single DSR server 420 could communicate with a given utility-side control system 430. Another option would be to have multiple DSR servers 420 that each communicate with a common utility-side control system 430. The power transmission system 400 could also utilize any appropriate number of utility-side control systems 430, where each utility-side control system 430 communicates with one or more DSR servers 420.

A given DSR server 420 may be characterized as providing an interface between a utility-side control system 430 and a plurality of DSR array controllers 440 for multiple DSR arrays 410. A DSR server 420 may receive a communication from a utility-side control system 430. This communication may be in any appropriate form and of any appropriate type. For instance, this communication could be in the form of a system objective, a command, a request for information, or the like (e.g., to change the inductance on one or more power lines 16 by a stated amount; to limit the current on one or more power lines 16 to a stated amount; to limit the power flow on one or more power lines 16 to a stated amount; to set a temperature limit for one or more power lines 16).

The DSR array controllers 440 may send information on their corresponding power line section 18 to a DSR server 420. The DSR server 420 in this case may consolidate this information and transmit the same to the utility-side control system 430 on any appropriate basis (e.g., using a push-type communication architecture; using a pull-type communication architecture; using a push/pull type communication architecture). The DSR server 420 may also store information received from the various DSR array controllers 440, including information from the DSR array controllers 440 that has been consolidated by the DSR server 420 and at some point in time transmitted to an utility-side control system 430.

Each DSR array controller 440 may be characterized as a "bridge" between a DSR server 420 (and ultimately a utility-side control system 430) and its corresponding DSR array 410. For instance, one communication scheme may be used for communications between a DSR array controller 410 and the DSRs 30 of its DSR array 410, and another communication scheme may be used for communications between this same DSR array controller 410 and the DSR server 420. In this case, a DSR array controller 410 may require two different interfaces—one interface/communication module for communicating with the DSRs 30 of its DSR array 410, and another interface/communication module for communicating with a DSR server 420.

As noted, FIG. 13A may be characterized as a distributed control architecture for a power transmission system (or as a power transmission system with a distributed control architecture). In this regard, consider the case where the utility-side control system 430 sends a communication to a DSR server 420. The DSR server 420 may repackage/translate/reformat this communication, but in any case sends a corresponding communication to one or more DSR array controllers 440. Each such DSR array controller 440 that receives such a communication makes a determination as to the modal configuration for each DSR 30 in its corresponding DSR array 410 (i.e., determines whether a given DSR 30 should be in a first or bypass mode, or whether this DSR 30 should be in a second or injection mode, and this may be undertaken for each DSR 30 in its corresponding DSR array 410). Notably, the communication that is received by the DSR array controller 440 does not itself indicate as to what the modal configuration should be for each DSR 30 in the DSR array 410 for the recipient DSR array controller 440. As such, each DSR array controller 440 must have sufficient intelligence so as to be able to be able to make this determination on its own.

Figure 13B:
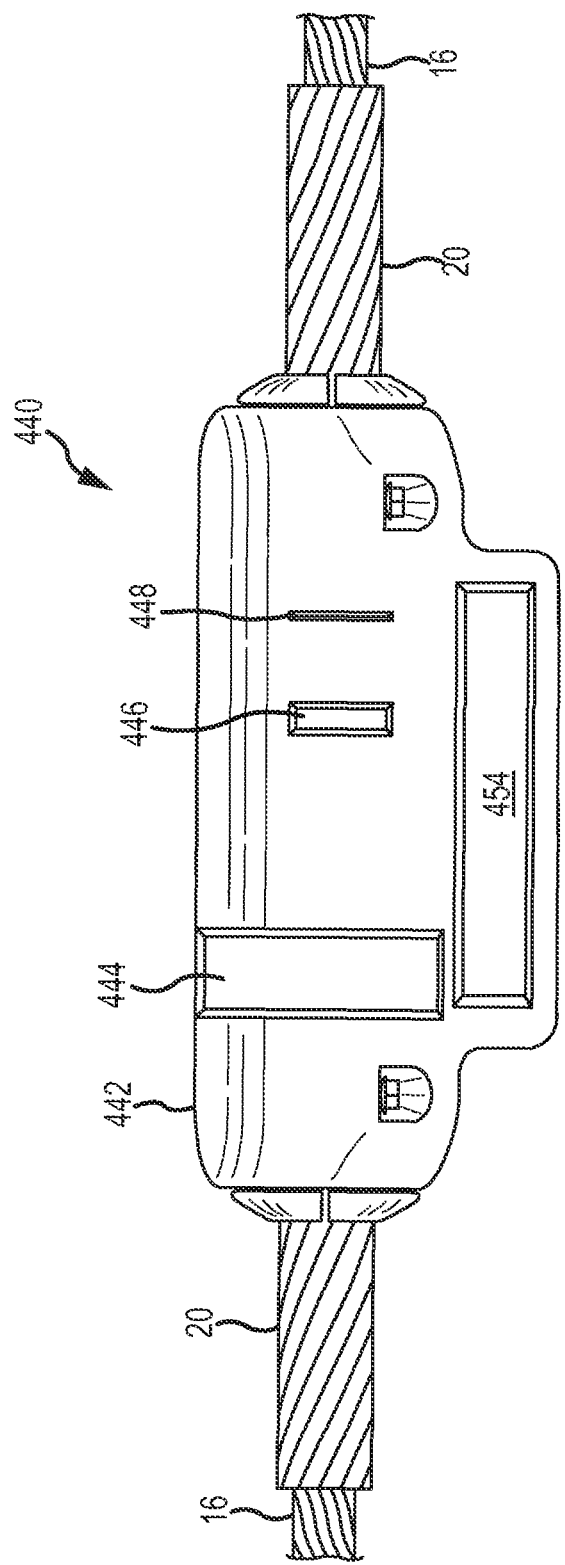
FIG. 13B is a schematic of a reactance module or distributed series reactor (DSR) array controller used to provide distributed control for the power transmission system of FIG. 13A.

FIG. 13B presents a representative configuration for a DSR array controller 440 that may be utilized by the power transmission system 400 of FIG. 13A. The DSR array controller 440 includes a housing 442. Preferably, the housing 442 allows the DSR array controller 440 to be mounted on a power line 16 without having to break the power line 16 (e.g., by using detachably connectable housing sections at least generally of the type discussed above in relation to the DSR 30). Moreover, preferably the housing 442 is configured to reduce the potential for Corona discharges.

The DSR array controller 440 includes a current transformer 444 that is disposed within the housing 442 and that derives power from the power line 16 to power electrical components of the DSR array controller 440. Various sensors may be utilized by the DSR array controller 440, such as a fault current sensor 446 and a temperature sensor 448. Moreover, the DSR array controller 440 utilizes a processing unit 454 (e.g., defined by one or more processors of any appropriate type, and utilizing any appropriate processing architecture).

Figure 13C:
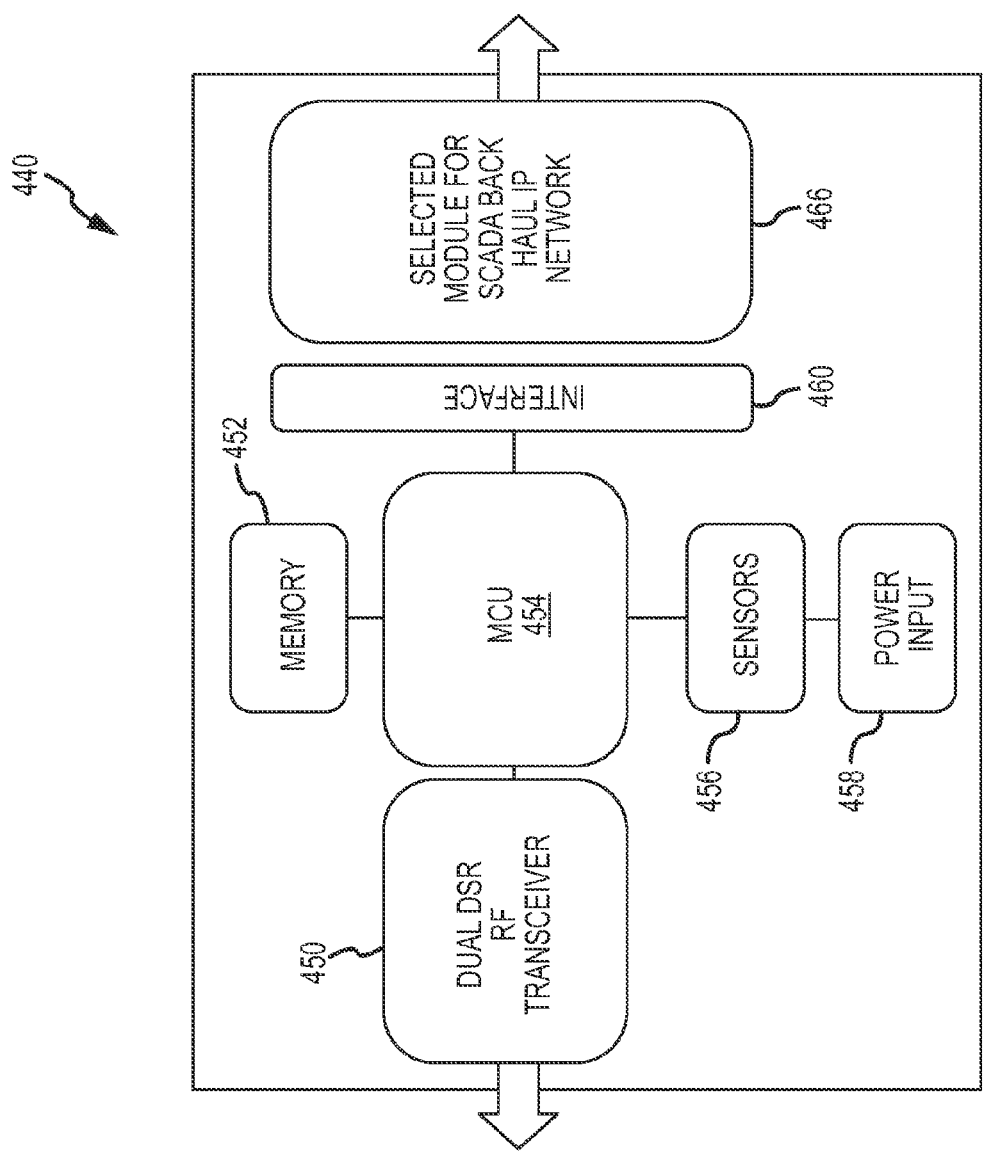
FIG. 13C is an electrical block diagram that may be utilized by DSR array controllers from the power transmission system of FIG. 13A.

FIG. 13C presents a functional schematic that may be implemented by a DSR array controller 440. The DSR array controller 440 includes the above-noted processing unit 454. Memory 452 (e.g., any appropriate computer readable storage medium) may be operatively interconnected with the processing unit 454. The memory 452 may be of any appropriate type or types, and may utilize any appropriate data storage architecture(s). One or more sensors 456 (e.g. the above-noted fault current sensor 446; the above-noted temperature sensor 448) may also be operatively interconnected with the processing unit 454.

One or more antennas 450 may be utilized by the DSR array controller 440 for communicating with the DSRs 30 in its corresponding DSR array 410. Any appropriate type of antenna 450 may be utilized by the DSR array controller 440, including a cavity-backed slot antenna of the type utilized by the DSRs 30. Multiple antennas 450 could also be used to communicate with the DSRs 30 in its corresponding DSR array 410, including where two antennas 450 are incorporated by the DSR array controller 440 in the same manner as discussed above with regard to the DSRs 30 (e.g., an antenna 450 may be provided on each end of the DSR array controller 440). As noted, the DSR array controller 440 may use one communication scheme (e.g., a first communication scheme) for communicating with the DSRs 30 of its DSR array 410.

The DSR array controller 440 also communicates with the utility-side control system 430 through the DSR server 420 in the embodiment of FIG. 13A. In this regard, the DSR array controller 440 may include a communications module 466 of any appropriate type and an interface 460. If the communications module 466 provides for wireless communications with the DSR server 420, the DSR array controller 440 may require one or more antennas of any appropriate type. For example, the communications module may be at least one of an Ethernet adapter, a cellular modem, and a satellite modem, to name a few. In another example, the interface 460 may be part of the processing unit 454 and may include at least one of a SPI bus, UART, and a 12C serial bus, to name a few. In any case, the DSR array controller 440 may use another communication scheme (e.g., a second communication scheme) for communicating with the DSR server 420. In one embodiment, the DSR array controller 440 uses different communication schemes for communications with the DSR array 410 and the DSR server 420. It could be appreciated that a dedicated antenna(s) may be required for communications with the DSRs 30 of the corresponding DSR array 410, and that a dedicated antenna(s) may be required for communications with the DSR server 420. However, it may be possible that a common antenna(s) may be used to communicate with both the DSRs 30 of the corresponding DSR array 410 and with the DSR server 420.

The DSR array controller 440 may also incorporate a power supply 458 of any appropriate type, and that is operatively interconnected with the above-noted current transformer 444 (FIG. 13B). The power supply 458 may receive a current flow from the current transformer 444, and may provide power to one or more of the processing unit 454, the memory 452, the antenna(s) 450, one or more antennas associated with the communication module 466 (for communicating with the DSR server 420), one or more sensors 456, or any combination thereof.

FIG. 13D presents one embodiment of a first data structure 480 (e.g., a lookup table) that may be stored/reside in the memory 452 of a given DSR array controller 440. The first data structure 480 may utilize any appropriate data storage architecture. Generally, for each of a plurality of system contingencies or conditions 482, the first data structure 480 includes a corresponding model configuration for at least one control objective for each DSR 30 associated with the DSR array controller 440. Again, there are two "modal configurations" for the DSRs 30. One modal configuration (e.g., a first modal configuration or first mode) for each DSR 30 is where the DSR is disposed in a non-injection or bypass mode (e.g., where little or no reactance is being injected into the corresponding power line 16 by the DSR 30, or more specifically into the corresponding power line section 18 on which the DSR 30 is mounted). The other modal configuration (e.g., a second modal configuration or second mode) for each DSR 30 is where it is configured to inject reactance into the corresponding power line 16 (e.g., an injection mode). The amount of reactance injected by a given DSR 30 when in its second modal configuration (or when in its second mode) is substantially greater than the amount of reactance, if any, that is injected by a given DSR 30 when in its first modal configuration (or when in its first mode).

The first data structure 480 includes a modal configuration for two different control objectives for each DSR 30 that is associated with the DSR array controller 440 (three representative DSRs 30 being shown for purposes of the first data structure 480 of FIG. 13D; each DSR 30 within the corresponding DSR array 410 would of course be included in the first data structure 480). The first data structure 480 presents both a power factor control modal configuration 484 (one control objective) and a low-frequency oscillation control modal configuration 486 (a different control objective) for each DSR 30 associated with the DSR array controller 440, and for each system condition or contingency 482. Any number of control objectives may be stored in the first data structure 480, including a single control objective or any appropriate number of multiple control objectives.

The system conditions or contingencies that are loaded into the first data structure 480 may represent at least some or all of the permutations for a power transmission system in relation to each power source utilized by the power transmission system (whether on line or off line), the load level presently imposed on the system, the operating status of the transmission lines forming the interconnected grid, the operating status of the transformers and substation equipment supporting the operation of the transmission lines forming the interconnected grid, or any combination of the above that combine to create a normal, abnormal or emergency operating condition for the grid. The same system conditions or contingencies may be loaded into the memory 452 of one or more DSR array controller 440. In one embodiment, a set of DSR array controllers 440 will have the same system conditions or contingencies loaded into their corresponding memory 452. However, each DSR array controller 440 will have its own modal configuration for each of its DSRs 30, and for each control objective. It should be appreciated that the first data structure 480 for each DSR array controller 440 may be updated without having to dismount the DSR array controller 440 from its corresponding power line 16 (e.g., using the built-in communication capabilities of the DSR array controllers 440)

Figure 13E:
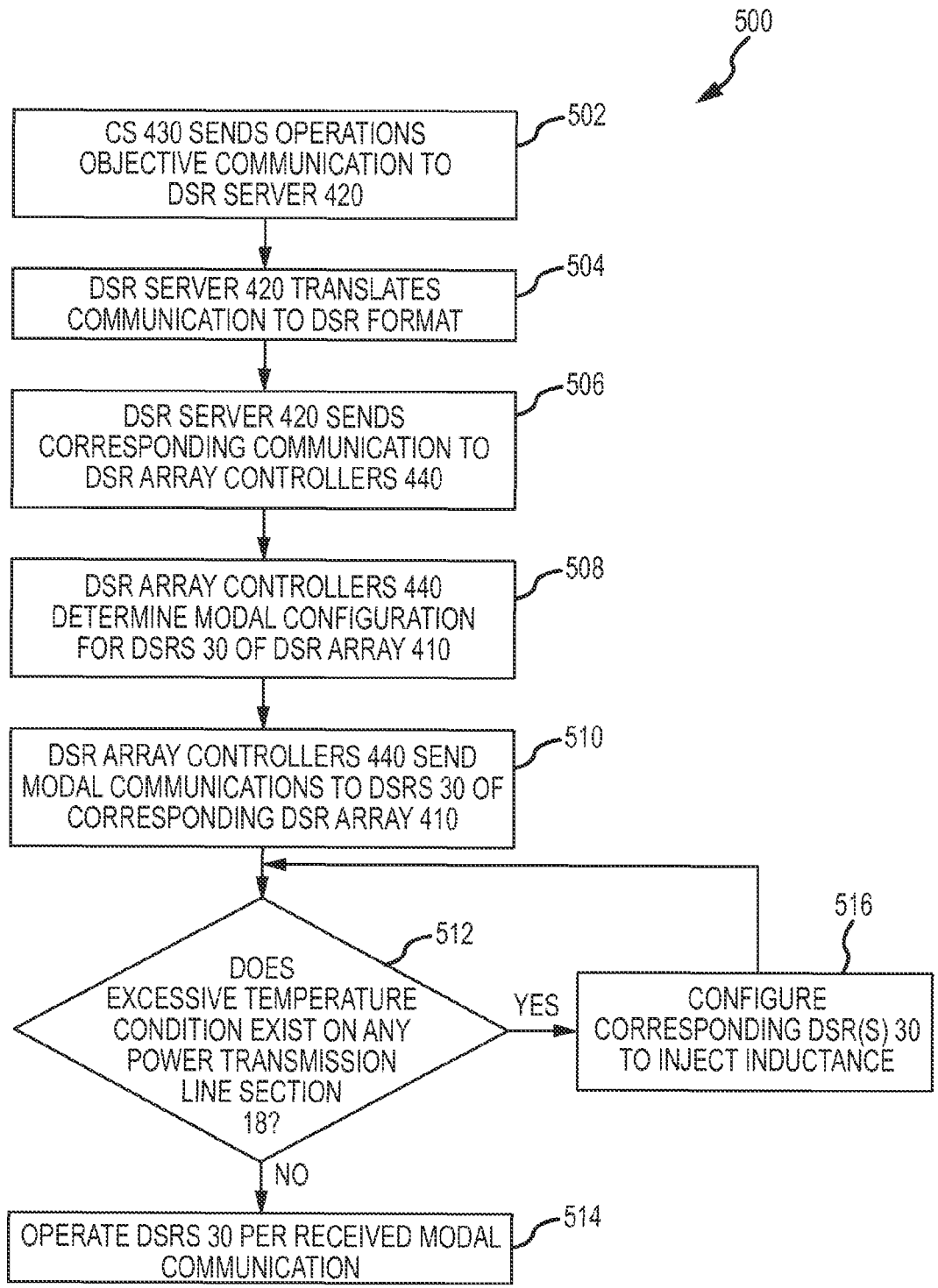
FIG. 13E is an embodiment of an operations protocol that may be used by the power transmission system of FIG. 13A to control operation of individual reactance modules.

One embodiment of an operations protocol for the power transmission system 400 of FIG. 13A is presented in FIG. 13E and is identified by reference numeral 500. The utility-side control system 430 sends an operations objective communication to the DSR server 420 (step 502). This operations objective communication may be of any appropriate type. The DSR server 420 may translate this communication from the utility-side control system 430 into an appropriate DSR format (step 504). In any case, the DSR server 420 sends a corresponding communication to the relevant DSR array controllers 440 (step 506). Each of the DSR array controllers 440 will independently determine the modal configuration for the DSRs 30 in its corresponding DSR array 410 based upon receipt of this communication (step 508). The communication associated with step 506 does not itself indicate the modal configurations that are determined by step 508. Thereafter, the DSR array controllers 440 may send a modal communication to one or more of the DSRs 30 in its corresponding DSR array 410 (step 510), and the DSRs 30 may be operated in accordance with any modal communication that has been received (step 514). It should be appreciated that the protocol 500 could be configured such that a modal communication is sent by a given DSR array controller 440 to each of its corresponding DSRs 30 (step 510), or a given DSR array controller 440 could be configured to send a modal communication (step 510) only to those associated DSRs 30 that have been determined to be in need of a modal change in accordance with step 508.

The operations protocol 500 of FIG. 13E may include what may be characterized as an optional "temperature override" feature. In this regard, step 512 of the protocol 500 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 500 may be configured to execute step 516. Step 516 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature. It should be appreciated that steps 512 and 516 on the noted temperature override feature may be implemented at any appropriate location within the protocol 500. Moreover, it should be appreciated that the temperature override logic could be incorporated by the DSR array controllers 440 (which would then send an appropriate communication to the DSRs 30 of their corresponding DSR array 410, such that step 516 would be executed by the individual DSRs 30 upon receiving such a communication from their corresponding DSR array controller(s) 440), that the temperature override logic could be incorporated by the individual DSRs 30 of each DSR array 410 (e.g., such that each individual DSR 30 could independently determine when step 516 should be executed), or both.

Figure 13F:
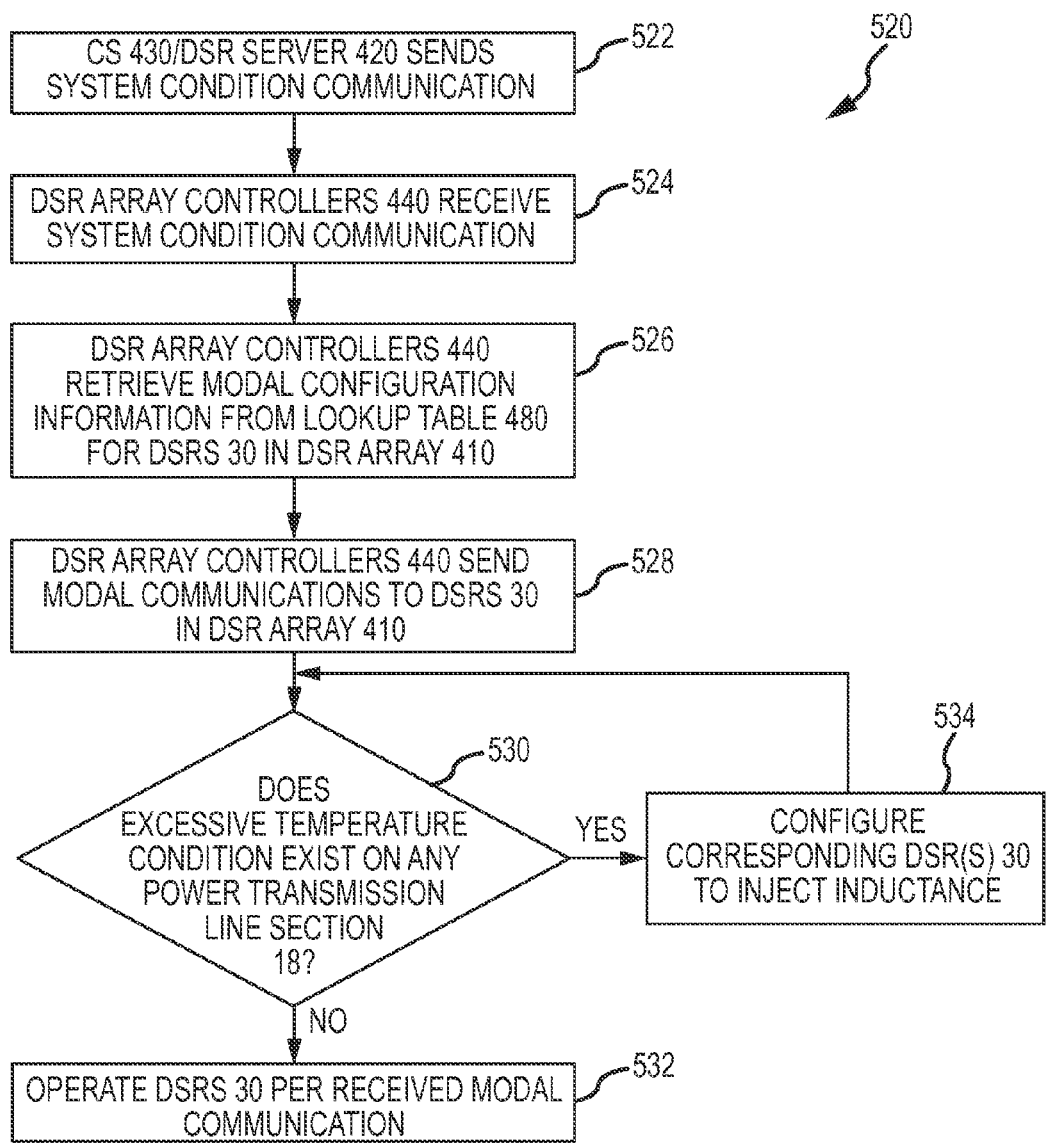
FIG. 13F is an embodiment of a system condition/contingency-based protocol that may be used by the power transmission system of FIG. 13A to control operation of individual reactance modules.

One embodiment of an operations protocol for addressing system conditions or contingencies is illustrated in FIG. 13F and is identified by reference numeral 520. Step 522 of the protocol 520 is directed to sending or transmitting a system condition or system contingency communication to one or more DSR array controllers 440 of the power transmission system 400. This system condition/contingency communication may come directly from the utility-side control system 430 or through the DSR server 420. In any case, one or more DSR array controllers 440 may receive the system condition/contingency communication (step 524). Each DSR array controller 440 will then retrieve the modal configuration information from the first data structure 480 for all DSRs 30 in its corresponding DSR array 410 (step 526). That is, each DSR array controller 440 will locate the system condition/contingency within its first data structure 480, and will then retrieve the associated modal configuration for each DSR 30 in its DSR array 410 for the associated control objective. Each DSR array controller 440 may then send a modal communication to each DSR 30 in its corresponding DSR array 410 (step 528) to specify whether a given DSR 30 should be in its first or bypass mode, or whether this DSR 30 should be in its second or injection mode. The controller 54 of a DSR 30 that receives such a modal communication from its corresponding DSR array controller 440 will then dispose the DSR 30 in the communicated mode pursuant to step 532 (either by switching the mode of the DSR 30, or maintaining the DSR 30 in its then current mode). It should be appreciated that the protocol 520 could be configured such that a modal communication is sent by a given DSR array controller 440 to each of its corresponding DSRs 30 (step 528), or a given DSR array controller 440 could be configured to send a modal communication (step 528) only to those associated DSRs 30 that have been determined to be in need of a modal change based upon step 526.

The operations protocol 520 of FIG. 13F may include what may be characterized as an optional "temperature override" feature. In this regard, step 530 of the protocol 520 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 520 may be configured to execute step 534. Step 534 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature (assuming of course that current flow can be diverted to one or more other power lines 16/power line sections 18). It should be appreciated that steps 530 and 534 on the noted temperature override feature may be implemented at any appropriate location within the protocol 520. Moreover, it should be appreciated that the temperature override logic could be incorporated by the DSR array controllers 440 (which would then send an appropriate communication to the DSRs 30 of their corresponding DSR array 410, such that step 534 would be executed by the individual DSRs 30 upon receiving such a communication from their corresponding DSR array controller(s) 440), that the temperature override logic could be incorporated by the individual DSRs 30 of each DSR array 410 (e.g., such that each individual DSR 30 could independently determine when step 534 should be executed), or both.

The operations protocol 520 of FIG. 13F assumes that the various DSR array controllers 440 are able to receive system condition/contingency communications from the utility-side control system 430 and/or the DSR server 420. That may not always be the case, and is accommodated by the operations protocol that is set forth in FIG. 13G and that is identified by reference numeral 540. Step 542 of the protocol 540 is directed to assessing receipt of system condition/contingency communications. In the event a predetermined number of DSR array controllers 440 are not receiving system condition/contingency communications, the protocol 540 proceeds from step 544 to step 546. Step 546 of the protocol 540 is directed to the DSR array controllers 440 communicating with one another and sharing information regarding their corresponding power line section 18. From this information, the present state system condition/contingency is derived (step 548). A derived system condition/contingency communication is then sent to the various DSR array controllers 440 pursuant to step 550 of the protocol 540. Each DSR array controller 440 will then retrieve the modal configuration information from the first data structure 480 for all DSRs 30 in its corresponding DSR array 410 (step 552). That is, each DSR array controller 440 will locate the system condition/contingency within its first data structure 480 that corresponds to the derived system condition/contingency communication, and will then retrieve the associated modal configuration for each DSR 30 in its DSR array 410 (and for the associated control objective). Each DSR array controller 440 may then send a modal communication to each DSR 30 in its corresponding DSR array 410 (step 556) to specify whether a given DSR 30 should be in its first or bypass mode, or whether this DSR 30 should be in its second or injection mode. The controller 54 of a DSR 30 that receives such a modal communication from its corresponding DSR array controller 440 will then dispose the DSR 30 in the communicated mode pursuant to step 560 (either by switching the mode of the DSR 30, or maintaining the DSR 30 in its then current mode). It should be appreciated that the protocol 540 could be configured such that a modal communication is sent by a given DSR array controller 440 to each of its corresponding DSRs 30 (step 556), or a given DSR array controller 440 could be configured to send a modal communication (step 556) only to those associated DSRs 30 that have been determined to be in need of a modal change based upon step 552.

Figure 13G:
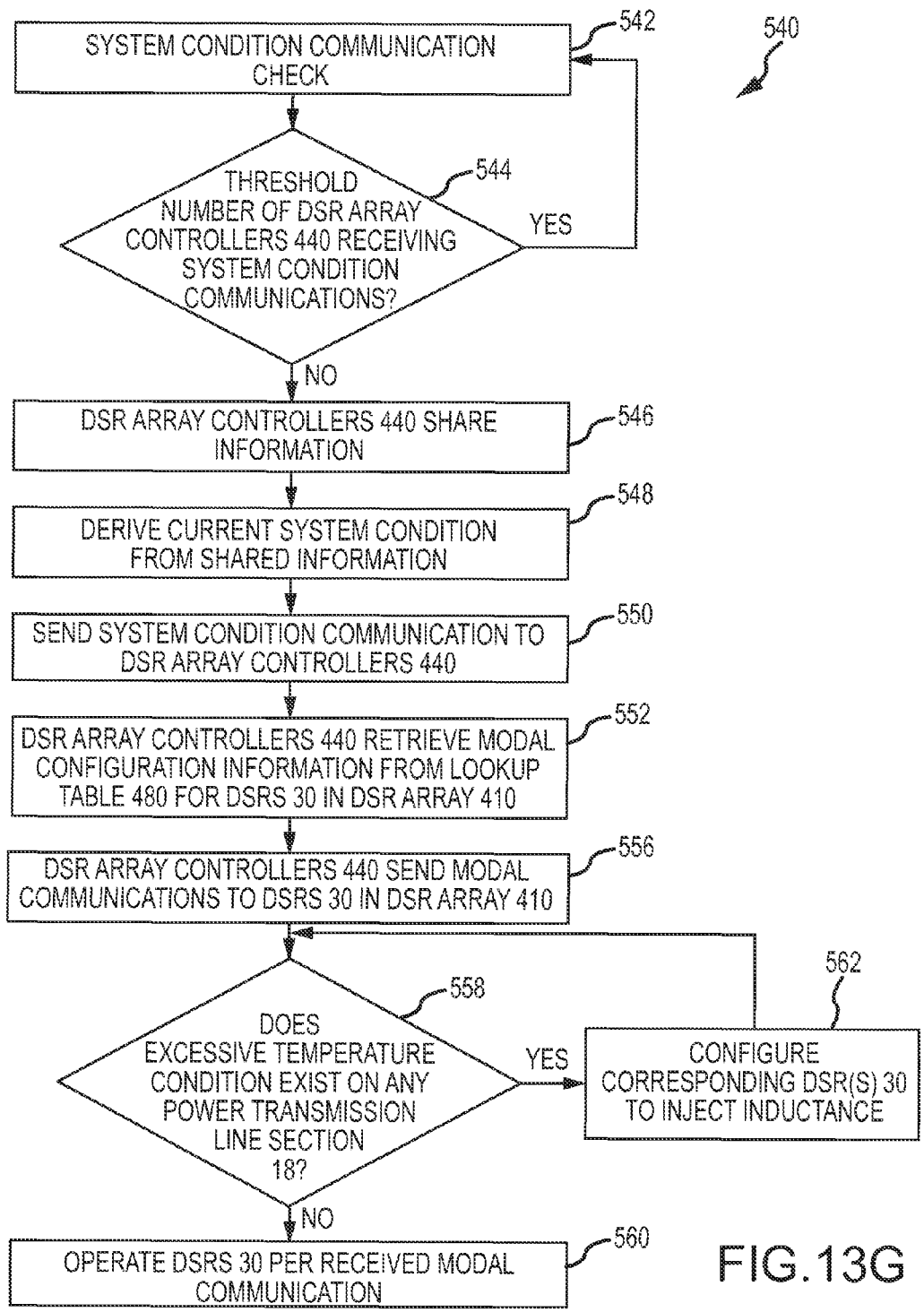
FIG. 13G is another embodiment of a system condition/contingency-based protocol that may be used by the power transmission system of FIG. 13A to control operation of individual reactance modules.

The operations protocol 540 of FIG. 13G may include what may be characterized as an optional "temperature override" feature. In this regard, step 558 of the protocol 540 is directed to determining if an excessive temperature condition exists on any given power line section 18 (e.g., determining whether an operating temperature meets or exceeds a predetermined temperature threshold, and which may be undertaken in any appropriate manner). Each power line section 18 may be monitored for the existence of an excessive temperature condition. This monitoring may be undertaken by the DSR array controller(s) 440 and/or the DSRs 30 for such a power line section 18. In any case and in the event that such an excessive temperature condition has been determined to exist, the protocol 540 may be configured to execute step 562. Step 562 is directed to configuring one or more of the DSRs 30 on the subject power line section 18 (with an excessive temperature condition) to inject inductance into this power line section 18. Injecting inductance into a given power line section 18 that is experiencing an excessive temperature condition should reduce the current flow through such a power line section 18, which in turn should reduce its operating temperature. It should be appreciated that steps 558 and 562 on the noted temperature override feature may be implemented at any appropriate location within the protocol 540. Moreover, it should be appreciated that the temperature override logic could be incorporated by the DSR array controllers 440 (which would then send an appropriate communication to the DSRs 30 of their corresponding DSR array 410, such that step 562 would be executed by the individual DSRs 30 upon receiving such a communication from their corresponding DSR array controller(s) 440), that the temperature override logic could be incorporated by the individual DSRs 30 of each DSR array 410 (e.g., such that each individual DSR 30 could independently determine when step 562 should be executed), or both.

Each DSR array controller 440 may incorporate any one of the protocols 500, 520, and 540, or may incorporate any two or more of these protocols. For instance, each DSR array controller 440 could incorporate both the protocol 500 of FIG. 13E and the protocol 520 of FIG. 13F. Each DSR array controller 440 could then determine the modal configuration for each DSR 30 in its corresponding DSR array 410 based upon the type of communication that is received. Another option would be for each DSR array controller 440 to incorporate both the protocol 520 of FIG. 13F and the protocol 540 of FIG. 13G. Each DSR array controller 440 could be configured to operate simultaneously in accordance with the protocol 520 of FIG. 13F and the protocol 540 of FIG. 13G. That is, the protocol 520 would be used to control a given DSR array control 440 until step 546 of the protocol 540 of FIG. 13G was reached, in which case the protocol 540 would then be used to control a given DSR array controller 440.

Figure 14:
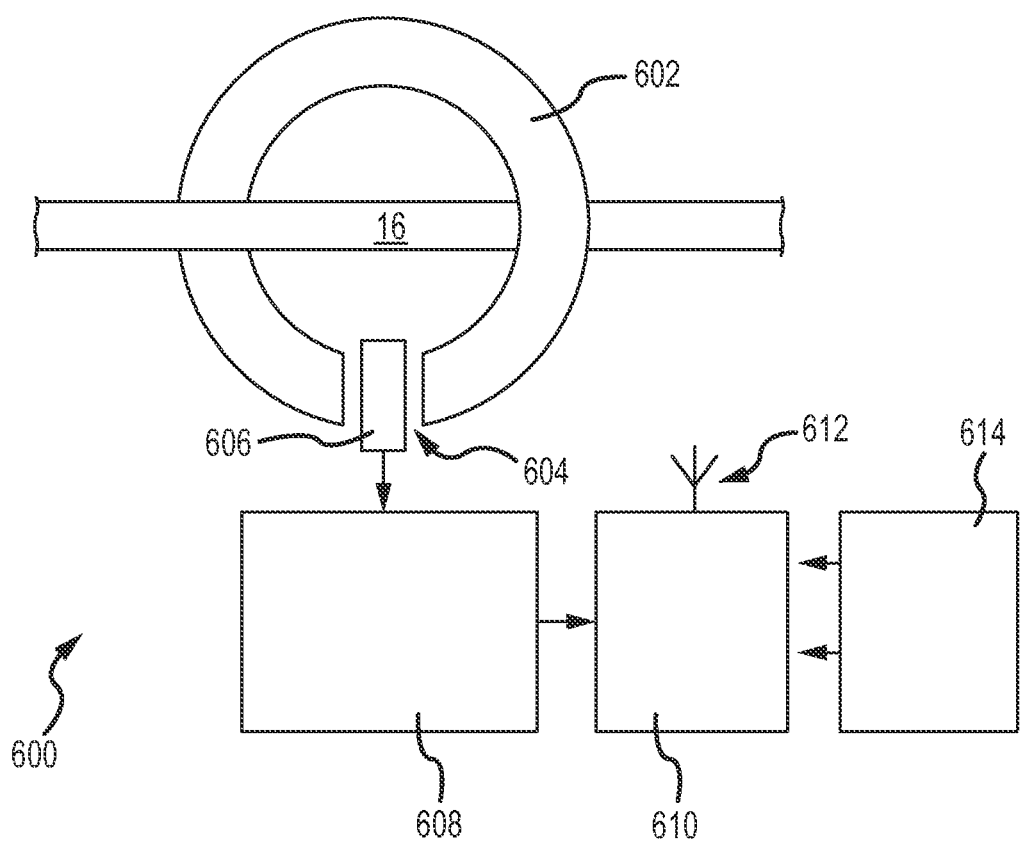
FIG. 14 is a block diagram of one embodiment of a GIC monitoring system.

A simplified version of a geomagnetically-induced current or GIC monitoring system is illustrated in FIG. 14 and is identified by reference numeral 600. The GIC monitoring system 600 is a line-mounted device—it is installed on a power line 16. Generally, the GIC monitoring system 600 is configured to monitor and/or identify the existence of a geomagnetically-induced current (which herein may be referred to as a "GIC") on a power line 16, and furthermore is able to communicate information regarding a GIC on its corresponding power line 16 to one or more other devices. As will be discussed in more detail below, the GIC monitoring system 600 may be installed on a power line 16 as a standalone unit. Another option would be to incorporate the GIC monitoring system 600 with another line-mounted device, such as the above-described DSR 30.

The GIC monitoring system 600 includes a magnetic core 602 that at least partially surrounds a power line 16 (e.g., the magnetic core 602 may extend less than a full 360° about the power line 16). The magnetic core 602 may be composed of any suitable high permeability material. Although the magnetic core 602 (e.g., collectively defined by core components 620, 622, and 624, discussed below) is illustrated as having a round or circular outer perimeter, other shapes may be appropriate. The magnetic core 602 may have an air gap 604 defined therein, and this air gap 604 may be incorporated such that the magnetic core 602 does not completely surround the power line 16 (i.e., the magnetic core 602 may be configured to not provide a closed perimeter about the power line 16). A magnetic sensor 606 (e.g., a Hall effect sensor) may be positioned in this air gap 604. The magnetic core 602 may be used to concentrate the magnetic flux, in the region surrounding the power line 16, within the magnetic core 602 and within the air gap 604 defined therein. This may greatly increase the sensitivity (or gain) of the magnetic sensor 606 as compared to a system without a magnetic core. It may also greatly increase the selectivity of the magnetic sensor 606, in that magnetic fields from surrounding devices may be more easily ignored. By design, the magnitude of the magnetic field in the air gap 604 is proportional to the magnitude of the current in the power line 16.

The magnetic sensor 606 may provide an output signal that may be supplied to a signal processing unit 608 (described further below) of the GIC monitoring system 600. The signal processing unit 608 may provide one or more signals representative of the GIC (at a minimum) to a communications interface 610, which may communicate with an antenna 612 (the communications interface 610 and antenna 612 each may be part of the GIC monitoring system 600). A power supply 614 may be associated with the GIC monitoring system 600 in order to provide power to one or more of its components.

The GIC monitoring system 600 is designed to sense DC or quasi-DC currents in the power line 16 (as will be discussed below, the GIC monitoring system 600 can also be configured to measure AC current in the power line 16 as well, for instance for "on-line calibration" purposes). These currents may be sensed with the sensor 606 and determined by the signal processing unit 608. The communications interface 610 and antenna 612 may be used to provide GIC information to one or more external devices (e.g., to send a GIC communication), for instance using the communication architecture described above in conjunction with the DSR 30, DSR array controller 440, and other components in the described network.

Figure 15A:
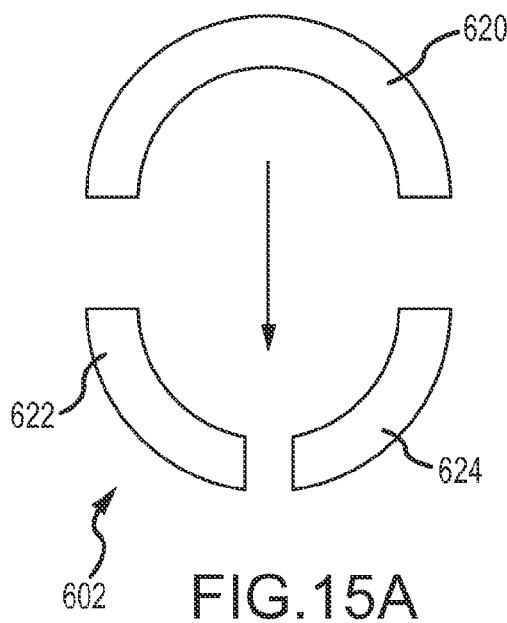
FIGS. 15A and 15B are an exploded view and a non-exploded view of components of a magnetic core for the GIC monitoring system of FIG. 14.
Figure 15B:
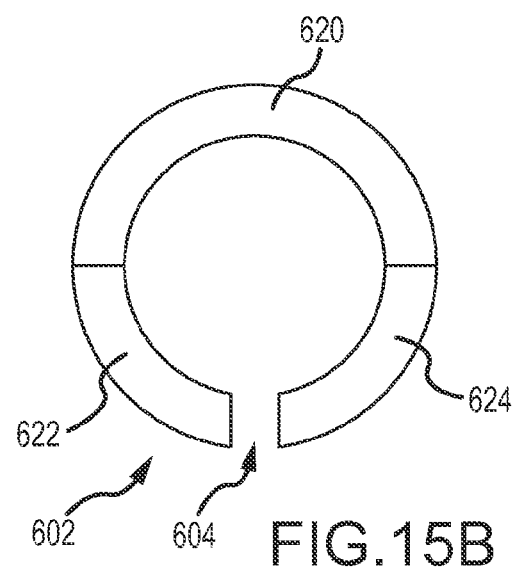

The magnetic core 602 may be designed in any fashion so as to provide an air gap into which a magnetic sensor can be placed. In one embodiment and as shown in FIGS. 15A and 15B, the magnetic core 602 is shown to have three separate core components: an upper core component 620 and two lower core components 622, 624. In this case, the upper core component 620 is shown to be generally semi-circular in configuration so as to surround approximately 180° or one-half of the power line 16. The two lower core components 622 and 624 in this case are configured as generally a quarter of a circle in angular extent so as to surround approximately 90° or one quarter of the power line 16. More specifically, these two lower core components 622 and 624 each surround just less than 90° of the angular extent. By being just less than 90°, together they provide for the air gap 604 for the sensor 606. Optionally, one of the lower core components could be 90° or more in extent and the other lower core component could be an appropriate amount so that together the two components add up to an extent just less than 180°, so as to create an air gap therebetween for the sensor 606. As another option, the air gap for the sensor 606 could be provided between the upper and lower components of the magnetic core 602, and in such case there may only be one lower core component. As another option, there could be a single core component for the magnetic core 602 that is just less than 360° in angular extent. Having a multi-section or multi-piece magnetic core 602 (e.g., two or more components that may be separately moved relative to one another) may facilitate installation of the GIC monitoring system 600 on the power line 16 (e.g., so as to not require a break in the power line 16 in order to install the magnetic core 602, although it may be possible to install a GIC monitoring system 600, having a one-piece magnetic core 602 and with an appropriate air gap 604, on the power line 16 without requiring a break in the power line 16).

Figure 16:
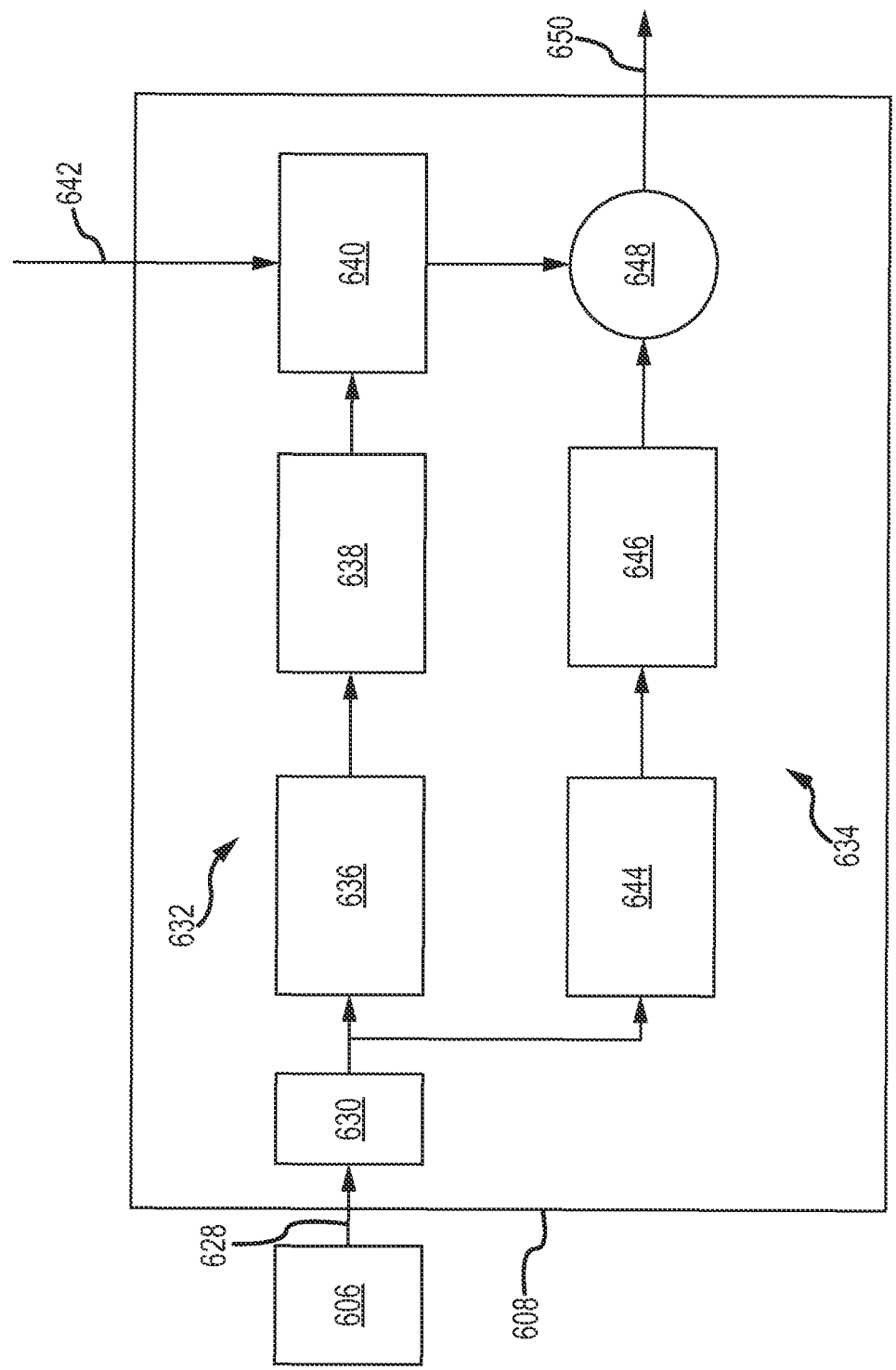
FIG. 16 is a block diagram of an embodiment of a signal processing unit for the GIC monitoring system of FIG. 14.

Further detail on the signal processing unit 608 used by the GIC monitoring system 600 is provided in FIG. 16. The output signal from the magnetic sensor 606 may be a differential output signal provided on a twisted pair 628 of wires that are provided as an input to the signal processing unit 608. This twisted pair 628 may be connected to a differential input of an A-to-D (A/D) converter 630. A device (not shown) for conditioning the signal (e.g., a "signal conditioner"), could be disposed between the magnetic sensor 606 and the A/D converter 630, for instance to improve the signal-to-noise ratio and which could be part of the signal processing unit 608. In any case and after the differential analog signal is converted to a digital signal, it is provided to each of an AC processing portion 632 and a DC processing portion 634 of the signal processing unit 608.

The AC processing portion 632 may include a high pass filter 636 to reduce the amount of DC (or lower frequency) signals. After filtering, the digital signal is provided to an RMS detector 638 which may determine a magnitude of the AC signal. The AC current magnitude signal is then provided to a ratio determining unit 640. A reference signal 642 is also provided to the ratio determining unit 640. The reference signal 642 may be an AC current magnitude that has been separately determined by an external unit. For example, the AC current magnitude could be provided from a current monitor 212 of the DSR 30 (described above). In any case, the ratio determining unit 640 may provide an output signal based on the ratio of the reference signal 642 to the AC current magnitude signal from the RMS detector 638. For example, if the reference signal 642 has a magnitude corresponding to 120 Amps and the AC current magnitude signal from the RMS detector 638 has a magnitude corresponding to 100 Amps, then the output signal from the ratio determining unit 640 would have a magnitude corresponding to a ratio of 1.2. As will be seen below, such a ratio can be used to increase the determined magnitude of the GIC by 20%.

The DC processing portion 634 of the signal processing unit 608 may include a low pass filter 644 to filter out higher frequency signals such as AC currents in the 50 to 60 Hz range and higher-frequency harmonics thereof. After filtering, the signal is provided to a mean detector 646 that determines the average or mean value of the DC (or quasi-DC) current. This mean value of the DC current is then provided to a multiplier 648 which also receives the ratio signal from the ratio determining unit 640. The two signals are multiplied together to provide the GIC signal 650. Continuing with the example from the previous paragraph, where the ratio determined was 1.2, if the mean value of the DC current determined by the mean detector 646 was 5 Amps, the GIC signal 650 would be 6 Amps. In this manner, the magnitude of the DC current determined by the GIC monitoring system 600 is adjusted by the ratio of the reference signal 642 to the determined AC current magnitude. In other words, the reference signal 642 is used as a "truth" or calibration for the proper current magnitude. It should be appreciated that calibration of the determined DC current magnitude (while the GIC monitoring system 600 is installed on a power line 16—an "on-line calibration") may not be required in all instances (e.g., factory calibration of the GIC monitoring system 600 may be sufficient in at least some instances). In this case, the signal processing unit 608 of the GIC monitoring system 600 may eliminate the AC processing portion 632 (i.e., the GIC monitoring system 600 may then eliminate the ratio determining unit 640 and the multiplier 648 discussed above).

The communications interface 610 for the GIC monitoring system 600 may be a conventional communication interface capable of transmitting information to one or more remote devices. This interface 610 could include a transmitter, a transmitter and receiver, or a transceiver. The interface 610 may work together with an antenna 612 of an appropriate type. Further detail on an exemplary communications interface and antenna are provided above in conjunction with the discussion of the DSR 30.

The power supply 614 for the GIC monitoring system 600 may be a conventional power supply capable of providing appropriate types of power to the remaining portions of the system 600. The power supply 614 may harvest power from the power line 16 in a conventional manner. An exemplary power supply is discussed above in conjunction with the DSR 30.

As noted, the GIC monitoring system 600 could be incorporated into another line-mounted device. A variation of the above-discussed DSR 30 is presented in FIG. 17 in the form of a DSR 30". Corresponding components of these two embodiments are identified by the same reference numerals. Those corresponding components that differ are further identified by a "double prime" designation in FIG. 17. Unless otherwise noted, the DSR 30" includes the same features as the DSR 30.

One difference between the DSR 30 and the DSR 30" is that there is a current sensor 660 including an upper portion in the upper core assembly 50" and a lower portion in the lower core assembly 50". There is also a circuit card 662 that may contain all or portions of one or more of the signal processing unit 608, the communications interface 610 and antenna 612, and the power supply 614. As can be appreciated, when the DSR 30" is assembled, the upper and lower components of the current sensor 660 surround the power line 16 and leave an air gap 604 in which the magnetic sensor 606 is positioned (see FIG. 14). As the DSR 30" may include the above-noted current monitor 212, the GIC monitoring system 600 could be configured to incorporate the noted optional AC processing portion 632 to provide for an on-line calibration functionality as discussed above.

Figure 18:
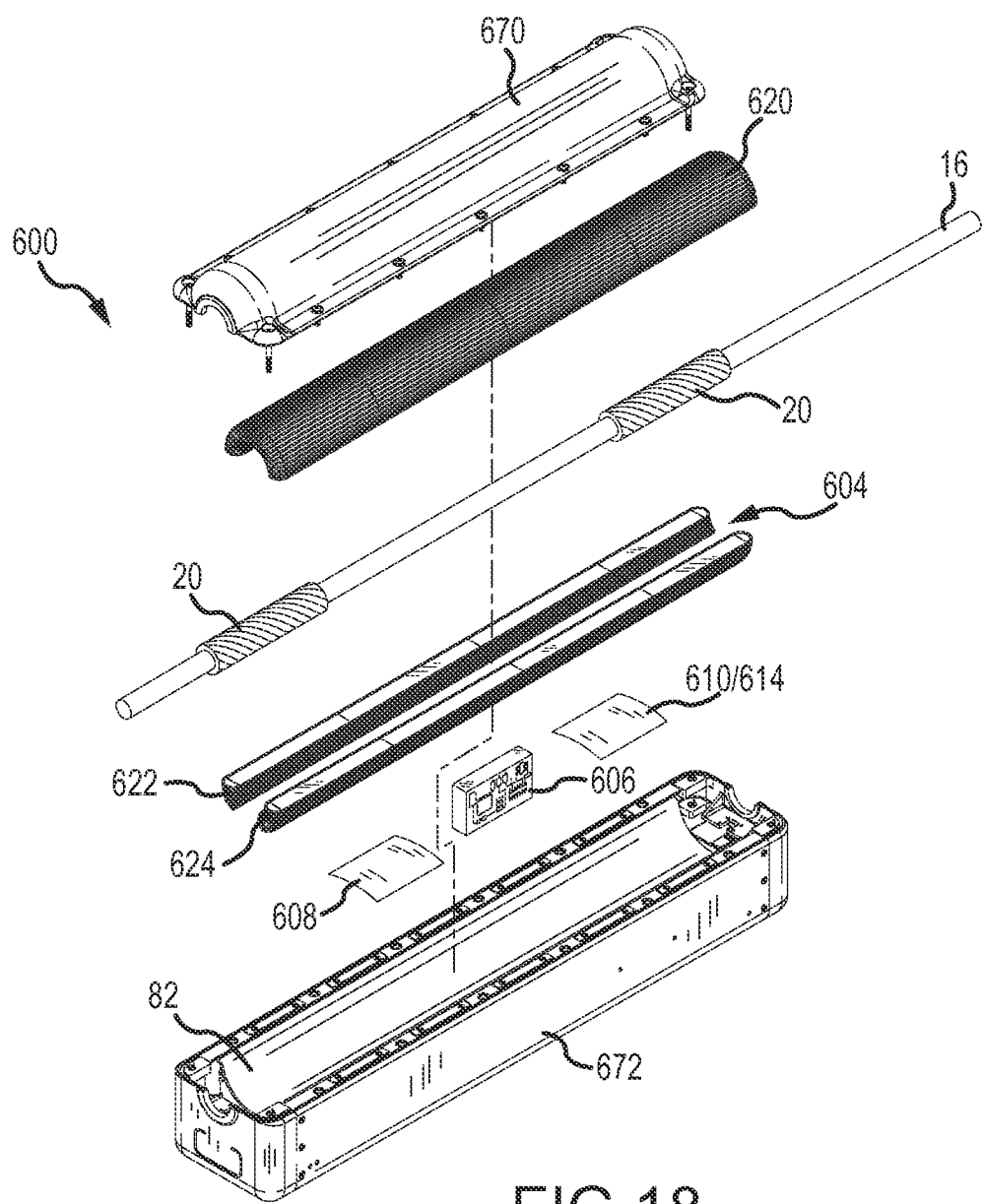
FIG. 18 is an exploded view illustrating how the GIC monitoring system of FIG. 14 could be implemented in a standalone device.

A standalone version of the GIC monitoring system 600 is shown in FIG. 18. A power line 16 is shown with a pair of line guards 20 located thereon. In this exploded view, upper and lower housing portions 670, 672 are provided. Also included are an upper core segment 620, a lower core segment 622, and a lower core segment 624, the latter two of which provide for an air gap 604 therebetween. The magnetic sensor 606 is also provided for positioning within the air gap 604. A pair of circuit cards is shown containing the signal processing unit 608 and the communications interface 610 and power supply 614. Although illustrated as provided on two circuit cards, these electronics could all be placed on one circuit card or on more than two circuit cards. It can be appreciated that when the GIC monitoring system 600 is assembled and the upper and lower housing portions 670, 672 are connected together, the core components 620, 622, 624 are held in a position surrounding the power line 16, with the exception of an air gap 604 into which the magnetic sensor 604 is positioned. As the GIC monitoring system 600 shown in FIG. 18 does not include a separate current monitor, the GIC monitoring system 600 may be configured without the above-noted AC processing portion 632. However, a stand-alone GIC monitoring system 600 could include a separate current monitor to accommodate on-line calibration in accordance with the foregoing.

Figure 17:
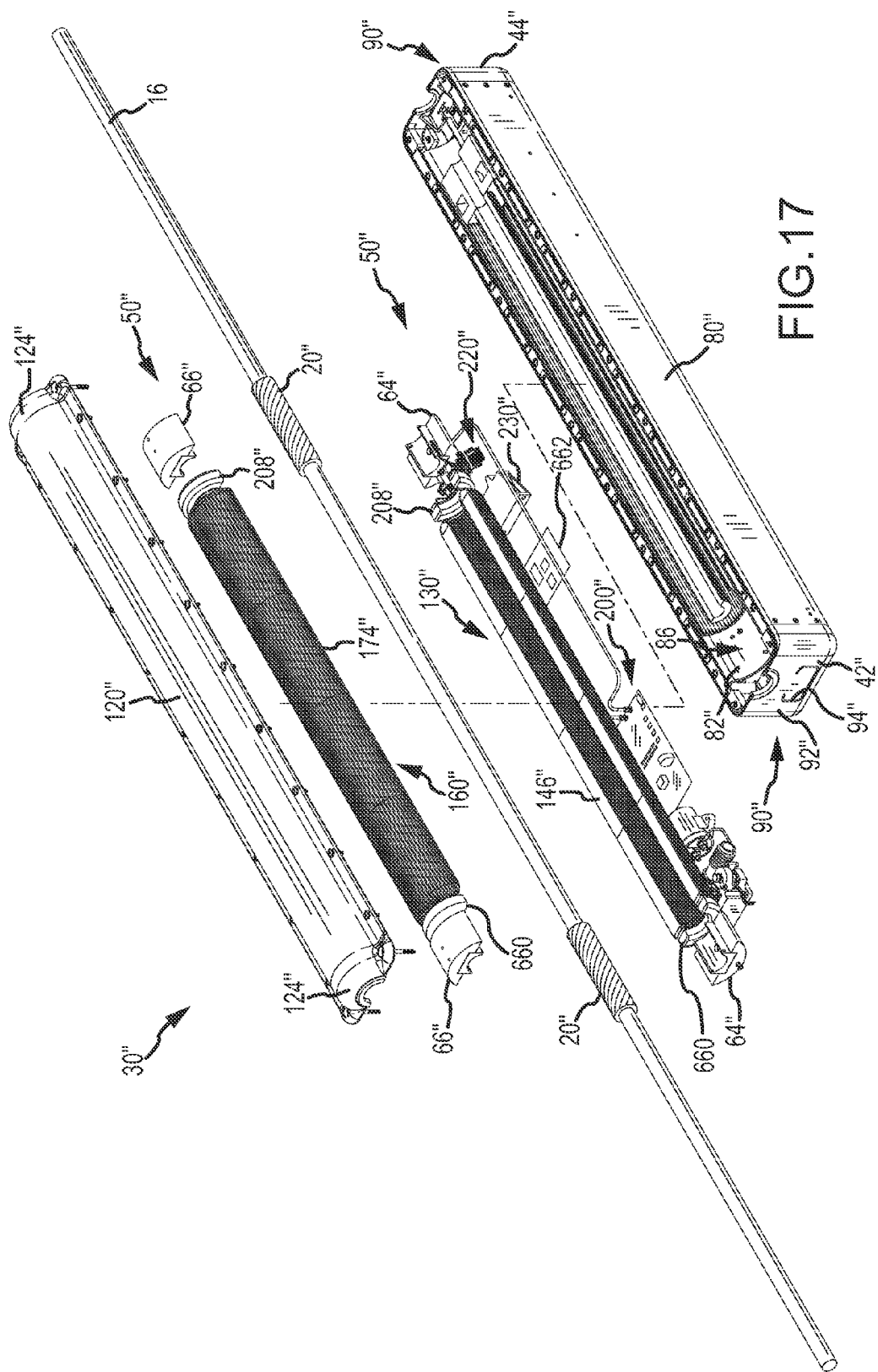
FIG. 17 is an exploded view illustrating how the GIC monitoring system of FIG. 14 could be incorporated into the DSR of FIG. 2A.

As can be seen, the GIC monitoring system 600 can be part of a unit with other components, such as part of a DSR 30" (as shown in FIG. 17) or it can be part of a standalone unit (as shown in FIG. 18). While the GIC monitoring system 600 described herein is only directed to monitoring and measuring GICs, it would be possible to attempt to control GICs in a similar manner that AC line currents are controlled by injecting impedance as described in conjunction with the DSR 30. As another alternative, the system 600 could be implemented without a magnetic core 602, or with a completely different type of magnetic core. Some or all of the functionality of the signal processing unit 608 and communications interface 610 could be implemented in a microprocessor, or any other suitable form of electronics. It may be possible to provide inputs to the signal processing unit 608 so that the characteristics of the high pass filter 636 and low pass filter 644 can be varied. This may include effectively eliminating the effects of filter 636 and 644.

One of the advantages of the GIC monitoring system 600 is that the system can be directly and easily mounted onto a power line 16 without a break in the power line. Further, the system 600 can be powered from the power line 16. It may be desirable to have an entire array of GIC monitoring systems 600 that are located throughout the power transmission grid. With more systems, it may be possible to get more accurate measurements, and to measure GICs on power lines that are at different orientations with respect to the Earth (e.g., with respect to latitude and longitude lines).

Figure 19:
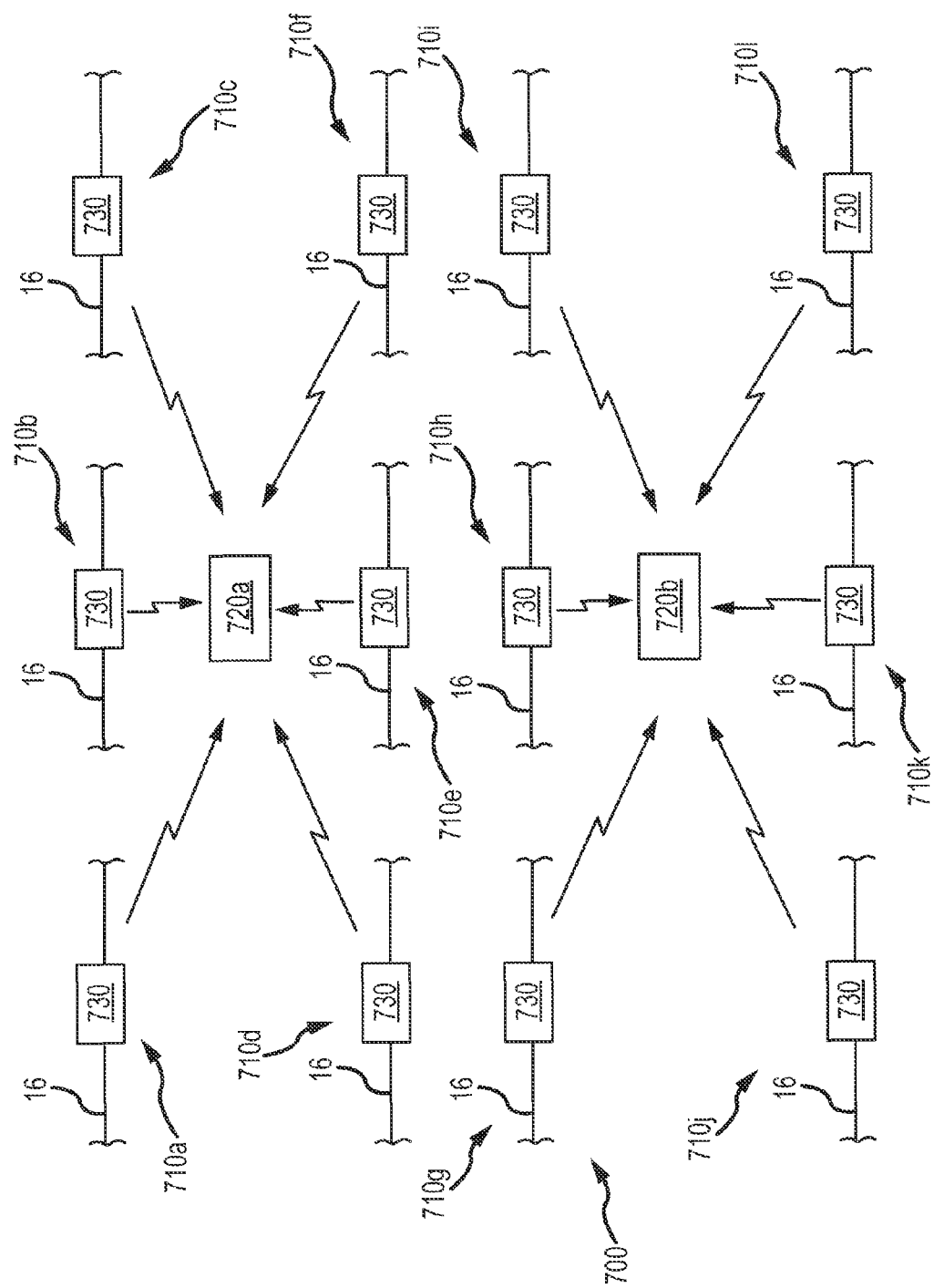
FIG. 19 is a schematic of a power transmission system that includes a plurality of GIC sensors.

A schematic of one embodiment of a power transmission system is presented in FIG. 19 and is identified by reference numeral 700. The power transmission system 700 may be in the form of an electrical grid for a region or territory (e.g., the electrical grid for the United States or any portion thereof). One characterization of the power transmission system 700 is that it includes a plurality of zones (zone 710a-710l in the illustrated embodiment; more generally a "zone 710" in accordance with the GIC monitoring protocol 750 that will be discussed below in relation to FIG. 20). The power transmission system 700 may be separated into any appropriate number of zones 710.

A "zone 710" for purposes of the power transmission system 700 may be characterized as encompassing a predetermined geographic area or region of the power transmission system 700. Each zone 710 encompasses a different geographic region, although a given zone 710 could partially overlap (geographically) with one or more other zones 710. In any case, each zone 710 of the power transmission system 700 includes at least one power line 16, and more typically a plurality of power lines 16 (e.g., part of a network or grid of power lines 16). The power lines 16 for purposes of the power transmission system 700 may be of any appropriate type, for instance in the form of a power transmission line (e.g., higher capacity) or in the form of a distribution line (e.g., lower capacity). A group of power lines 16 of the power transmission system 700 may each extend from one common location to another common location, as well as along the same general path. This may be referred to as a "power transmission section" in accordance with the foregoing. In a three-phase power transmission system, each such "power transmission section" may have three different power lines 16 that are at three different phases (and may optionally have a neutral line).

One or more zones 710 of the power transmission system 700 include at least one GIC device 730. Each GIC device 730 may be in the form of the above-described GIC monitoring system 600. One or more GIC devices 730 could be installed on one or more power lines 16 within each zone 710, thereby encompassing a configuration for the power transmission system 700 where at least one GIC device 730 is installed on each power line 16 within each of its zones 710. Each GIC device 730 communicates (directly or indirectly) with a utility-side control system 720 (FIG. 20) and over a communication link of any appropriate type. At least one-way communication is available between each GIC device 730 and the utility-side control system 720 (from a given GIC device 730 to the utility-side control system 720), although the power transmission system 700 could be configured to allow for two-way communication between each GIC device 730 and the utility-side control system 720.

The utility-side control system 720 for purposes of the power transmission system 700 may be at least generally in accordance with the above-described utility-side control system 430 of FIG. 13A (e.g., an energy management system (EMS); a supervisory control and data acquisition system (SCADA system); a market management system (MMS)). In the embodiment of FIG. 19, the utility-side control system 720 is illustrated as including a first utility-side control unit 720a and a second utility-side control unit 720b. However, the control architecture of the utility-side control system 720 may be distributed in any appropriate fashion, including where utility-side control units of the utility-side control system 720 are able to communicate with at least one other utility-side control unit of the utility-side control system 720.

Figure 20:
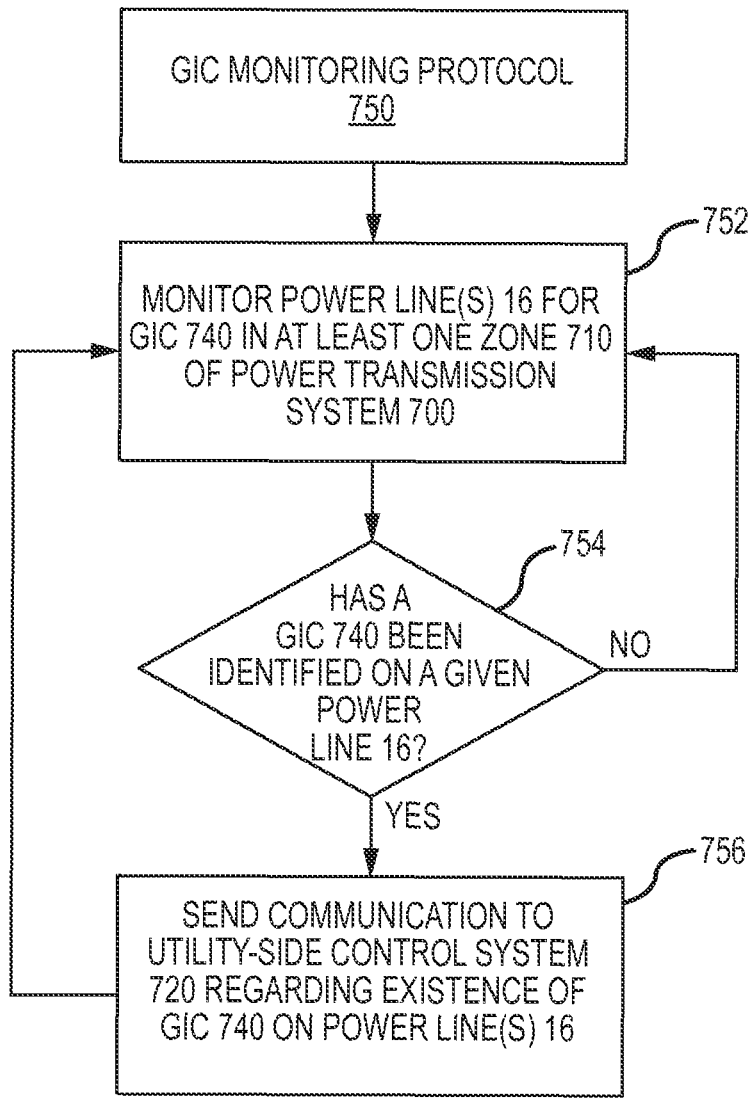
FIG. 20 is one embodiment of a GIC monitoring protocol that may be used by the power transmission system of FIG. 19.

One embodiment of a GIC monitoring protocol is presented in FIG. 20, is identified by reference numeral 750, and will be discussed in relation to the power transmission system 700 of FIG. 19. The GIC monitoring protocol 750 includes monitoring at least one power line 16, and in at least one zone 710 of the power transmission system 700, for the existence of a geomagnetically-induced current or a GIC 740 (step 752). Step 752 of the GIC monitoring protocol 750 may be executed in any appropriate manner, including through a GIC device 730 that is installed on a power line 16 of the power transmission system 700. As noted above in the discussion of the power transmission system 700, one or more GIC devices 730 may be installed on at least one power line 16 within one or more zones 710 of the power transmission system 700, including having multiple GIC devices 730 installed on each power line 16 within each zone 710 of the power transmission system 700 (e.g., including where multiple GIC devices 730 are spaced along a given power line 16 within a given zone 710).

The power line(s) 16 within one or more zones 710 of the power transmission system 700 may be monitored on at least some basis (e.g., continually) pursuant to step 752 of the GIC monitoring protocol 750. In the event that a GIC 740 is identified on a given power line 16 within a given zone 710 (step 754), a GIC communication may be sent (directly or indirectly) to the utility-side control system 720 regarding such a GIC 740 (step 756). A given GIC device 730 of the power transmission system 700 may be used to execute each of steps 754 and 756 of the GIC monitoring protocol 750. In any case, a communication pursuant to step 756 could embody information such as the magnitude of the identified GIC 740, a time at which the GIC 740 was identified (e.g., a time stamp), the power line 16 on which the GIC 740 exists, at least the general location of the GIC 740, and the like.

A communication pursuant to step 756 of the GIC monitoring protocol 750 may be utilized in any appropriate manner and for any appropriate purpose(s) by the utility-side control system 720 of the power transmission system 700. For instance, the utility-side control system 720 could use information on a GIC 740 identified by the GIC monitoring protocol 750 to initiate one or more actions. Consider the case where a GIC 740 is identified in a given zone 710 of the power transmission system 700 through the GIC monitoring protocol 750. A communication pursuant to step 756 of the protocol 750 could be used to predict when the identified GIC 740 may arrive at one or more other zones 710 of the power transmission system 700 (e.g., based upon the movement of the Sun relative to the Earth). Steps could be taken by or through the utility-side control system 720 to protect one or more electrical components that may be part of or otherwise linked to the power transmission system 700 within one or more zones 710 that may at some later point-in-time be exposed to the GIC 740 (or a similar current) that was identified pursuant to the GIC monitoring protocol 750.

Based upon the foregoing, it should be appreciated that the GIC monitoring protocol 750 of FIG. 20 could be implemented by the power transmission system 400 of FIG. 13A and discussed above. At least one DSR 30 in one or more DSR arrays 410 of the power transmission system 400 could include a GIC monitoring system 600 (thereby encompassing having multiple DSRs 30 in a given DSR array 410 each include a GIC monitoring system 600, having at least one DSR 30 in each DSR array 410 of the power transmission system 400 include a GIC monitoring system 600, or both). Each DSR 30 in one or more DSR arrays 410 of the power transmission system 400 could include a GIC monitoring system 600, including where each DSR 30 in each DSR array 410 of the power transmission system 400 includes a GIC monitoring system 600. In any case, communications pursuant to step 756 of the GIC monitoring protocol 750 of FIG. 20 could utilize the communication architecture discussed above in relation to the power transmission system 400 (e.g., having DSRs 30 within a given DSR array 410 communicate directly with their corresponding DSR array controller(s) 410, which in turn may communicate (directly or indirectly) with the utility-side control system 430; using DSRs 30 of a given DSR array 410 to relay a communication to their corresponding DSR array controller(s) 410, which in turn may communicate (directly or indirectly) with the utility-side control system 430).

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. For instance, unless otherwise noted herein to the contrary, other shapes or geometries may be appropriate for various components of the illustrated embodiments. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A device for monitoring geomagnetically-induced currents in a power transmission line, comprising:
   a magnetic core disposed about a power transmission line, the core being configured to provide an air gap therein, wherein with the exception of the air gap, the magnetic core completely surrounds the power transmission line;
   a magnetic sensor positioned in the air gap to sense magnetic fields and produce an output signal representative of the magnetic fields;
   a signal processing unit that receives the output signal and determines the magnitude of a geomagnetically-induced current in the power transmission line therefrom; and
   an injecting unit for injecting reactance into the power transmission line.

2. A device as claimed in claim 1, further including an upper housing and a lower housing that are configured for placement around the power transmission line and for attachment to each other to contain the core, sensor, and signal processing unit therein.

3. A device as claimed in claim 1, wherein the core includes at least two separate core portions.

4. A device as claimed in claim 1, wherein the core includes at least three separate core portions.

5. A device as claimed in claim 4, wherein one of the three separate core portions is configured to extend approximately 180 degrees around the power transmission line.

6. A device as claimed in claim 4, wherein two of the three separate core portions are each configured to extend only approximately 90 degrees around the power transmission line.

7. A device as claimed in claim 1, wherein the signal processing unit processes signals at or near DC with a DC processing portion.

8. A device as claimed in claim 7, wherein the DC processing portion includes a low pass filter.

9. A device as claimed in claim 7, wherein the DC processing portion includes a unit for determining the mean of the signals and providing a DC component signal representative thereof.

10. A device as claimed in claim 1, wherein the signal processing unit separately processes AC signals and signals at or near DC with an AC processing portion and a DC processing portion, respectively.

11. A device as claimed in claim 10, wherein the AC processing portion includes a unit for determining the RMS value of the signal and providing an AC component signal representative thereof.

12. A device as claimed in claim 10, wherein the AC processing portion includes a high pass filter.

13. A device as claimed in claim 12, wherein the AC processing portion includes a unit for determining the RMS value of the signal and providing an AC component signal representative thereof.

14. A device as claimed in claim 13,
wherein the AC processing portion includes a ratio-determining unit that determines the ratio of a reference signal to the AC component signal and produces a ratio signal representative thereof.

15. A device as claimed in claim 14, wherein the reference signal is determined externally by a different AC current monitor.

16. A device as claimed in claim 1, wherein the signal processing unit separately processes AC signals and signals at or near DC with an AC processing portion and a DC processing portion, respectively;
wherein the DC processing portion includes a unit for determining the mean of the signals and providing a DC component signal representative thereof;
wherein the AC processing portion includes a unit for determining the RMS value of the signal and providing an AC component signal representative thereof;
wherein the AC processing portion includes a ratio-determining unit that determines the ratio of a reference signal to the AC component signal and produces a ratio signal representative thereof; and
wherein the signal processing unit includes a multiplier unit that multiplies the DC component signal by the ratio signal.

17. A device as claimed in claim 1, wherein the signal processing unit determines a DC component and an AC component; and
wherein the AC component is compared to a reference signal representative of an external measurement of the AC current in the power transmission line and, based on the comparison, the DC component is adjusted in proportion thereto.

18. A device as defined in claim 1, wherein the device includes a transmitter and an antenna for communicating geomagnetically-induced current information to an external device.

19. A device as defined in claim 18, wherein the external device includes a receiver for receiving information related to geomagnetically-induced currents.

20. A device as defined in claim 1, wherein the device includes a current transformer for drawing current off of the power transmission line to provide operating power to the device.

21. A device as defined in claim 1, wherein the magnetic sensor includes a Hall effect sensor.

22. A device as defined in claim 21, wherein the output signal from the sensor is an analog signal and the device includes an analog-to-digital (A/D) converter.

23. A device as defined in claim 22, wherein the analog signal is provided from the sensor to the A/D converter via a twisted pair of wires.

24. A device as defined in claim 1, wherein the injecting unit includes a coil placed relative to the power transmission line in order to inject the reactance therein.

25. A device as claimed in claim 1, wherein the magnetic sensor is electrically connected only to the signal processing unit.

26. A device as claimed in claim 25, wherein the magnetic sensor is thus electrically isolated from ground.

27. A device for monitoring geomagnetically-induced currents in a power transmission line, comprising:
a magnetic core disposed about a power transmission line, the core being configured to provide an air gap therein, wherein with the exception of the air gap, the magnetic core completely surrounds the power transmission line;
a magnetic sensor positioned in the air gap to sense magnetic fields and produce an output signal representative of the magnetic fields; and
a signal processing unit that receives the output signal and determines the magnitude of a geomagnetically-induced current in the power transmission line therefrom;
wherein the magnetic sensor is electrically connected only to the signal processing unit and thus electrically isolated from ground.

28. A device as claimed in claim 27, further including an upper housing and a lower housing that are configured for placement around the power transmission line and for attachment to each other to contain the core, sensor, and signal processing unit therein.

29. A device as claimed in claim 27, wherein the core includes at least two separate core portions.

30. A device as claimed in claim 27, wherein the core includes at least three separate core portions.

31. A device as claimed in claim 30, wherein one of the three separate core portions is configured to extend approximately 180 degrees around the power transmission line.

32. A device as claimed in claim 30, wherein two of the three separate core portions are each configured to extend only approximately 90 degrees around the power transmission line.

33. A device as claimed in claim 27, wherein the signal processing unit determines a DC component and an AC component; and
wherein the AC component is compared to a reference signal representative of an external measurement of the AC current in the power transmission line and, based on the comparison, the DC component is adjusted in proportion thereto.

34. A device as defined in claim 27, wherein the device includes a current transformer for drawing current off of the power transmission line to provide operating power to the device.

* * * * *